US012764987B2

(12) United States Patent
Liaw

(10) Patent No.: US 12,764,987 B2

(45) Date of Patent: Oct. 13, 2026

(54) SEMICONDUCTOR STRUCTURE AND METHOD FOR MANUFACTURING THE SAME

(71) Applicant: Taiwan Semiconductor Manufacturing Company, Ltd., Hsinchu (TW)

(72) Inventor: Jhon-Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 441 days.

(21) Appl. No.: 18/493,938

(22) Filed: Oct. 25, 2023

(65) Prior Publication Data

US 2025/0142859 A1 May 1, 2025

(51) Int. Cl.

| | |
|---|---|
| ***H10B 10/00*** | (2023.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 64/01*** | (2025.01) |

(52) U.S. Cl.

CPC ........... *H10D 30/43* (2025.01); *H10D 30/014* (2025.01); *H10D 30/6735* (2025.01); *H10D 62/121* (2025.01); *H10D 62/151* (2025.01); *H10D 64/017* (2025.01); *H10D 64/018* (2025.01); *H10B 10/125* (2023.02); *H10B 10/18* (2023.02)

(58) Field of Classification Search

CPC ................ H10D 30/43; H10D 30/014; H10D 30/6735; H10D 62/121; H10D 62/151; H10D 64/017; H10D 64/018; H10D 62/822; H10D 30/6757; H10D 64/021; H10B 10/125; H10B 10/18

USPC .......................................................... 257/347

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

(Continued)

*Primary Examiner* — Sheikh Maruf

(74) *Attorney, Agent, or Firm* — Birch, Stewart, Kolasch & Birch, LLP

(57) ABSTRACT

A semiconductor structure includes a substrate, nanostructures, source/drain features, a gate structure, inner spacers, and dielectric layers. The nanostructures are over the substrate and spaced apart from each other in a Z-direction. The source/drain features are attached to the nanostructures in an X-direction. The gate structure wraps around the nanostructures and extends in a Y-direction. The inner spacers are between the nanostructures in the Z-direction. The dielectric layers are under the inner spacers. Bottom surfaces of the dielectric layers are lower than a bottommost surface of the gate structure.

20 Claims, 37 Drawing Sheets

(56) References Cited

U.S. PATENT DOCUMENTS

| | | | | |
|---|---|---|---|---|
| 2013/0210232 | A1* | 8/2013 | De | G03F 1/38 438/700 |
| 2014/0131776 | A1* | 5/2014 | Ching | H10D 62/832 257/E21.409 |
| 2014/0332859 | A1* | 11/2014 | Colinge | H10D 30/014 257/288 |
| 2015/0214318 | A1* | 7/2015 | Ching | H10D 30/6735 438/157 |
| 2016/0027871 | A1* | 1/2016 | Oxland | B82Y 10/00 257/347 |
| 2016/0181362 | A1* | 6/2016 | Yang | H10D 30/6735 257/329 |
| 2016/0240378 | A1* | 8/2016 | Huang | B82Y 10/00 |
| 2016/0240652 | A1* | 8/2016 | Ching | H10D 30/6713 |
| 2019/0027570 | A1* | 1/2019 | Ching | H10D 62/121 |
| 2019/0067441 | A1* | 2/2019 | Yang | B82Y 10/00 |
| 2019/0305106 | A1* | 10/2019 | Bi | H10D 30/6212 |
| 2020/0052086 | A1* | 2/2020 | Yang | H10D 64/017 |
| 2022/0336287 | A1* | 10/2022 | Yu | H10D 84/0158 |

* cited by examiner

SEMICONDUCTOR STRUCTURE AND METHOD FOR MANUFACTURING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

As integrated circuit (IC) technologies progress towards smaller technology nodes, gate-all-around (GAA) devices have been incorporated into memory devices (including, for example, static random-access memory, or SRAM, cells) and core devices (including, for example, standard logic, or STD, cells) to reduce chip footprint while maintaining reasonable processing margins.

However, as GAA devices continue to be scaled down, conventional methods for manufacturing GAA devices may experience challenges. Accordingly, although existing technologies for fabricating GAA devices have been generally adequate for their intended purposes, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
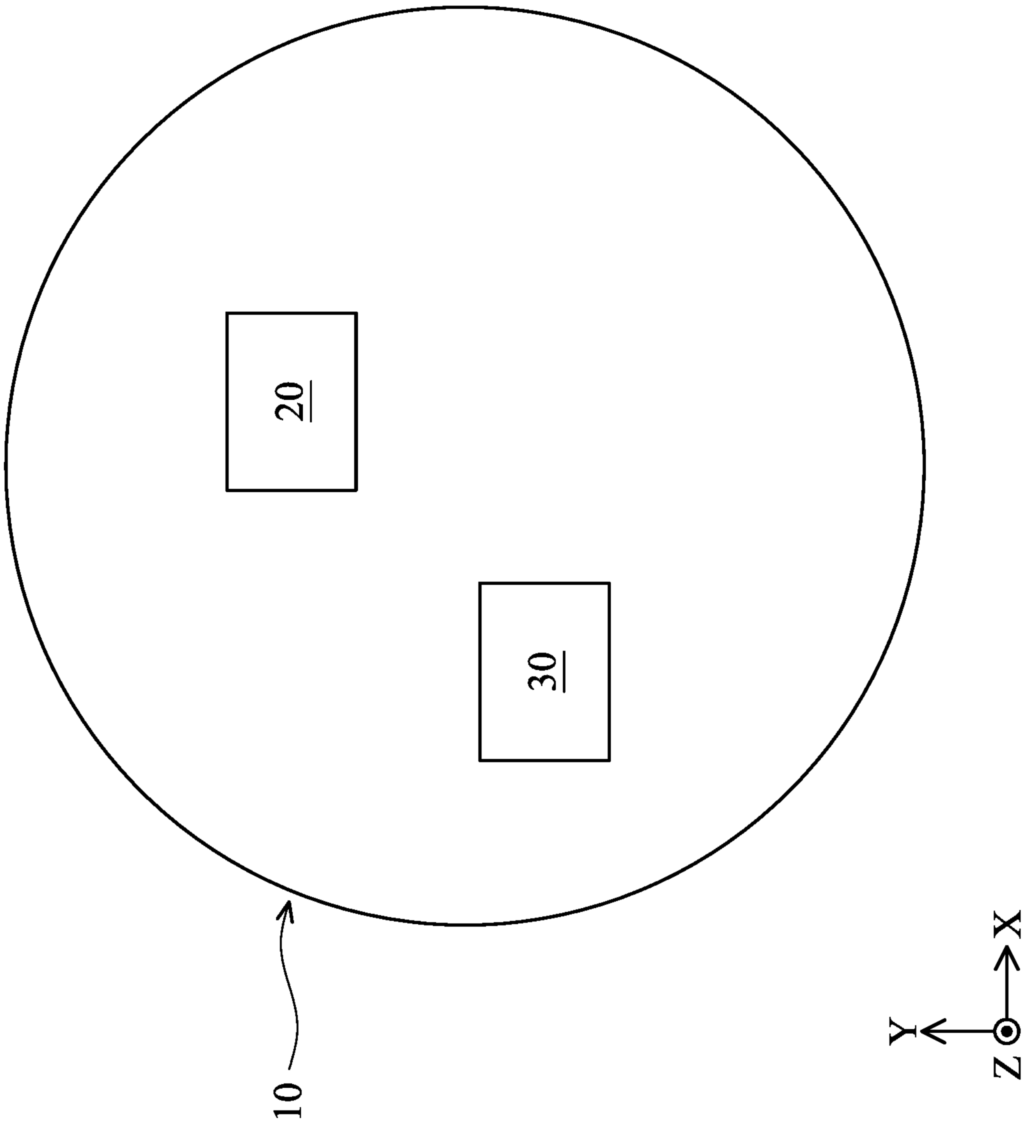
FIG. 1 illustrates a fragmentary diagrammatic top view of an integrated circuit (IC) chip, in portion or entirety, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor structures, and more particularly to semiconductor structures with field-effect transistors (FETs), such as three-dimensional gate-all-around (GAA) transistors, in memory (e.g., SRAM) and/or standard logic cells of an integrated circuit (IC) structure. Generally, a GAA transistor may include a plurality of vertically stacked sheets (e.g., nanosheets), wires (e.g., nanowires), or rods (e.g., nanorods) in a channel region of the transistor, thereby allowing better gate control, lowered leakage current, and improved scaling capability for various IC applications. While existing technologies for fabricating GAA transistors have been generally adequate for their intended applications, they have not been entirely satisfactory in all aspects.

The gate-all-around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures including dielectric layers under inner spacers and extended in to the substrate, such that the leakage current from one source/drain feature to another source/drain feature through the substrate is prevented. The details of the structure and manufacturing methods of the present disclosure are described below in conjunction with the accompanying drawings, which illustrate the process of making GAA transistors, according to some embodiments.

The various aspects of the present disclosure will now be described in more detail with reference to the figures. For avoidance of doubts, an X-direction, a Y-direction, and a Z-direction in the figures are perpendicular to one another and are used consistently. Throughout the present disclosure, like reference numerals denote like features unless otherwise indicated.

FIG. 1 is a fragmentary diagrammatic top view of an integrated circuit (IC) chip 10, in portion or entirety, in accordance with some embodiments of the present disclosure. The IC chip 10 may include various passive microelectronic devices and active microelectronic devices, such as resistors, capacitors, inductors, diodes, p-type field effect transistors (PFETs), n-type field effect transistors (NFETs), metal-oxide semiconductor field effect transistors (MOSFETs), CMOS transistors, bipolar junction transistors (BJTs), laterally diffused MOS (LDMOS) transistors, high voltage transistors, high frequency transistors, other suitable components, or a combination thereof. The various microelectronic devices can be configured to provide the IC chip 10 with functionally distinct regions, such as a core region (also referred to as a logic region), a memory region (e.g., a static random access memory (SRAM) region), an analog region, a peripheral region (also referred to as an input/output (I/O) region), a dummy region, and/or other suitable region. In some embodiments, the IC chip 10 includes a memory region 20 and a logic region 30. The memory region 20 can include an array of memory cells, each of which includes transistors and interconnection structures (also referred to as routing structures) that combine to provide a storage device and/or a storage function, such as a flip flop, a latch, other suitable memory devices, or combinations thereof. In some embodiments, the memory region 20 is configured with static random-access memory (SRAM) cells, dynamic random-access memory (DRAM) cells, non-volatile random-access memory (NVRAM) cells, flash memory cells, other suitable memory cells, or combinations thereof. The logic region 30 can include an array of circuit cells having various logic cells or standard (STD) cells. The logic cells or STD cells may include transistors and interconnection structures that combine to provide a logic device and/or a logic function, such as an inverter, an AND, an NAND, an OR, an NOR, a NOT, an XOR, an XNOR, other suitable logic devices, or combinations thereof. FIG. 1 has been simplified for the sake of clarity to better understand the inventive concepts of the present disclosure. Additional features can be added in IC chip 10, and some of the features described herein can be replaced, modified, or eliminated in other embodiments of the IC chip 10.

FIGS. 2A to 2E are circuit schematics of various STD cells in the array of circuit cells in the logic region 30 of the IC chip 10, in accordance with some embodiments of the present disclosure.

Figure 2A:
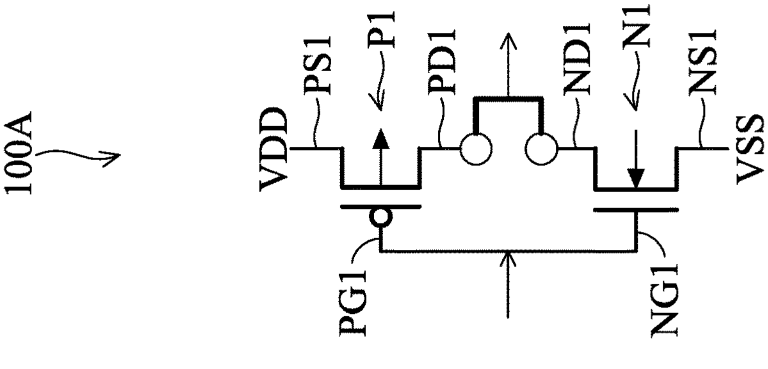
FIGS. 2A, 2B, and 2C illustrate circuit schematics of various STD cells that can be implemented in the logic region of the IC chip of FIG. 1 in accordance with some embodiments of the present disclosure.

FIG. 2A shows an inverter 100A including an N-type transistor N1 and a P-type transistor P1. The N-type transistor N1 includes a source terminal NS1, a drain terminal ND1, and a gate terminal NG1, and the P-type transistor P1 includes a source terminal PS1, a drain terminal PD1, and a gate terminal PG1.

As shown in FIG. 2A, the gate terminals NG1 and PG1 are coupled with each other to operate as an input terminal of the inverter 100A. The drain terminals ND1 and PD1 are coupled with each other to operate as an output terminal of the inverter 100A. The source terminal PS1 is coupled to a VDD voltage. The source terminal NS1 is coupled to a VSS voltage (or a ground voltage).

Figure 2B:
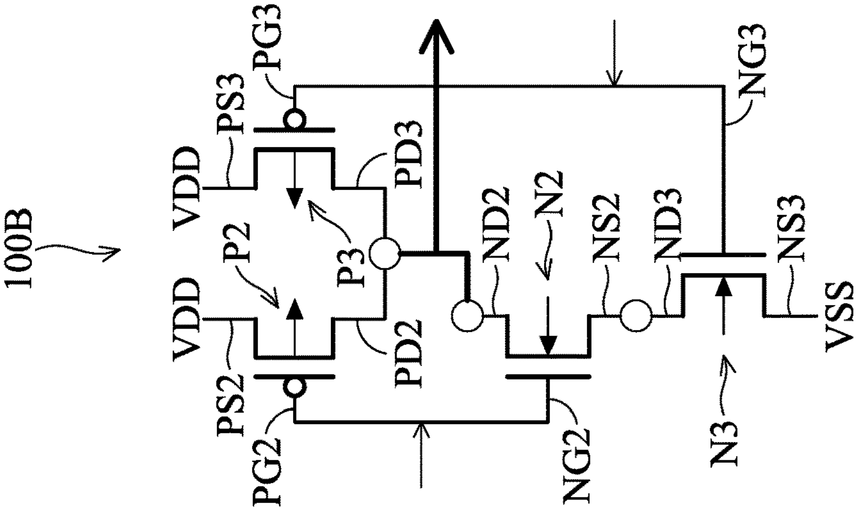

FIG. 2B shows a NAND (also referred to as a NAND logic gate, a NAND device or a NAND cell) 100B including N-type transistors N2, N3 and P-type transistors P2, P3. The N-type transistor N2 includes a source terminal NS2, a drain terminal ND2, and a gate terminal NG2, and the N-type transistor N3 includes a source terminal NS3, a drain terminal ND3, and a gate terminal NG3. The P-type transistor P2 includes a source terminal PS2, a drain terminal PD2, and a gate terminal PG2, and the P-type transistor P3 includes a source terminal PS3, a drain terminal PD3, and a gate terminal PG3.

As shown in FIG. 2B, the gate terminals NG2 and PG2 are coupled with each other to operate as a first input terminal of the NAND 100B, and the gate terminals NG3 and PG3 are coupled with each other to operate as a second input terminal of the NAND 100B. The drain terminals ND2, PD2, and PD3 are coupled with each other to operate as an output terminal of the NAND 100B. In some embodiments, the connection of the drain terminals ND2, PD2, and PD3 are referred to as a "common drain." The source terminals PS2 and PS3 are coupled to the VDD voltage. The source terminal NS3 is coupled to VSS voltage (or a ground voltage). The source terminal NS2 and drain terminal ND3 are coupled with each other.

Figure 2C:
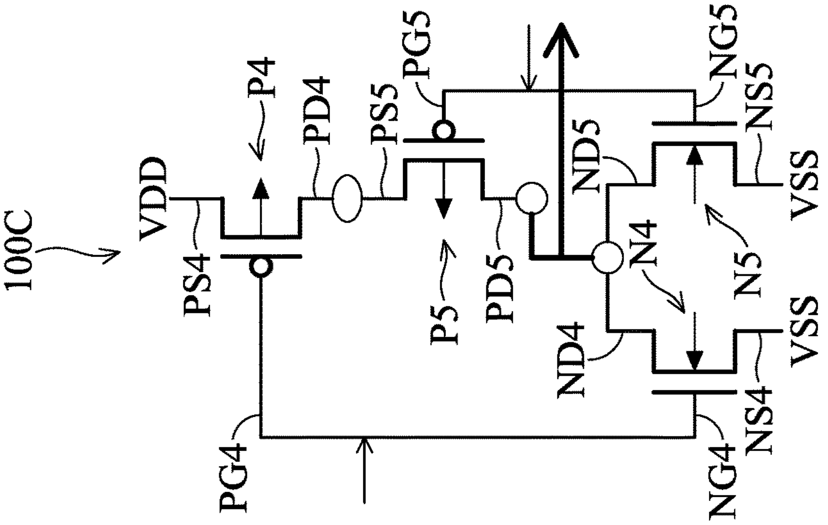

FIG. 2C shows a NOR (also referred to as a NOR logic gate, a NOR device or a NOR cell) 100C including N-type transistors N4, N5 and P-type transistors P4, P5. The N-type transistor N4 includes a source terminal NS4, a drain terminal ND4, and a gate terminal NG4, and the N-type transistor N5 includes a source terminal NS5, a drain terminal ND5, and a gate terminal NG5. The P-type transistor P4 includes a source terminal PS4, a drain terminal PD4, and a gate terminal PG4, and the P-type transistor P5 includes a source terminal PS5, a drain terminal PD5, and a gate terminal PG5.

As shown in FIG. 2C, the gate terminals NG4 and PG4 are coupled with each other to operate as a first input terminal of the NOR 100C, and the gate terminals NG5 and PG5 are coupled with each other to operate as a second input terminal of the NOR 100C. The drain terminals ND4, ND5, and PD5 are coupled with each other to operate as an output terminal of the NOR 100C. In some embodiments, the connection of the drain terminals ND4, ND5, and PD5 are referred to as "common drain." The source terminal PS4 is coupled to the VDD voltage. The source terminals NS4 and NS5 are coupled to VSS voltage (or a ground voltage). The source terminal PS5 and drain terminal PD4 are coupled with each other.

Figure 3:
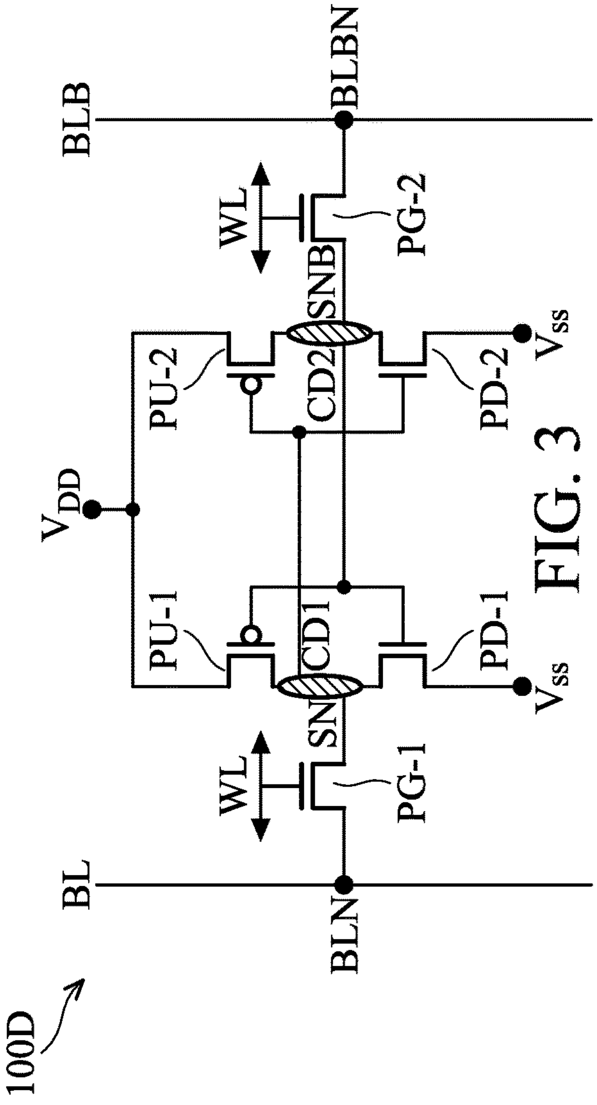
FIGS. 3 and 4 illustrate circuit schematics of a static random access memory (SRAM) cell that can be implemented in the memory region of the IC chip of FIG. 1, in accordance with some embodiments of the present disclosure.
Figure 4:
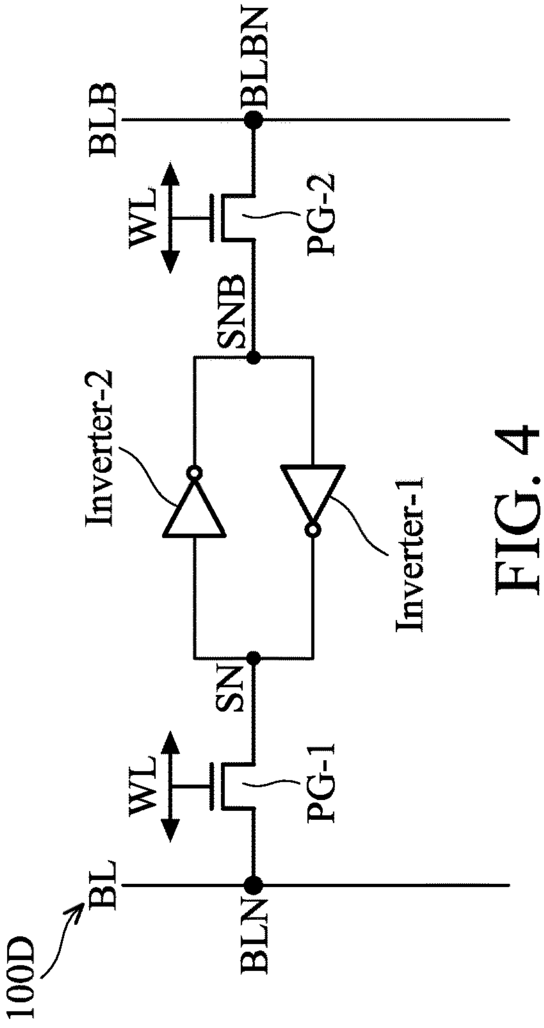

FIGS. 3 and 4 are circuit diagrams of an SRAM circuit that can be implemented in an SRAM cell of an array in the memory region 20 of FIG. 1, in accordance with some embodiments of the present disclosure. The circuit diagram of SRAM cell is merely exemplary, and in some embodiments, each of SRAM cells in the array is configured with an SRAM circuit similar to the SRAM cells 100D as shown in FIGS. 2 and 3. For example, each of SRAM cells has a storage portion that includes a cross-coupled pair of inverters (also referred to as a latch), such as an Inverter-1 and an Inverter-2. Inverter-1 includes pull-up transistor PU-1 and pull-down transistor PD-1, and Inverter-2 includes pull-up transistor PU-2 and pull-down transistor PD-2. Pass-gate transistor PG-1 is connected to an output of Inverter-1 and an input of Inverter-2, and pass-gate transistor PG-2 is connected to an output of Inverter-2 and an input of Inverter-1. In operation, pass-gate transistor PG-1 and pass-gate transistor PG-2 provide access to the storage portion of their respective SRAM cell (i.e., Inverter-1 and Inverter-2) and can also be referred to as access transistors of their respective SRAM cell. Each of SRAM cells is connected to and powered through a first power supply voltage, such as a positive power supply voltage, and a second power supply voltage, such as a ground voltage or a reference voltage (which can be an electrical ground). A gate of pull-up transistor PU-1 interposes a source, which is electrically coupled to the first power supply voltage via a voltage node (or voltage source) $V_{DD}$, and a first common drain (CD1) (i.e., a drain of pull-up transistor PU-1 and a drain of pull-down transistor PD-1). A gate of pull-down transistor PD-1 interposes a source, which is electrically coupled to the second power supply voltage via a voltage node (or voltage source) $V_{SS}$, and the first common drain. A gate of pull-up transistor PU-2 interposes a source, which is electrically coupled to the first power supply voltage via voltage node $V_{DD}$, and a second common drain (CD-2) (i.e., a drain of pull-up transistor PU-2 and a drain of pull-down transistor PD-2). A gate of pull-down transistor PD-2 interposes a source, which is electrically coupled to the second power supply voltage via voltage node $V_{SS}$, and the second common drain. The first common drain provides a storage node SN that stores data in true form, and the second common drain provides a storage node SNB that stores data in complementary form, or vice versa, in some embodiments. The gate of pull-up transistor PU1 and the gate of pull-down transistor PD-1 are coupled together and to the second common drain SD2, and the gate of pull-up transistor PU-2 and the gate of pull-down transistor PD-2 are coupled together and to the first common drain SD1. A gate of pass-gate transistor PG-1 interposes a drain connected to a bit line node BLN, which is electrically coupled to a bit line BL, and a source, which is electrically coupled to the first common drain SD1. A gate of pass-gate transistor PG-2 interposes a drain connected to a complementary bit line node BLBN, which is electrically coupled to a complementary bit line BLB, and a source, which is electrically coupled to the second common drain SD2. Gates of pass-gate transistors PG-1, PG-2 are connected to and controlled by a word line WL, which allows selection of a respective SRAM cell for reading and/or writing. In some embodiments, pass-gate transistors PG-1, PG-2 provide access to storage nodes SN, SNB, respectively, each of which can store a bit (e.g., a logical 0 or a logical 1), during read operations and/or write operations. For example, pass-gate transistors PG-1, PG-2 couple storage nodes SN, SNB, respectively, to bit line BL and bit line bar BLB in response to voltage applied to the gates of the pass-gate transistors PG-1, PG-2 by the word line WL. In some embodiments, SRAM cells are single-port SRAMs. In some embodiments, SRAM cells are configured as multi-port SRAMs, such as dual-port SRAMs, and/or with more or less transistors than depicted, such as 8T SRAMs. FIGS. 3 and 4 have been simplified for the sake of clarity to better understand the inventive concepts of the present disclosure. Additional features can be added in the SRAM circuits of FIGS. 3 and 4, and some of the features described herein can be replaced, modified, or eliminated in other embodiments of the SRAM circuits of FIGS. 3 and 4.

Figure 5:
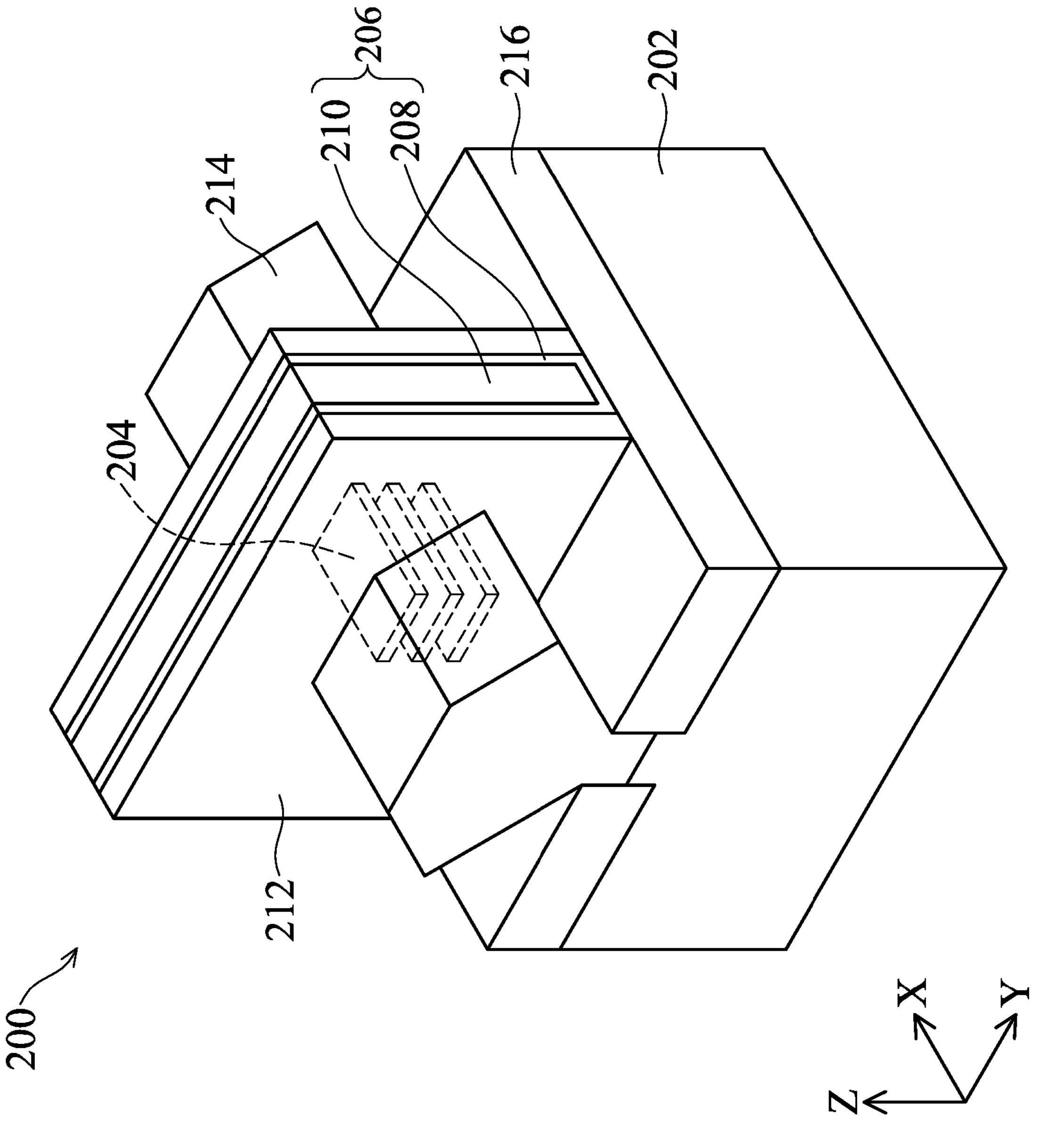
FIG. 5 illustrates a perspective view of an embodiment of a GAA transistor in the circuit cells or the SRAM device, in accordance with some embodiments of the present disclosure.

Each of the circuit cells and the SRAM cells discussed above is constructed by transistors. The transistors may be planar transistors, fin field-effect transistor (FinFET) transistors, gate-all-around (GAA) transistors, nano-wire transistors, nanosheet transistors, or a combination thereof. For the sake of providing an example, an exemplary GAA transistor is illustrated in FIG. 5. However, it should be understood that the application should not be limited to a particular type of device, except as specifically claimed.

Referring to FIG. 5, a perspective view of an exemplary GAA transistor 200 is illustrated. The GAA transistor 200 is formed over a substrate 202. The substrate 202 may contains a semiconductor material, such as bulk silicon (Si). The GAA transistor 200 also includes one or more nanostructures 204 (dash lines) extending in the X-direction and vertically stacked (or arranged) in the Z-direction. More specifically, the nanostructures 204 are spaced apart from each other in the Z-direction. In some embodiments, the nanostructures 204 may also be referred to as channels, channel layers, nanosheets, or nanowires.

The GAA transistor 200 further includes a gate structure 206 including a gate dielectric layer 208 and a gate electrode 210. The gate dielectric layer 208 wraps around the nanostructures 204 and the gate electrode 210 wraps around the gate dielectric layer 208 (not shown in FIG. 5, may refer to FIGS. 6B to 6D). As shown in FIG. 5, gate spacers 212 are on sidewalls of the gate structure 206 and over the nanostructures 204 (not shown in FIG. 5, may refer to FIGS. 6B and 6C)

The GAA transistor 200 further includes source/drain features 214. As shown in FIG. 5, two source/drain features 214 are on opposite sides of the gate structure 206. The nanostructures 204 (dash lines) extend in the X-direction to connect one source/drain feature 214 to the other source/drain feature 214. The source/drain features 214 may also be referred to as source/drain, or source/drain regions. In some embodiments, source/drain feature(s) may refer to a source or a drain, individually or collectively dependent upon the context.

Isolation feature 216 is over the substrate 202 and under the gate dielectric layer 208, the gate electrode 210, and the gate spacers 212. The isolation feature 216 is used for isolating the GAA transistor 200 from other devices. In some embodiments, the isolation feature 216 may include different structures, such as shallow trench isolation (STI) structure, deep trench isolation (DTI) structure. Therefore, the isolation feature 216 is also referred as to as a STI feature or DTI feature.

Figure 6A:
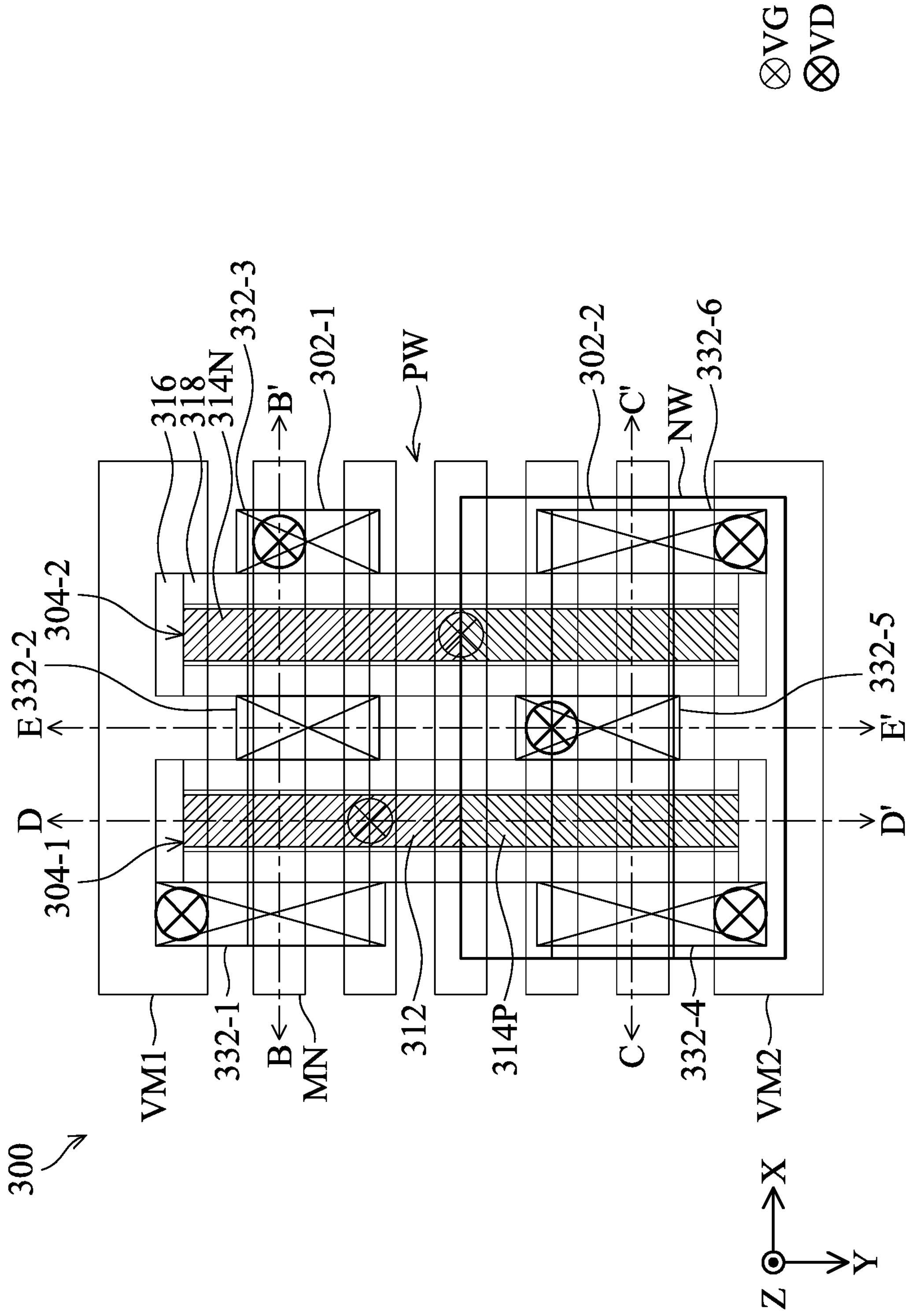
FIG. 6A illustrates a top view (or a layout) of a semiconductor device in the logic region or memory region of the IC chip, in accordance with some embodiments of the present disclosure.
Figure 6C:
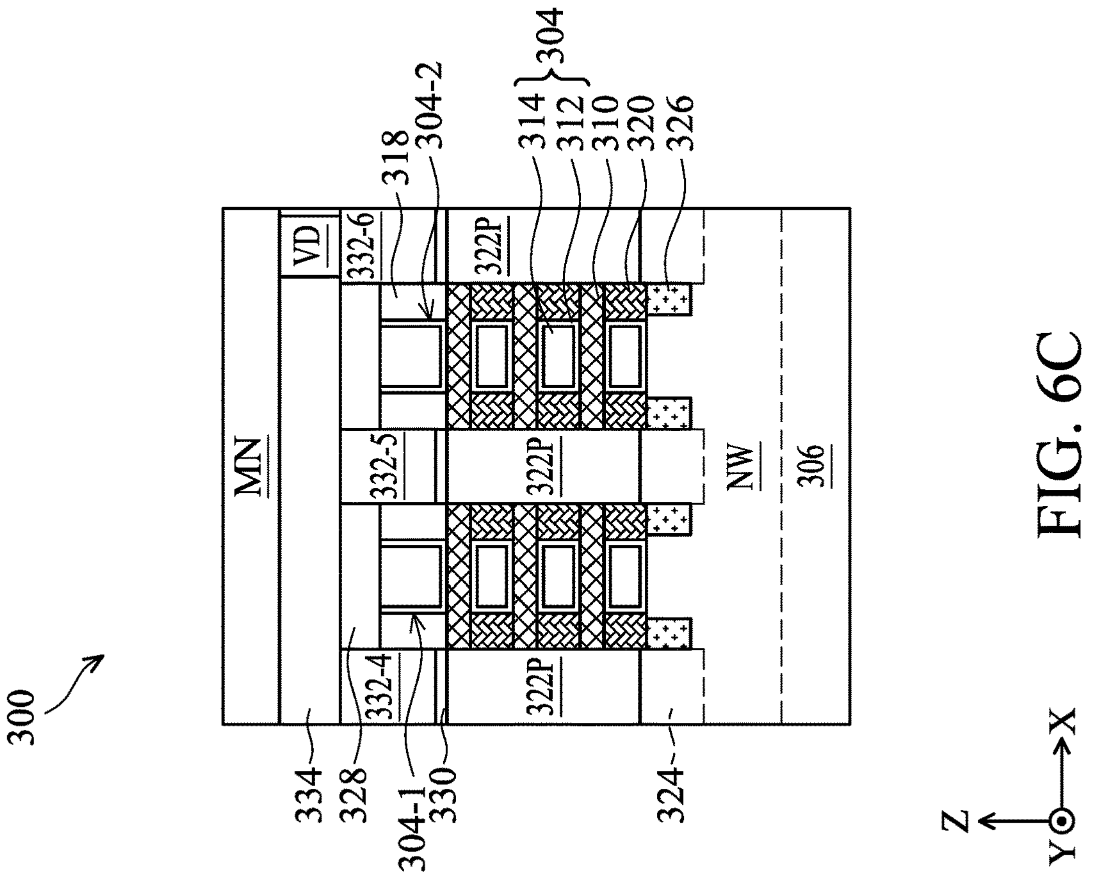
FIG. 6C illustrates an X-Z cross-sectional view of the semiconductor device along a line C-C' of FIG. 6A, respectively, in accordance with some embodiments of the present disclosure.
Figure 6B:
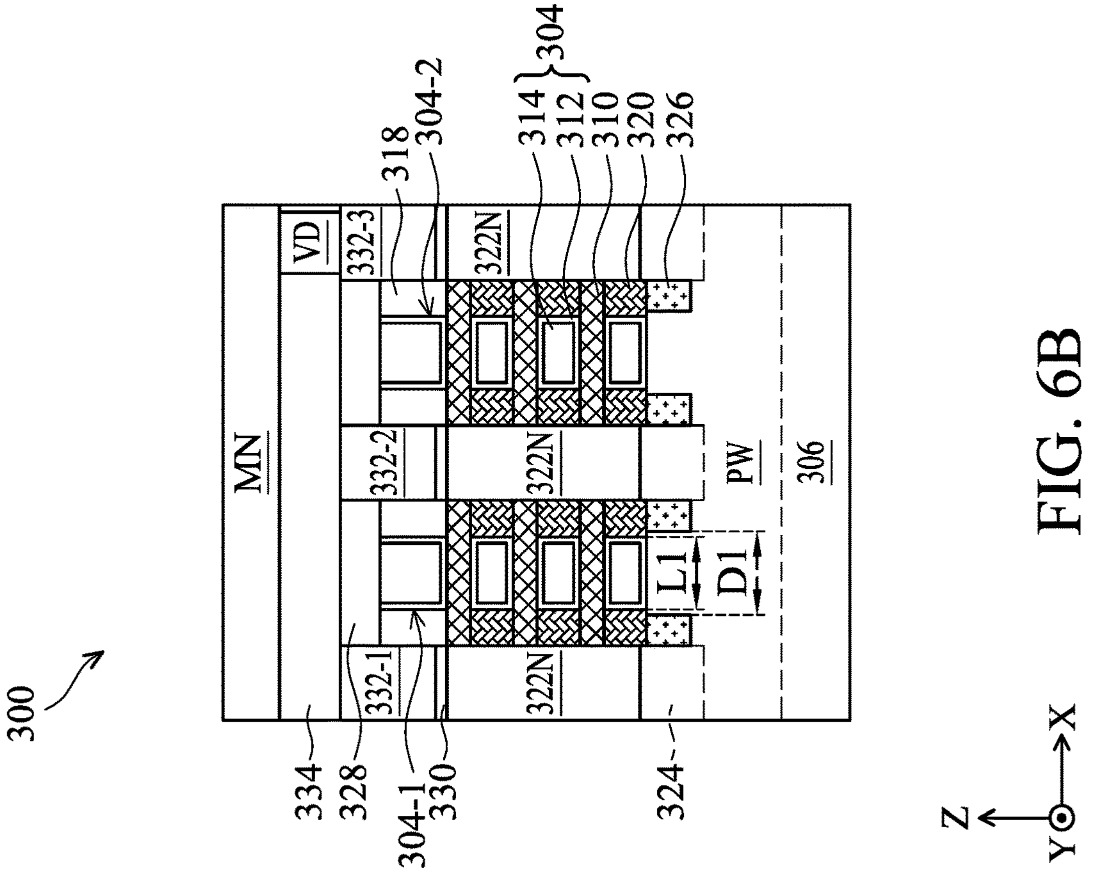
FIG. 6B illustrates an X-Z cross-sectional view of the semiconductor device along a line B-B' of FIG. 6A, respectively, in accordance with some embodiments of the present disclosure.
Figure 6D:
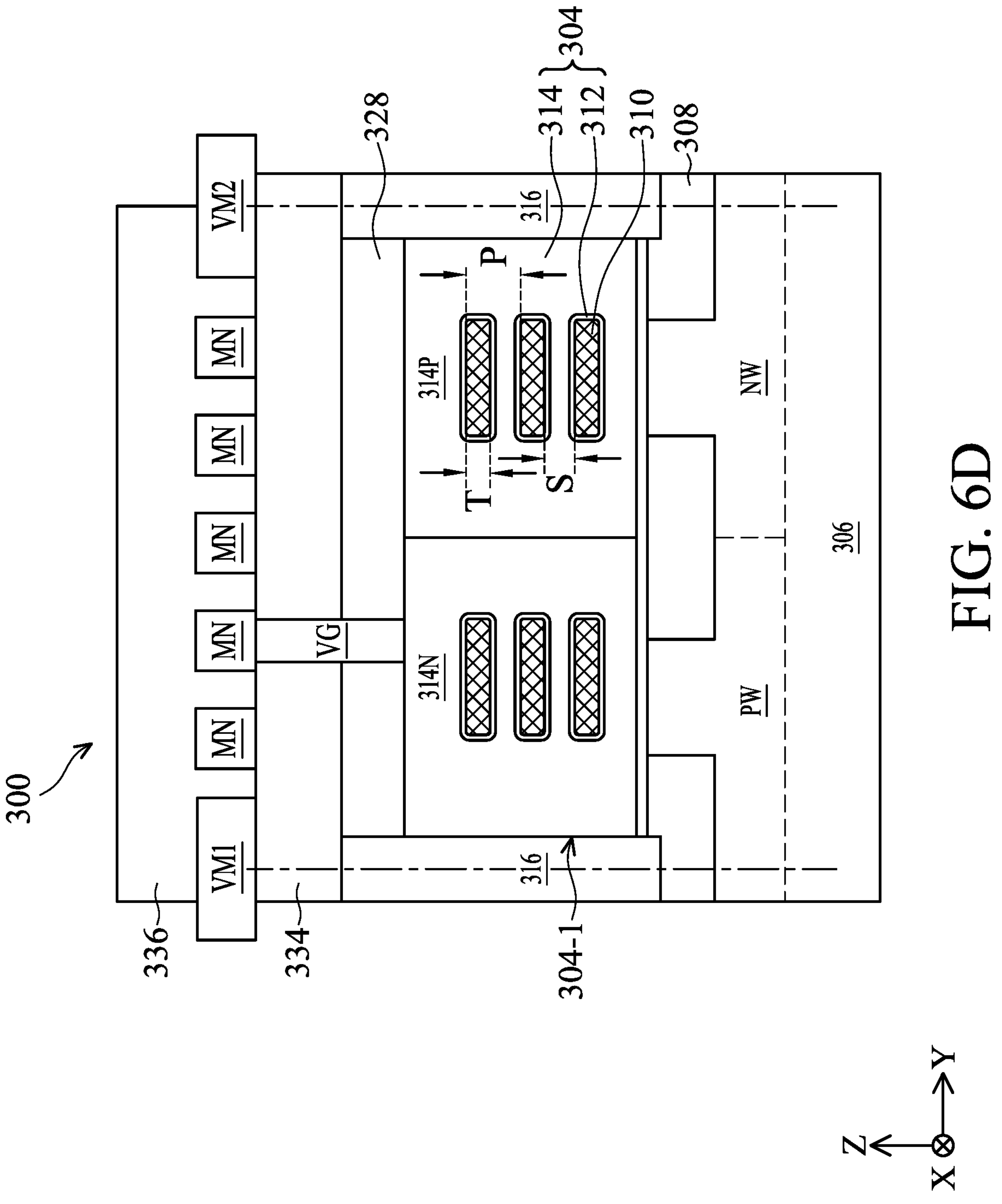
FIG. 6D illustrates a Y-Z cross-sectional view of the array of the semiconductor device along a line D-D' of FIG. 6A, respectively, in accordance with some embodiments of the present disclosure.
Figure 6E:
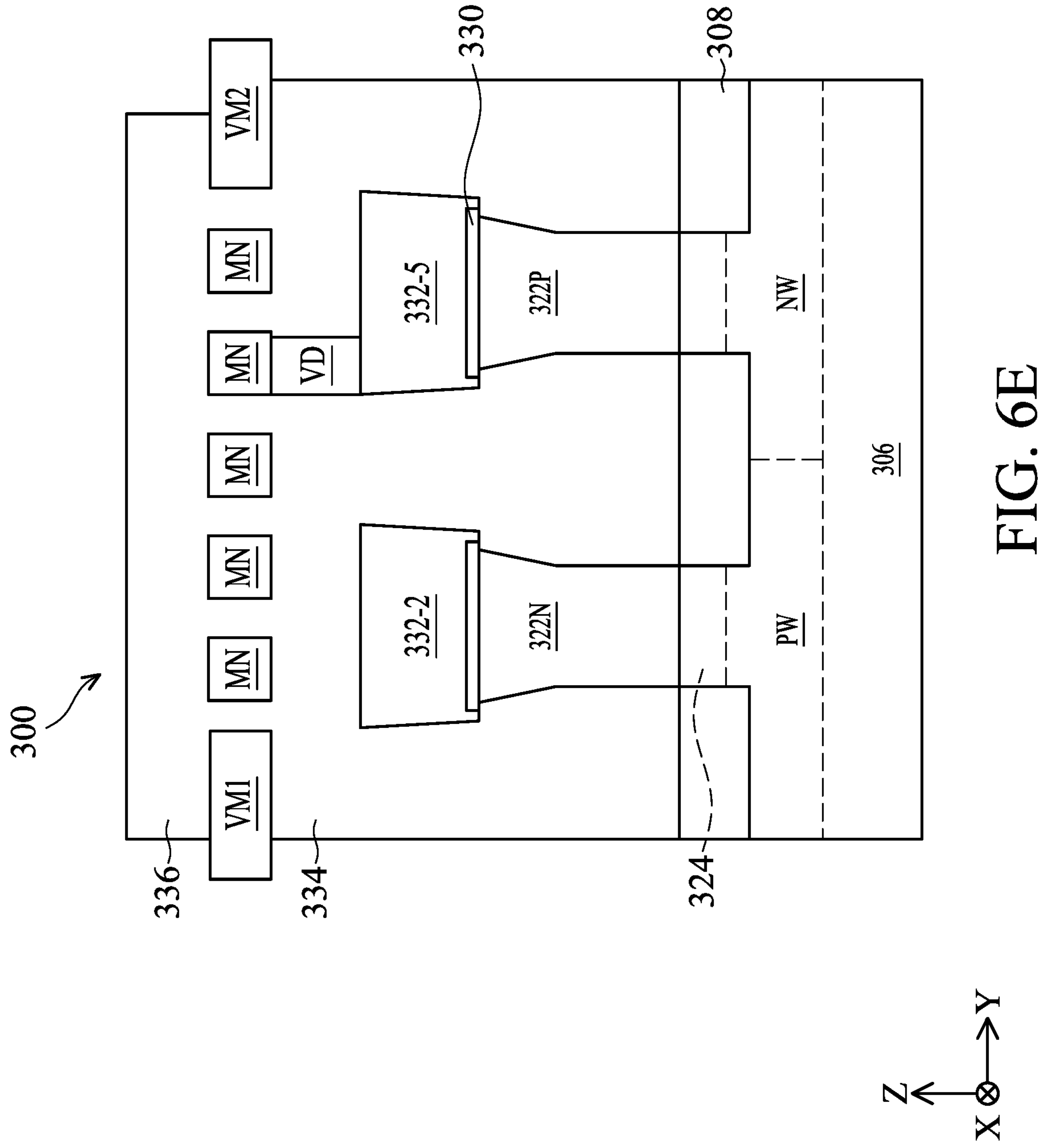
FIG. 6E illustrates a Y-Z cross-sectional view of the semiconductor device along a line E-E' of FIG. 6A, respectively, in accordance with some embodiments of the present disclosure.

FIG. 6A illustrates a top view (or a layout) of a semiconductor device 300 in the memory region 20 or the logic region 30 of the IC chip 10, in accordance with some embodiments of the present disclosure. FIG. 6B illustrates an X-Z cross-sectional view of the semiconductor device 300 along a line B-B' of FIG. 6A, respectively, in accordance with some embodiments of the present disclosure. FIG. 6C illustrates an X-Z cross-sectional view of the semiconductor device 300 along a line C-C' of FIG. 6A, respectively, in accordance with some embodiments of the present disclosure. FIG. 6D illustrates a Y-Z cross-sectional view of the array of the semiconductor device 300 along a line D-D' of FIG. 6A, respectively, in accordance with some embodiments of the present disclosure. FIG. 6E illustrates a Y-Z cross-sectional view of the semiconductor device 300 along a line E-E' of FIG. 6A, respectively, in accordance with some embodiments of the present disclosure.

The semiconductor device 300 includes active areas, such as active areas 302-1 and 302-2, (may be collectively referred to as the active areas 302) that extend lengthwise in the X-direction. Each of active areas 302 includes channel regions, source regions, and drain regions (where source regions and drain regions are collectively referred to as source/drain regions herein) of transistors (e.g., the GAA transistor 200) of the semiconductor device 300. The active area 302-1 are disposed over a P-type well (or P-Well) PW. The active area 302-2 is are disposed over an N-type well (or N-Well) NW.

The semiconductor device 300 further includes gate structures, such as gate structures 304-1 and 304-2 (may be collectively referred to as the gate structures 304). The gate structures 304-1 and 304-2 extend substantially parallel to one another, extend lengthwise in the Y-direction perpendicular to the X-direction, and are separated from each other in the X-direction, as shown in FIG. 6A. The gate structures 304-1 and 304-2 are disposed over the channel regions of the respective active areas 302-1 and 302-2 (i.e., the (vertically stacked) nanostructures) and disposed between respective source/drain regions of the active areas 302-1 and 302-2 (i.e., P-type source/drain features and/or N-type source/drain features, respectively). In some embodiments, gate structures 304-1 and 304-2 wrap and/or surround suspended, vertically stacked nanostructures 310 in the channel regions of the active areas 302-1 and 302-2, respectively (as shown in FIG. 6D). More specifically, as shown in FIGS. 6A to 6D, each of the gate structures 304-1 and 304-2 wrap around the nanostructures 310 in the channel regions of the active areas 302-1 and 302-2. For example, the gate structure 304-1 wraps around the nanostructures 310 in the active area 302-1 over the P-type well PW and the nanostructures 310 in the active area 302-2 over the N-type well NW.

The active areas 302-1 and 302-2 and the gate structures 304-1 and 304-2 are configured to provide transistors for the circuit cells and the SRAM cells discussed above. As shown in FIG. 6A, in the semiconductor device 300, the gate structure 304-1 engages the active area 302-1 to construct an N-type transistor NT1, the gate structure 304-1 engages the active area 302-2 to construct a P-type transistor PT1, the gate structure 304-2 engages the active area 302-1 to construct an N-type transistor NT2, and the gate structure 304-2 engages the active area 302-2 to construct a P-type transistor PT2. In some embodiments, the semiconductor device 300 shown in FIG. 6A serves as the NAND 100B discussed above, and the N-type transistor NT1, the N-type transistor NT2, the P-type transistor PT1, and the P-type transistor PT2 may respectively be similar to the N-type transistor N3, the N-type transistor N2, the P-type transistor P3, and the P-type transistor P2 of the NAND 100B discussed above.

Therefore, the transistors used for the circuit cells and/or the SRAM cells are formed. In some embodiments, the N-type transistors NT1 and NT2 are arranged in the X-direction and share the active area 302-1, and the P-type transistors PT1 and PT2 are arranged in the X-direction and share the active area 302-2. Furthermore, each of the N-type transistors is arranged with one P-type transistor in the Y-direction and share one gate structure with that P-type transistor. For example, in the semiconductor device 300, the N-type transistor NT1 and the P-type transistor PT1 are arranged in the Y-direction and share the gate structure 304-1, and the N-type transistor NT2 and the P-type transistor PT2 are arranged in the Y-direction and share the gate structure 304-2.

Referring to FIGS. 4C to 4F, the semiconductor device 300 includes a substrate 306, over which the various features are formed, such as the gate structures above. The substrate 306 may contains a semiconductor material, such as bulk silicon (Si). In some other embodiments, the substrate 306 may include other semiconductors such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). Alternatively, the substrate 306 may be a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates may be fabricated using separation by implantation of oxygen (SIMOX), wafer bonding, and/or other suitable methods.

The N-type well NW and the P-type well PW are formed in or on the substrate 306, as shown in FIGS. 6B to 6E. In the present embodiment, the P-type well PW is a P-type doped region configured for N-type transistors, and the N-type well NW is a N-type doped region configured for P-type transistors. The N-type well NW is doped with N-type dopants, such as phosphorus, arsenic, other N-type dopant, or a combination thereof. The P-type well PW is doped with P-type dopants, such as boron, indium, other P-type dopant, or a combination thereof. In some implementations, the substrate 306 includes doped regions formed with a combination of P-type dopants and N-type dopants. The various N-type wells and/or P-type wells can be formed directly on and/or in the substrate 306, for example, providing a p-well structure, an n-well structure, a dual-well structure, a raised structure, or a combination thereof. An ion implantation process, a diffusion process, and/or other suitable doping process can be performed to form the various wells.

Similar to the isolation feature 216 discussed above, the semiconductor device 300 further includes an isolation feature (or isolation structure) 308 over the substrate 306 and isolating the adjacent active areas 302. The isolation feature 308 may include silicon oxide, silicon nitride, silicon oxynitride, other suitable isolation material (for example, including silicon, oxygen, nitrogen, carbon, or other suitable isolation constituent), or combinations thereof. The isolation feature 308 may include different structures, such as shallow trench isolation (STI) structures, deep trench isolation (DTI) structures, and/or local oxidation of silicon (LOCOS) structures. In some embodiments, STI features include a multilayer structure that fills the trenches, such as a silicon nitride comprising layer disposed over a thermal oxide comprising liner layer. In another example, STI features include a dielectric layer disposed over a doped liner layer (including, for example, boron silicate glass (BSG) or phosphosilicate glass (PSG)). In yet another example, STI features include a bulk dielectric layer disposed over a liner dielectric layer, where the bulk dielectric layer and the liner dielectric layer include materials depending on design requirements.

Each of the transistors in the semiconductor device 300 (and the N-type transistor NT1, the N-type transistor NT2, the P-type transistor PT1, and the P-type transistor PT2) includes nanostructures 310 that are similar to the nanostructures 204 discussed above. As shown in FIGS. 6B to 6DE, the nanostructures 310 are suspended over the N-type well NW and the P-type well PW of the substrate 306. In some embodiments, three nanostructures 310 are vertically stacked (or vertically arranged) from each other in the Z-direction for one transistor. However, there may be another appropriate number of nanostructures in one transistor. For example, there may be from 2 to 10 nanostructures 310 in one transistor. The nanostructures 310 further extend lengthwise in the X-direction (FIGS. 6B and 6C) and widthwise in the Y-direction (FIG. 6D). In some embodiments, each of the nanostructures 310 has a thickness T in the Z-direction, and is in a range from about 3 nm to about 8 nm, as shown in FIG. 4D. As shown in FIG. 4D, in each of the transistors in the semiconductor device 300, three nanostructures 310 are spaced from each other in the Z-direction by a distance S, which is in a range from about 3 nm to about 10 nm. In some embodiments, the nanostructures 310 has vertically a pitch P in the Z-direction and in a range from about 12 nm to about 24 nm.

The nanostructures 310 may include a semiconductor material, such as silicon, germanium, silicon carbide, silicon phosphide, gallium arsenide, gallium phosphide, indium phosphide, indium arsenide, and/or indium antimonide, silicon germanium (SiGe), SiPC, GaAsP, AlInAs, AlGaAs, GaInAs, GaInP, and/or GaInAsP. In some embodiments, the nanostructures 310 include silicon for N-type transistors. In other embodiments, the nanostructures 310 include silicon germanium for P-type transistors. In some embodiments, the nanostructures 310 are all made of silicon, and the type of the transistors depend on a work function metal layer wrapping around the nanostructures 310. In some embodiments, the nanostructures 310 are epitaxially grown using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized.

As discussed above, the gate structures 304-1 and 304-2 engage the active areas 302 to construct the transistors. More specifically, the gate structures 304-1 and 304-2 wrap around the nanostructures 310 in the channel regions of the active areas 302-1 and 302-2. In some embodiments, the gate length of the gate structures 304 in the X-direction is in a range from about 5 nm to about 20 nm. Each of the gate structures 304-1 and 304-2 has a gate dielectric layer 312 and a gate electrode layer 314. The gate dielectric layers 312 wrap around each of the nanostructures 310 and the gate electrode layers 314 wrap around the gate dielectric layer 312. In some embodiments, a thickness of the gate dielectric layer 312 is in a range from about 0.5 nm to about 3 nm. In some embodiments, each of the gate structures 304 further includes an interfacial layer (such as having silicon dioxide, silicon oxynitride, or other suitable materials) between the gate dielectric layer 312 and the nanostructures 310. The gate dielectric layers 312 may include oxide with nitrogen doped dielectric material (initial layer) combined with metal content high-K dielectric material (K value (dielectric constant)>13). For example, gate dielectric layers 312 may include hafnium oxide ($HfO_2$), which has a dielectric constant in a range from about 18 to about 40. Alternatively, the gate dielectric layers 312 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfLaO, HfSiO, LaSiO, AlSiO, HfTaO, HfTiO, (Ba,Sr)$TiO_3$ (BST), $Al_2O_3$, $Si_3N_4$, oxynitrides (SiON), combinations thereof, or other suitable material.

The gate dielectric layers 312 may be formed by chemical oxidation, thermal oxidation, ALD, CVD, and/or other suitable methods.

The gate electrode layer 314 is formed to wrap around the gate dielectric layer 312 and the center portions of the nanostructures 310, as shown in FIGS. 6B and 6C. In some embodiments, the gate electrode layer 314 may include an N-type work function metal layer 314N for N-type transistor or a P-type work function metal layer 314P for P-type transistor. The N-type work function metal layer 314N and the P-type work function metal layer 314P may be selected from a group consisting of TiN, TaN, TiAl, TiAlN, TaAl, TaAlN, TaAlC, TaCN, WNC, Co, Ni, Pt, W, or a combination thereof, in accordance with some embodiments. The material of the N-type work function metal layer 314N and the P-type work function metal layer v may be the same. In some embodiments, the material of the N-type work function metal layer 314N and the P-type work function metal layer 314P are different.

In some embodiments, the N-type work function metal layer 314N is a material such as Ti, Al, Ag, Mn, Zr, TiAl, TiAlC, TaC, TaCN, TaSiN, TaAl, TaAlC, TiAlN, other suitable N-type work function materials, or combinations thereof. For example, the N-type work function metal layer may be deposited utilizing ALD, CVD, or the like. However, any suitable materials and processes may be utilized to form the N-type work function metal layer 314N.

In some embodiments, the P-type work function metal layer 314P is a material such as TiN, TaN, Ru, Mo, Al, WN, $ZrSi_2$, $MoSi_2$, $TaSi_2$, $NiSi_2$, other metal oxides, metal nitrides, metal silicates, transition metal-oxides, transition metal-nitrides, transition metal-silicates, oxynitrides of metals, metal aluminates, zirconium silicate, zirconium aluminate, other suitable P-type work function materials, combinations of these, or the like. Additionally, the P-type work function metal layer 314P may be deposited using a deposition process such as ALD, CVD, or the like, although any suitable deposition process may be used.

In some embodiments, the gate electrode layer 314 may include a single layer or alternatively a multi-layer structure. In some embodiments, the gate electrode layer 314 may further include a capping layer, a barrier layer, and a fill material (not shown). The capping layer may be formed adjacent to the gate dielectric layers 312 and may be formed from a metallic material such as TaN, Ti, TiAlN, TiAl, Pt, TaC, TaCN, TaSiN, Mn, Zr, TiN, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The metallic material may be deposited using a deposition process such as ALD, CVD, or the like, although any suitable deposition process may be used. The barrier layer may be formed adjacent the capping layer, and may be formed of a material different from the capping layer. For example, the barrier layer may be formed of a material such as one or more layers of a metallic material such as TiN, TaN, Ti, TiAlN, TiAl, Pt, TaC, TaCN, TaSiN, Mn, Zr, Ru, Mo, WN, other metal oxides, metal nitrides, metal silicates, transition metal-oxides, transition metal-nitrides, transition metal-silicates, oxynitrides of metals, metal aluminates, zirconium silicate, zirconium aluminate, combinations of these, or the like. The barrier layer may be deposited using a deposition process such as atomic layer deposition, chemical vapor deposition, or the like, although any suitable deposition process may be used.

The semiconductor device 300 further includes gate end dielectric structures 316 at ends of the gate structures 304. More specifically, the gate end dielectric structures 316 are on opposite sides of the gate structures 304 in the Y-direction, as shown in FIGS. 6A and 6D. Furthermore, the gate end dielectric structures 316 extend lengthwise in the X-direction to separate the gate structures aligned in the Y-direction (not shown). In some embodiments, the gate end dielectric structures 316 separate the gate structures 304 from gate structures of other circuit cells and/or other SRAM cells (not shown) in other rows of the semiconductor device 300. Furthermore, the gate end dielectric structures 316 extend vertically into the isolation feature 308, as shown in FIG. 6D. Therefore, the isolation feature 308 are in contact with sidewalls and bottom surfaces of the gate end dielectric structures 316. The material of the gate end dielectric structures 316 is selected from a group consisting of $Si_3N_4$, SiON, SiOC, SiOCN, metal content dielectric, high K material (K>=9), or a combination thereof.

The semiconductor device 300 further include gate spacers 318 similar to gate spacers 212 discussed above. More specifically, the gate spacers 318 are on sidewalls of the gate structures 304 and over the nanostructures 310, as shown in FIGS. 6B and 6C. The gate spacers 318 are over the nanostructures 310 and on top sidewalls of the gate structures 304, and thus are also referred to as gate top spacers or top spacers. The gate spacers 318 may include multiple dielectric materials and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), carbon doped oxide, nitrogen doped oxide, porous oxide, air gap, or a combination thereof. In some embodiments, the gate spacers 318 may include a single layer or a multi-layer structure.

As shown in FIGS. 4C and 4D, the semiconductor device 300 further includes inner spacers 320 on the sidewalls of the gate structures, and below the topmost nanostructures 310. Furthermore, the inner spacers 320 are laterally between the source/drain features 322N (or 322P) and the gate structures. The inner spacers 320 are also vertically between adjacent nanostructures 310 and between bottommost nanostructures 310 and the substrate 306. The inner spacers 320 may include a dielectric material having higher K value (dielectric constant) than the gate spacers 318 and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In other embodiments, the inner spacers 320 may include a dielectric material having lower K value (dielectric constant) than the gate spacers 318. In some embodiments, the gate spacers 318 have a thickness in a range from about 3 nm to about 15 nm in the X-direction, and the inner spacers 320 have a thickness in a range from about 2 nm to about 12 nm in the X-direction. In some embodiments, the thickness of the gate spacers 318 in the X-direction and the thickness of the inner spacers 320 in the X-direction are the same. In other embodiments, the thickness of the gate spacers 318 in the X-direction is greater than the thickness of the inner spacers 320 in the X-direction for capacitance reduction between source/drain contact 332 and gate structure 304.

Referring to FIGS. 6B, 6C, and 6E, the semiconductor device 300 further includes source/drain features 322N and source/drain features 322P over the substrate 306 and in the source/drain regions of the active areas 302. More specifically, the source/drain features 322N and the source/drain features 322P are respectively disposed between the two respective gate structures 304. As shown in FIGS. 6B and 6C, the source/drain features 322N are disposed on opposite sides of the respective gate structure 304 in the X-direction to form the N-type transistors NT1 and NT2. Similarly, the source/drain features 322P are disposed on opposite sides of the respective gate structure 304 in the X-direction to form the P-type transistors PT1 and PT2.

Similar to the source/drain features 214 discussed above, the nanostructures 310 extend in the X-direction to connect one source/drain feature 322N/322P to the other source/drain feature 322N/322P. More specifically, the source/drain features 322N and the source/drain features 322P are also disposed on opposite sides of the respective nanostructures 310 in the X-direction. Therefore, the source/drain features 322N and the source/drain features 322P are attached and electrically connected to the nanostructures 310 in the X-direction. Furthermore, every two adjacent transistors in the X-direction share one source/drain feature 322N/322P, as shown in FIGS. 6B and 6C. The source/drain features 322N/322P may also be referred to as source/drain, or source/drain regions. In some embodiments, source/drain feature(s) may refer to a source or a drain, individually or collectively dependent upon the context.

The source/drain features 322N and 322P may be formed by using epitaxial growth. In some embodiments, the source/drain features 326N may include epitaxially-grown material selected from a group consisting of SiP, SiC, SiPC, SiAs, Si, or a combination thereof. In some embodiments, the epitaxially-grown material of the source/drain features 322N may be doped with N-type dopants (such as phosphorus, arsenic, other N-type dopant, or a combination thereof) having a doping concentration in a range from about $2\times10^{19}/cm^3$ to $3\times10^{21}/cm^3$. In some embodiments, the source/drain features 322N for N-type transistors may respectively be referred to as N-type features and N-type source/drain features.

In some embodiments, the source/drain features 322P may include epitaxially-grown material selected from a group consisting of boron-doped SiGe, boron-doped SiGeC, boron-doped Ge, boron-doped Si, boron and carbon doped SiGe, or a combination thereof. In some embodiments, the epitaxially-grown material of the source/drain features 322P may be doped with P-type dopants (such as boron, indium, other P-type dopant, or a combination thereof) having a doping concentration in a range from about $1\times10^{19}/cm^3$ to $6\times10^{20}/cm^3$. In some embodiments, the source/drain features 326P for P-type transistors may respectively be referred to as P-type source/drain features.

Referring to FIGS. 6B, 6C, and 6E, the semiconductor device 300 further includes silicon layers 324 under the source/drain features 322N and 322P and over the substrate 306. More specifically, the silicon layers 324 are vertically between and in contact with the source/drain features 322N/322P and the substrate 306 in the Z-direction. In some embodiment, the silicon layers 324 are doped with dopants as the well in the substrate 306. More specifically, the silicon layers 324 shown in FIG. 6B have the P-type dopants as in the P-type well PW of the substrate 306, and the silicon layers 324 shown in FIG. 6C have the N-type dopants as in the N-type well NW of the substrate 306. However, the silicon layers 324 are undoped when they are first formed. The dopants in the silicon layers 324 come from the diffusion of the dopants in the wells of the substrate 306. In some embodiments, the silicon layers 324 and the well in the substrate 306 are merged together and the interface between them are not obvious. Therefore, the silicon layers 324 may be considered a portion of the well in the substrate 306 in the resultant device, in accordance with some embodiments. Furthermore, a thickness of the silicon layers 324 is in a range from about 5 nm to about 50 nm. In some embodiments, top surfaces of the silicon layers 324 are higher than bottommost surfaces of the gate structures 304, as shown in FIGS. 6B and 6C. In other embodiments, the top surfaces of the silicon layers 324 are substantially level with the bottommost surfaces of the gate structures 304.

Referring to FIGS. 6B, 6C, and 6E, the semiconductor device 300 further includes dielectric layers 326 under the inner spaces 320 and over the substrate 306. More specifically, the dielectric layers 326 are vertically between and in contact with the inner spaces 320 and the substrate 306 in the Z-direction. As shown in FIGS. 6B and 6C, the dielectric layers 326 are also between and in contact with the silicon layers 324 and the P-type well PW/N-type well NW of the substrate 306 in the X-direction. As discussed above, the silicon layers 324 may be doped with dopants as the well in the substrate 306 and considered a portion of the well in the substrate 306. Therefore, the dielectric layers 326 may be considered as extending into and surrounded by the well region.

As shown in FIGS. 6B and 6C, bottom surfaces of the dielectric layers 326 are lower than the bottommost surfaces of the gate structures 304. Furthermore, bottom surfaces of the silicon layers 324 are lower than the bottom surfaces of the dielectric layers. The top surfaces of the silicon layers 324 are higher than top surfaces of the dielectric layers 326, as shown in FIGS. 6B and 6C. In some embodiments, the top surfaces of the silicon layers 324 are lower than the top surfaces of the dielectric layers 326. In other embodiments, the top surfaces of the silicon layers 324 are substantially level with the top surfaces of the dielectric layers 326. As shown in FIGS. 6B and 6C, sidewalls of the dielectric layers 326 in contact with the silicon layers 324 are aligned with sidewalls of the nanostructures 310 and the inner spaces 320 in the Y-direction.

Furthermore, there is a distance D1 between the dielectric layers 326 in the X-direction, which is in a range from about 5 nm to about 20 nm, as shown in FIG. 6B. In some embodiments, the distance D1 between the dielectric layers 326 in the X-direction is greater than the length (gate length) L1 of the gate structures 304 in the X-direction, as shown in FIG. 6B. In these embodiments, sidewalls of the dielectric layers 326 in contact with the substrate 306 are not aligned with (are offset from) sidewalls of the gate structures 304 and the inner spaces 320 in the Y-direction. Therefore, a width of the dielectric layers 326 in the X-direction is less than a width of the inner spacers 320 in the X-direction, as shown in FIGS. 6B and 6C. In some embodiments, a thickness of the dielectric layers 326 in the Z-direction is in a range from about 5 nm to about 50 nm. If the thickness of the dielectric layers 326 in the Z-direction is too small (the thickness is less than about 5 nm), the leakage current cannot be significantly reduced. If the thickness of the dielectric layers 326 in the Z-direction is too large (the thickness is greater than about 50 nm), the formation of the dielectric layers 326 becomes difficult.

The dielectric layers 326 vertically between and in contact with the inner spaces 320 and the substrate 306 in the Z-direction may reduce the leakage current from one source/drain feature 322N/322P to another source/drain feature 322N/322P through the substrate 306 (i.e., the leakage current of the bottom planar transistor constructed by source/drain features 322N/322P and the substrate 306). If the distance D1 between the dielectric layers 326 in the X-direction is too small (the distance D1 is less than about 5 nm), there may be a risk of fabrication issue (e.g., collapse) occurring during the formation of the semiconductor device 300. If the distance D1 between the dielectric layers 326 in the X-direction is too large (the distance D1 is greater than about 20 nm), the leakage current cannot be significantly reduced.

The dielectric layers 326 may include a dielectric material and be selected from a group consisting of silicon nitride ($Si_3N_4$), silicon oxide ($SiO_2$), silicon carbide (SiC), silicon oxycarbide (SiOC), silicon oxynitride (SiON), silicon oxycarbon nitride (SiOCN), air gap, or a combination thereof. In some embodiments, the dielectric layers 326 and the inner spacers 320 are made of different materials.

Referring to FIGS. 6B to 6D, the semiconductor device 300 further include gate top dielectric layers 328 over the gate dielectric layers 312, the gate electrode layers 314, and the nanostructures 310, and the gate spacers 318. The gate top dielectric layer 328 is used for contact etch protection layer. The material of gate top dielectric layer 328 is selected from a group consisting of oxide, SiOC, SiON, SiOCN, nitride base dielectric, metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), combinations thereof, or other suitable material.

Referring to FIGS. 6B, 6C, and 6E, the semiconductor device 300 further includes silicide features 330 over and in contact with the source/drain features 322N and 322P. In some embodiment, the silicide feature 330 is between the adjacent two gate structures 304 in the X-direction. The silicide features 330 may include titanium silicide (TiSi), nickel silicide (NiSi), tungsten silicide (WSi), nickel-platinum silicide (NiPtSi), nickel-platinum-germanium silicide (NiPtGeSi), nickel-germanium silicide (NiGeSi), ytterbium silicide (YbSi), platinum silicide (PtSi), iridium silicide (IrSi), erbium silicide (ErSi), cobalt silicide (CoSi), or other suitable compounds. In some embodiments, the silicide features 330 over the source/drain features 322N and the silicide features 330 over the source/drain features 322P have different material. For example, the silicide features 330 over the source/drain features 322N include TiSi and the silicide features 330 over the source/drain features 322P include silicide material selected from a group consist of PtSi, NiSi, CoSi, or MoSi.

Referring to FIGS. 6A, 6B, 6C, and 6E, the semiconductor device 300 further includes source/drain contacts 332-1 to 332-6 for the N-type transistor NT1, the N-type transistor NT2, the P-type transistor PT1, and the P-type transistor PT2 of the semiconductor device 300 (may be collectively referred to as the source/drain contacts 332), over and in contact with the silicide features 330, and over and electrically connected to the silicide features 330 and the source/drain features 322N and 322P. The source/drain contacts 332 extend lengthwise the Y-direction. In some embodiments, some of the source/drain contacts 332 are in contact with the gate end dielectric structures 316. For example, as shown in FIGS. 6A, the source/drain contact 332-1, 332-4, and 332-6 are in contact with the gate end dielectric structures 316 in the X-direction.

In some embodiments, the source/drain contacts 332 are self-aligned source/drain contacts. This means that the source/drain contacts 332 are formed by using the gate spacers 318 as masks. Therefore, the source/drain contacts 332 are in direct contact with the gate spacers 318, as shown in FIGS. 6B and 6C. In some embodiments, the gate spacers 318 are trimmed due to the gate spacers 318 serving as the mask for forming the source/drain contacts 332. Therefore, the thickness of the gate spacers 318 in the X-direction is less than the thickness of the inner spacers 320 in the X-direction, as discussed above. In some embodiments, top surfaces of the source/drain contacts 332 are substantially level with top surfaces of the gate top dielectric layers 328 when the source/drain contacts 332 are self-aligned source/drain contacts.

In some embodiments, the source/drain contacts 332 are non-self-aligned source/drain contacts. This means that the source/drain contacts 332 are not formed by using the gate spacers 318 as masks. In these embodiments, the source/drain contacts 332 may be separated from the gate spacers 318 by a dielectric layer (e.g., an inter-layer dielectric (ILD) layer 334). As such, the contact-to-gate parasitic capacitance is reduced. Furthermore, in these embodiments, the thickness of the gate spacers 318 in the X-direction and the thickness of the inner spacers 320 in the X-direction are the same. In other embodiments, the thickness of the gate spacers 318 in the X-direction is greater than the thickness of the inner spacers 320 in the X-direction. In some embodiments, the top surfaces of the source/drain contacts 332 are higher than the top surfaces of the gate top dielectric layers 328 when the source/drain contacts 332 are non-self-aligned source/drain contacts.

As shown in FIG. 6A, in the top view, the source/drain contact 332-1 is adjacent to the gate structure 304-1 (or is adjacent to the N-type transistor NT1) in the X-direction; the source/drain contact 332-2 is between the gate structures 304-1 and 304-2 (or between the N-type transistors NT1 and NT2) in the X-direction; the source/drain contact 332-3 is adjacent to the gate structure 304-2 (or is adjacent to the N-type transistor NT2) in the X-direction; the source/drain contact 332-4 is adjacent to the gate structure 304-1 (or is adjacent to the P-type transistor PT1) in the X-direction; the source/drain contact 332-5 is between the gate structures 304-1 and 304-2 (or between the P-type transistors PT1 and PT2) in the X-direction; and the source/drain contact 332-6 is adjacent to the gate structure 304-2 (or is adjacent to the P-type transistor PT2) in the X-direction.

As discussed above, each of the source/drain contacts 332 is over and electrically connected to the respective source/drain features 322N/322P. Specifically, as shown in FIGS. 6A, 6B, 6C, and 6E, the source/drain contact 332-1 is over and electrically connected to the source/drain feature 322N of the N-type transistor NT1; the source/drain contact 332-2 is over and electrically connected to the source/drain feature 322N shared by the N-type transistors NT1 and NT2; the source/drain contact 332-3 is over and electrically connected to the source/drain feature 322N of the N-type transistor NT2; the source/drain contact 332-4 is over and electrically connected to the source/drain feature 322P of the P-type transistor PT1; the source/drain contact 332-5 is over and electrically connected to the source/drain feature 322P shared by the P-type transistors PT1 and PT2; and the source/drain contact 332-6 is over and electrically connected to the source/drain feature 322P of the P-type transistor PT2.

The source/drain contacts 332 may each include a conductive material such as Al, Cu, W, Co, Ti, Ta, Ru, Rh, Ir, Pt, Mo, TIN, TiAl, TiAlN, TaN, TaC, combinations of these, or the like, although any suitable material may be deposited using a deposition process such as sputtering, CVD, electroplating, electroless plating, or the like. In some embodiments, the source/drain contacts 332 may each include single conductive material layer or multiple conductive layers.

Referring to FIGS. 6B to 6E, the semiconductor device 300 further includes an inter-layer dielectric (ILD) layer 334, and an inter-metal dielectric (IMD) layer 336. The ILD layer 334 is over the substrate 306, the isolation feature 308, the gate structures 304, the source/drain contacts 332, and the gate top dielectric layers 328, between the source/drain features 322N/322P, and between the source/drain contacts 332. The IMD layer 336 is over the ILD layer 334, the gate structures 304, the source/drain contacts 332, and the gate top dielectric layers 328.

The ILD layer 334 and the IMD layer 336 include a dielectric material including, for example, silicon oxide, silicon nitride, silicon oxynitride, TEOS-formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the ILD layer 334 and the IMD layer 336 are a dielectric layer that includes a low-k dielectric material (generally referred to as a low-k dielectric layer). The ILD layer 334 and the IMD layer 336 may include a multilayer structure having multiple dielectric materials.

Referring to FIGS. 4B to 4F, the semiconductor device 300 further includes gate vias VG, vias VD, and metal conductors MN, VM1, and VM2 in a metal layer ML1. The gate vias VG and vias VD are disposed in the ILD layer 334 and the metal conductors MN, VM1, and VM2 in the metal layer ML1 are disposed in the IMD layer 336. The metal conductors MN, VM1, and VM2 are over and electrically connected to respective gate structures 304 and respective source/drain contacts 332. The gate vias VG are over and in contact with the gate structures 304 and electrically connect the gate structures 304 to respective metal conductors MN, VM1, and VM2. The vias VD are over and in contact with the source/drain contacts 332 and electrically connect the source/drain contacts 332 to respective metal conductors MN, VM1, and VM2. The materials of the gate vias VG, the vias VD, and the metal conductors MN, VM1, and VM2 are selected from a group consisting of titanium (Ti), titanium nitride (TiN), tantalum (Ta), tantalum nitride (TaN), titanium aluminum nitride (TiAlN), tungsten nitride (WN), tungsten (W), cobalt (Co), molybdenum (Mo), ruthenium (Ru), platinum (Pt), aluminum (Al), copper (Cu), other conductive materials, or a combination thereof.

As shown in FIG. 6A to 6E, the metal conductors MN, VM1, and VM2 extend in the X-direction and arranged in the Y-direction. The metal layers MN are disposed between the metal conductors VM1 and VM2 in the Y-direction in the top view, as shown in FIG. 6A. The metal layers VM1 and VM2 are disposed overlap (or across) the gate end dielectric structures 316 in the top view, as shown in FIG. 6A. In some embodiments, a width of the metal layers VM1 and VM2 in the Y-direction is greater than a width of the metal layers MN in the Y-direction.

The metal conductors MN, VM1, and VM2 in the metal layer ML1 are respectively connected to respective gate structures 304 and respective source/drain contacts 332 through respective gate vias VG and VD. In some embodiments, the gate vias VG, VD and metal conductors MN are used to construct connections of the transistors in the semiconductor device 300 to form the circuit cells or the SRAM cell discussed above. In some embodiments, the vias VD and metal layers VM1 and VM2 are connected to power sources or voltage sources (not shown) to provide voltage (VDD or VSS) to the transistors in the semiconductor device 300. In some embodiments, the metal layers VM1 is connected to a VSS power source (not shown) and the metal layer VM2 is connected to a VDD power source (not shown). Therefore, the metal layer VM2 may be also referred to as the (VDD) power metal line, the (VDD) power line, or (VDD) power conductor, and the metal layers VM1 may be also referred to as the (VSS) power metal line, the (VSS) power line, or (VSS) power conductor.

As shown in FIG. 6A, the vias VD which electrically connected to the metal layer VM1 and VM2 may have a larger via size than other vias VD and gate vias VG, in accordance with some embodiments. Therefore, due to small resistances of larger size vias VD, the transistors in the semiconductor device 300 may be provided with voltage (or power) with low voltage drop, thereby improving the performance of the semiconductor device 300.

Figure 7B:
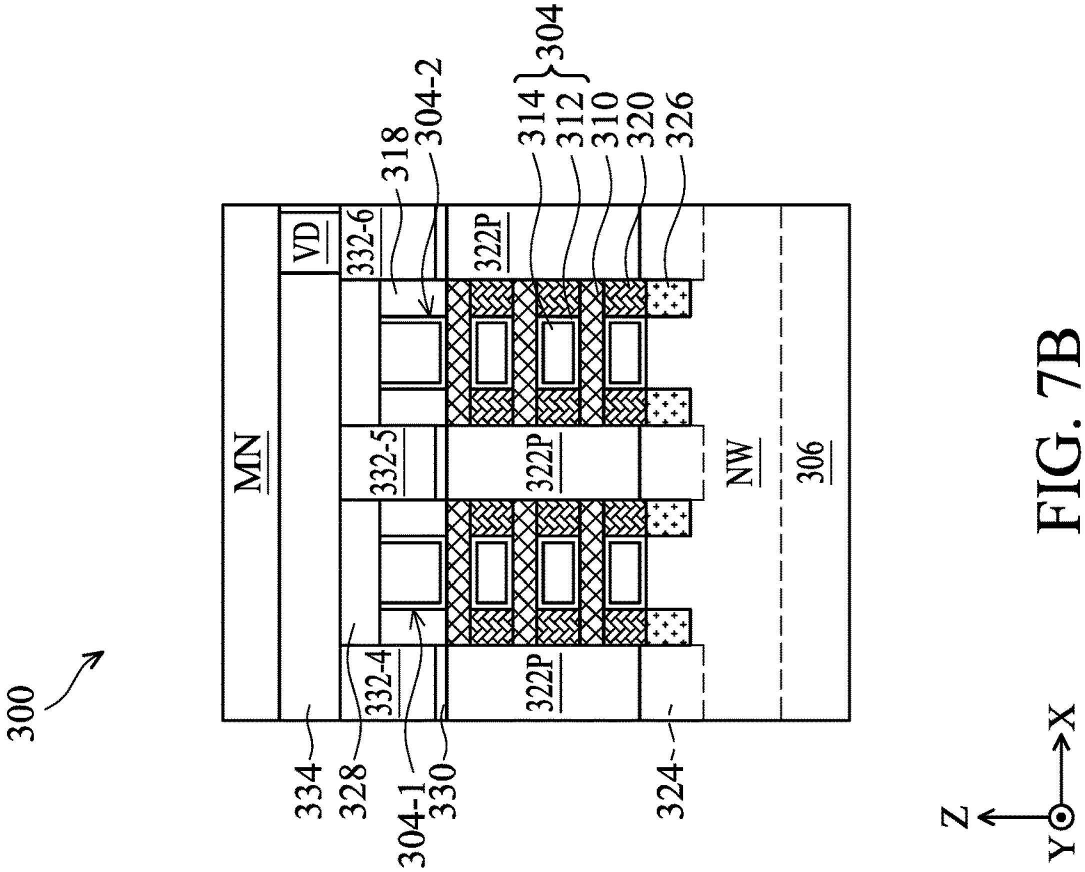
FIGS. 7A and 7B illustrate X-Z cross-sectional views of the semiconductor device along the lines B-B' and C-C' of FIG. 6A, respectively, in accordance with some alternative embodiments of the present disclosure.
Figure 7A:
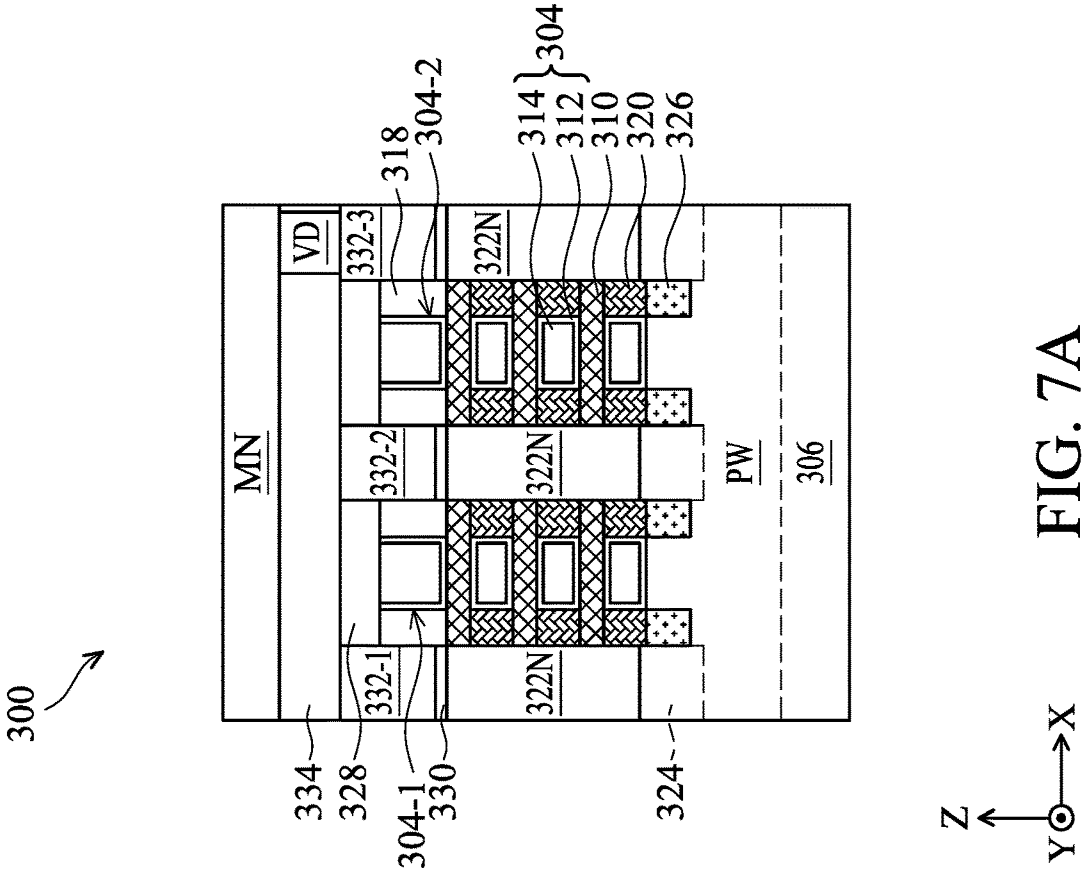

FIGS. 7A and 7B illustrate X-Z cross-sectional views of the semiconductor device 300 along the lines B-B' and C-C' of FIG. 6A, respectively, in accordance with some alternative embodiments of the present disclosure. Referring back to FIGS. 6B and 6C, the distance D1 between the dielectric layers 326 in the X-direction is greater than the length (gate length) L1 of the gate structures 304 in the X-direction, and the width of the dielectric layers 326 in the X-direction is less than the width of the inner spacers 320 in the X-direction. In some alternative embodiments, as shown in FIGS. 7A and 7B, the distance D1 between the dielectric layers 326 in the X-direction and the length (gate length) L1 of the gate structures 304 in the X-direction are substantially the same. Furthermore, the width of the dielectric layers 326 in the X-direction and the width of the inner spacers 320 in the X-direction are substantially the same. Furthermore, the sidewalls of the dielectric layers 326 in contact with the silicon layers 324 are aligned with the sidewalls of the nanostructures 310 and the inner spaces 320 in the Y-direction, and the sidewalls of the dielectric layers 326 in contact with the substrate 306 are aligned with the sidewalls of the gate structures 304 and the inner spaces 320 in the Y-direction.

Figure 8B:
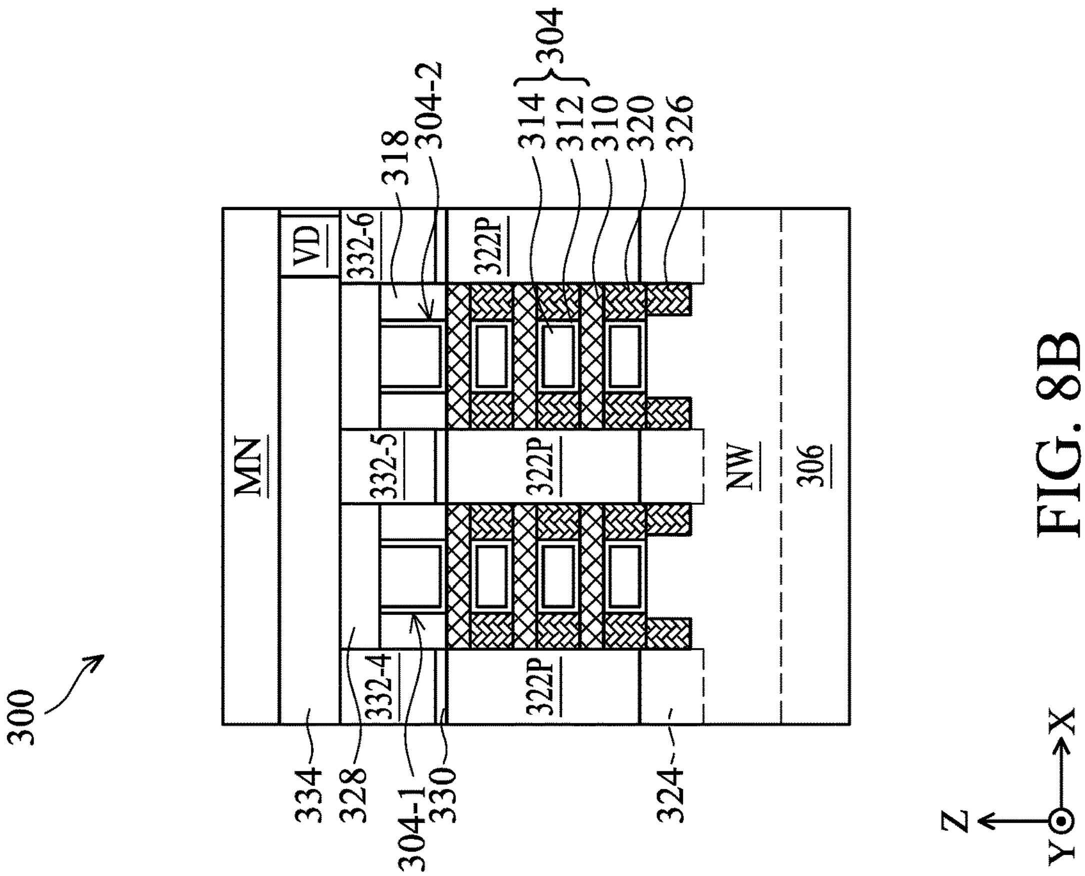
FIGS. 8A and 8B illustrate X-Z cross-sectional views of the semiconductor device along the lines B-B' and C-C' of FIG. 6A, respectively, in accordance with some alternative embodiments of the present disclosure.
Figure 8A:
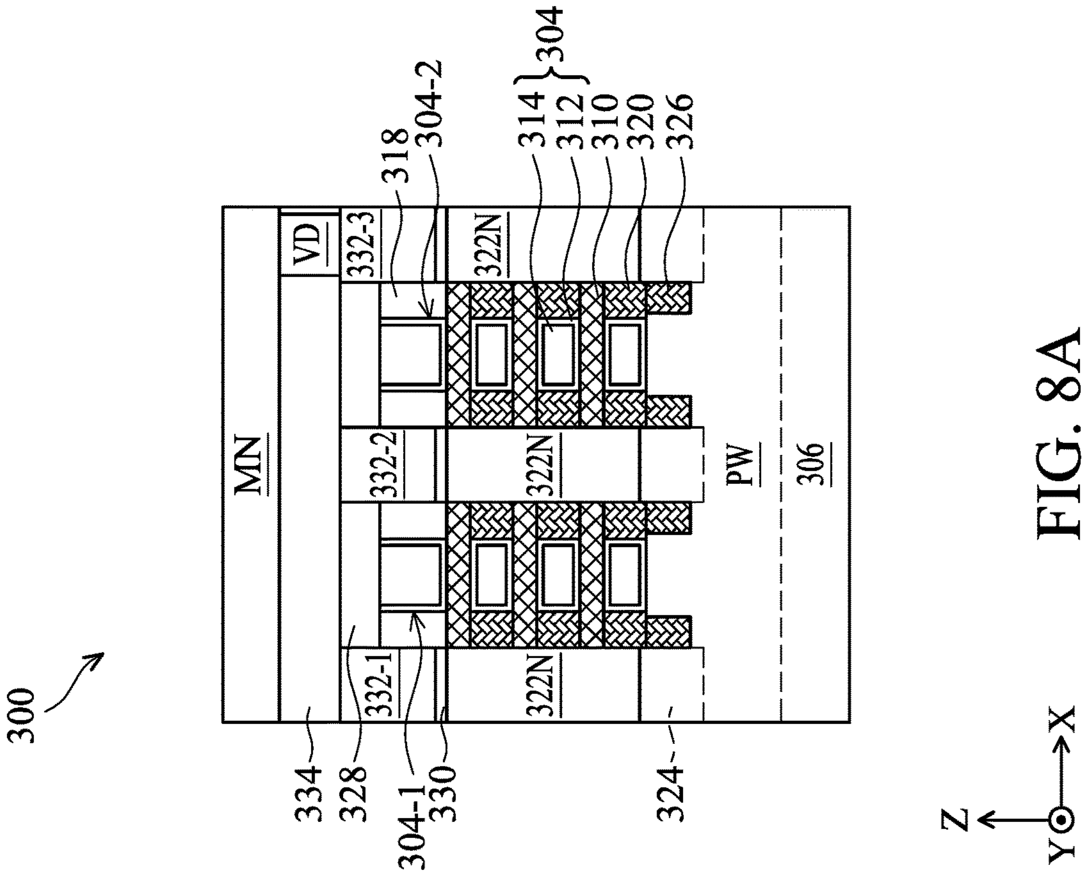

FIGS. 8A and 8B illustrate X-Z cross-sectional views of the semiconductor device 300 along the lines B-B' and C-C' of FIG. 6A, respectively, in accordance with some alternative embodiments of the present disclosure. Referring back to FIGS. 6B and 6C, the dielectric layers 326 and the inner spacers 320 are made of different materials, as discussed above. In some alternative embodiments, as shown in FIGS. 8A and 8B, the dielectric layers 326 and the inner spacers 320 are made of the same material. In these embodiments, the dielectric layers 326 and the inner spacers 320 may be formed at the same process. In some aspects, the dielectric layers 326 may be considered a portion of the inner spacers 320. More specifically, the dielectric layers 326 shown in FIGS. 8A and 8B may be considered as the bottommost inner spacers 320 extending into the substrate 306.

Figure 9B:
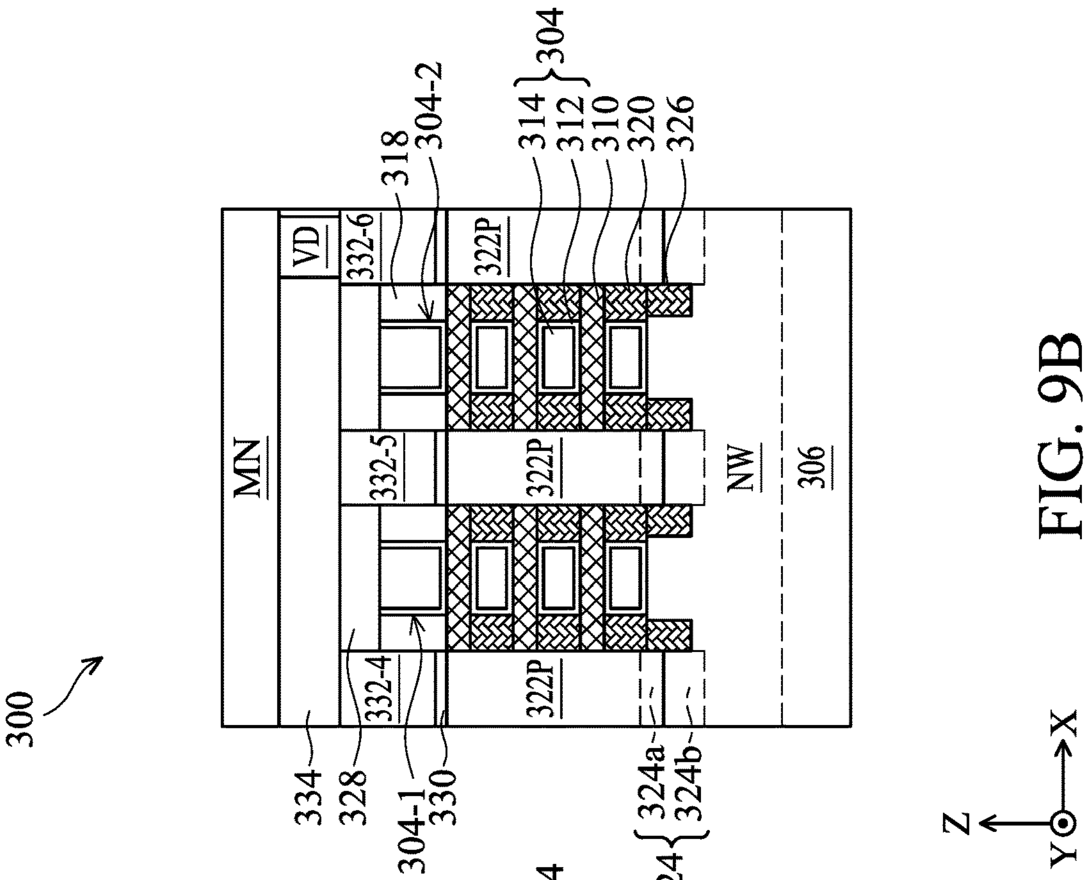
FIGS. 9A and 9B illustrate X-Z cross-sectional views of the semiconductor device along the lines B-B' and C-C' of FIG. 6A, respectively, in accordance with some alternative embodiments of the present disclosure.
Figure 9A:
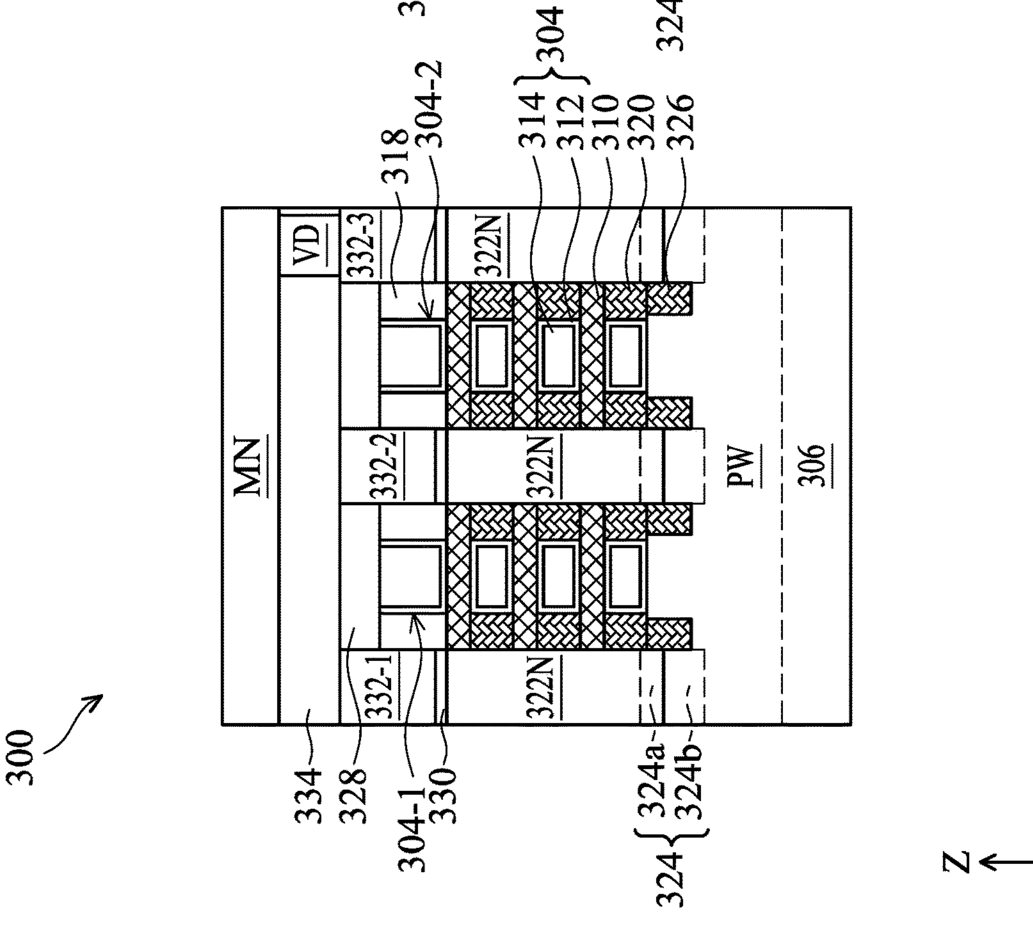

FIGS. 9A and 9B illustrate X-Z cross-sectional views of the semiconductor device 300 along the lines B-B' and C-C' of FIG. 6A, respectively, in accordance with some alternative embodiments of the present disclosure. Referring back to FIGS. 6B and 6C, the silicon layers 324 are doped with dopants as the well in the substrate 306, as discussed above. In some alternative embodiments, as shown in FIGS. 9A and 9B, each of the silicon layers 324 includes a (upper) portion 324*a* doped with dopants as the source/drain features 322N/322P and a (lower) portion 324*b* doped with dopants as the well in the substrate 306.

More specifically, the portions 324*a* of the silicon layers 324 shown in FIG. 9A in contact with the source/drain features 322N have the same dopants (N-type dopants) as the source/drain features 322N, and the portions 324*b* of the silicon layers 324 shown in FIG. 9A in contact with the P-type well PW of the substrate 306 have the same dopants (P-type dopants) as in the P-type well PW of the substrate 306. The portions 324*a* of the silicon layers 324 shown in FIG. 9B in contact with the source/drain features 322N have the same dopants (P-type dopants) as the source/drain features 322P, and the portions 324*b* of the silicon layers 324 shown in FIG. 9B in contact with the N-type well NW of the substrate 306 have the same dopants (N-type dopants) as in the N-type well NW of the substrate 306. In other words, the portions 324*a* and the portions 324*b* of the silicon layers 324 have different dopants. Furthermore, in some aspects, the portions 324*a* have different dopants than the well of the substrate 306, and the portions 324*b* have different dopants than the source/drain features 322N/322P.

Similarly, in these embodiments, the silicon layers 324 are also undoped when they are first formed. The dopants in the portions 324*a* of the silicon layers 324 come from the diffusion of the dopants in the source/drain features 322N/322P, and the dopants in the portions 324*b* of the silicon layers 324 come from the diffusion of the dopants in the wells of the substrate 306. In some embodiments, the portions 324*a* of the silicon layers 324 and the source/drain features 322N/322P are merged together and the interface between them are not obvious, and the portions 324*b* of the silicon layers 324 and the well in the substrate 306 are merged together and the interface between them are not obvious. Therefore, the portions 324*a* of the silicon layers 324 may be considered portions of the source/drain features 322N/322P and the portions 324*b* of the silicon layers 324 may be considered portions of the well in the substrate 306 in the resultant device, in accordance with some embodiments.

Figure 10B:
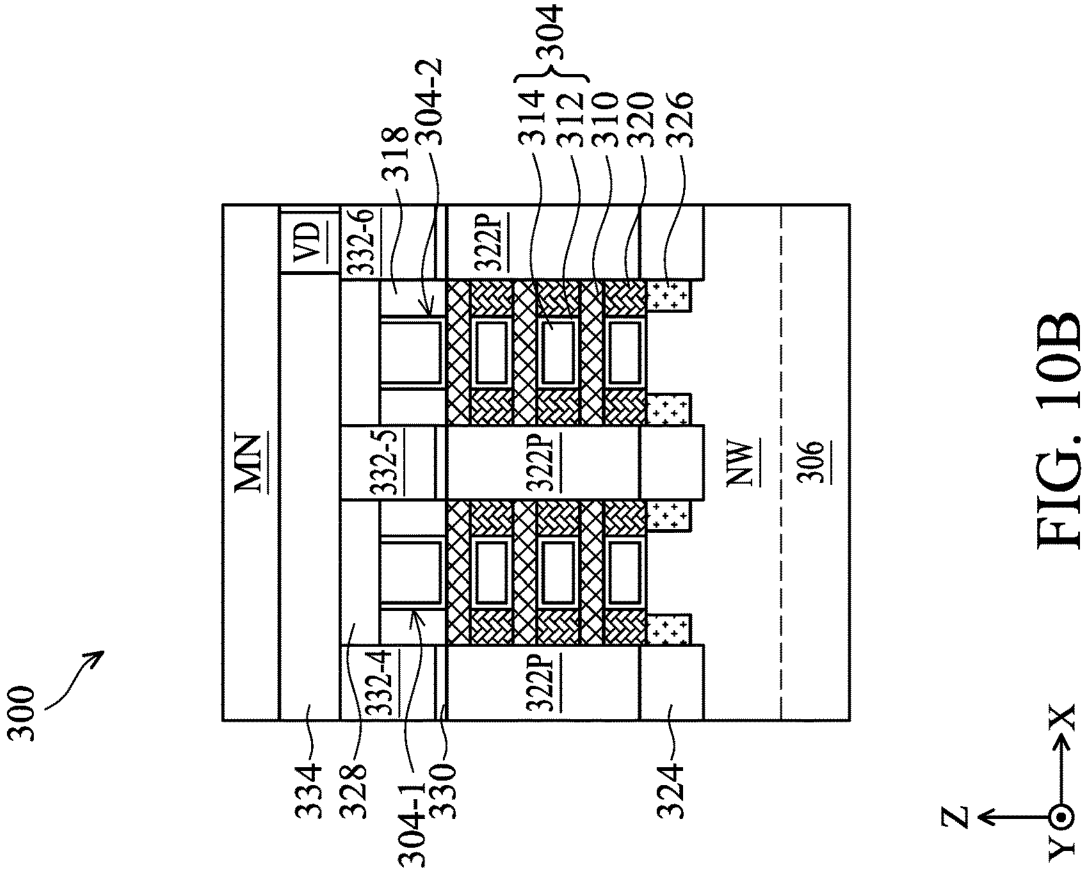
FIGS. 10A and 10B illustrate X-Z cross-sectional views of the semiconductor device along the lines B-B' and C-C' of FIG. 6A, respectively, in accordance with some alternative embodiments of the present disclosure.
Figure 10A:
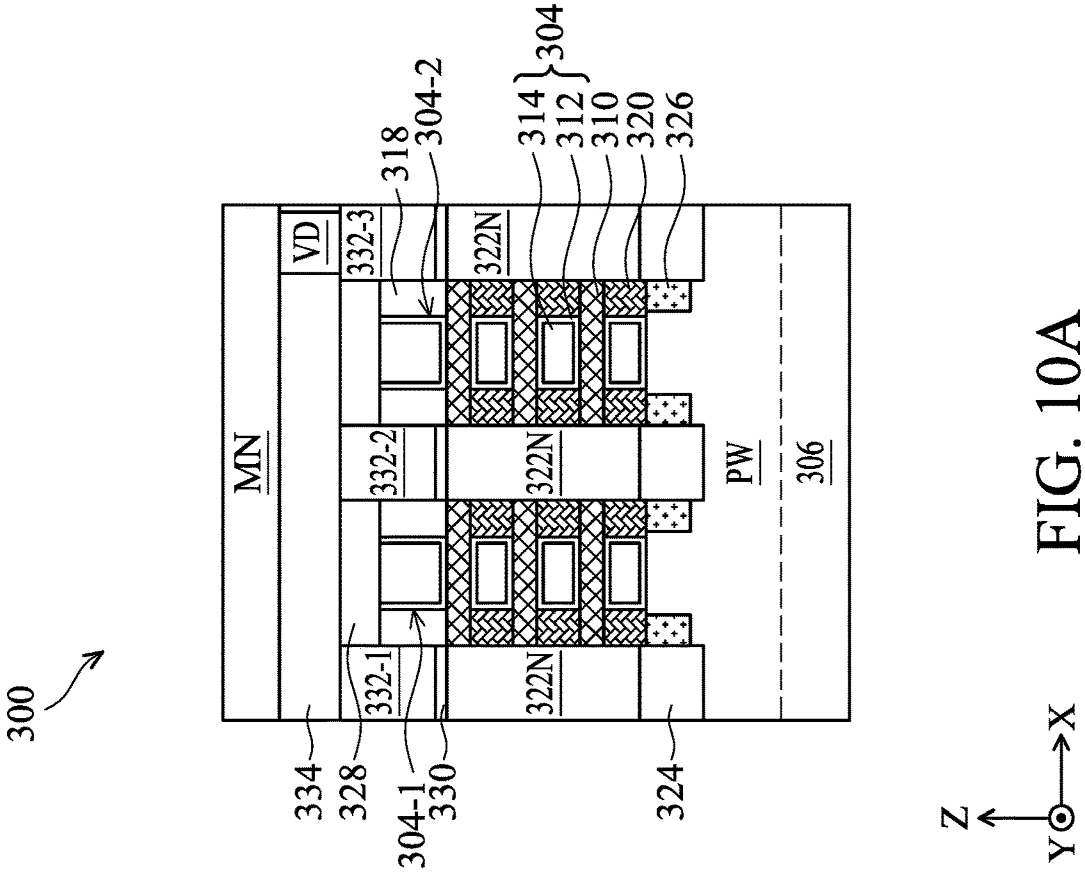
Figure 11A:
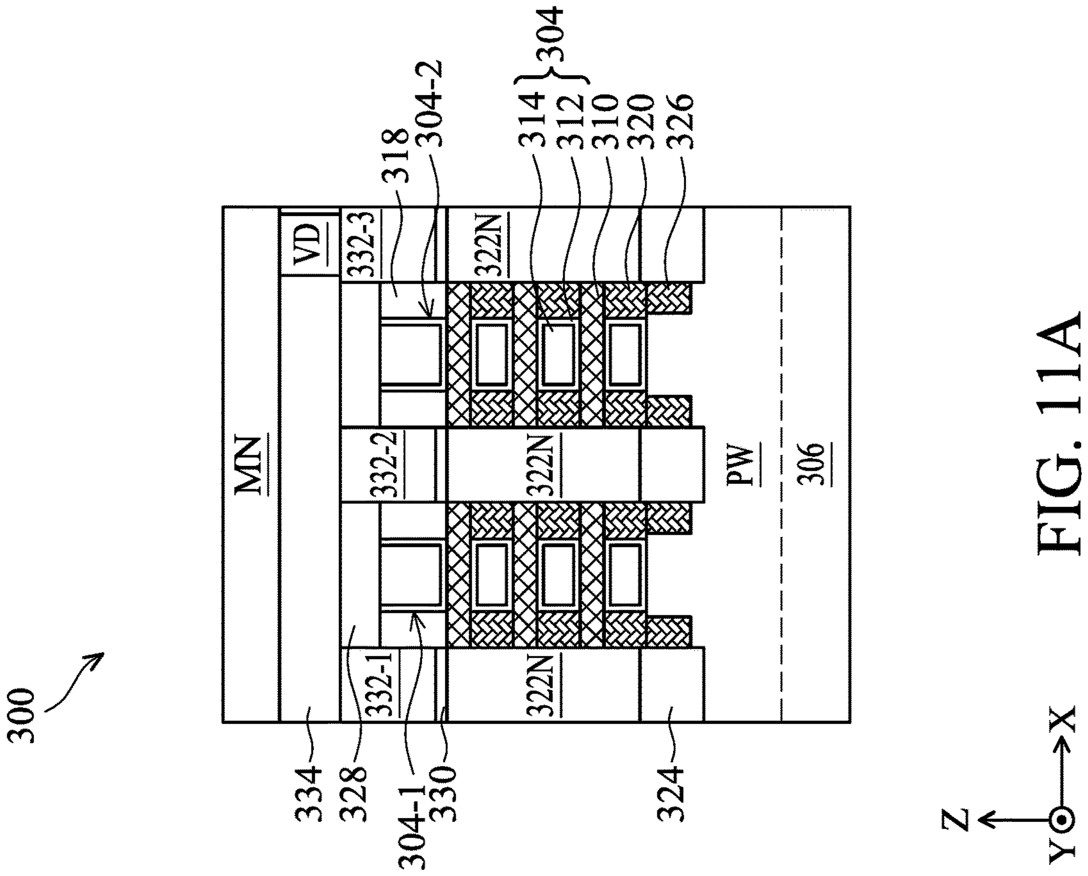
FIGS. 11A and 11B illustrate X-Z cross-sectional views of the semiconductor device along the lines B-B' and C-C' of FIG. 6A, respectively, in accordance with some alternative embodiments of the present disclosure.
Figure 11B:
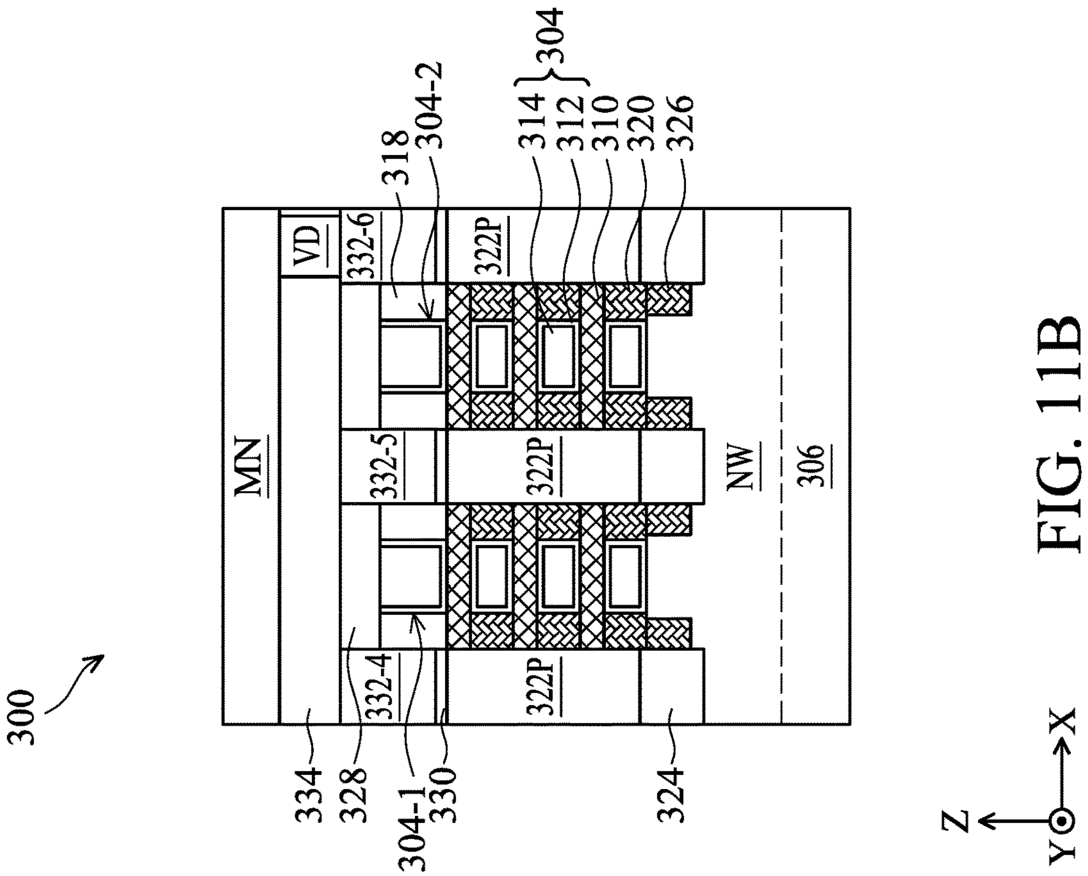
Figure 12:
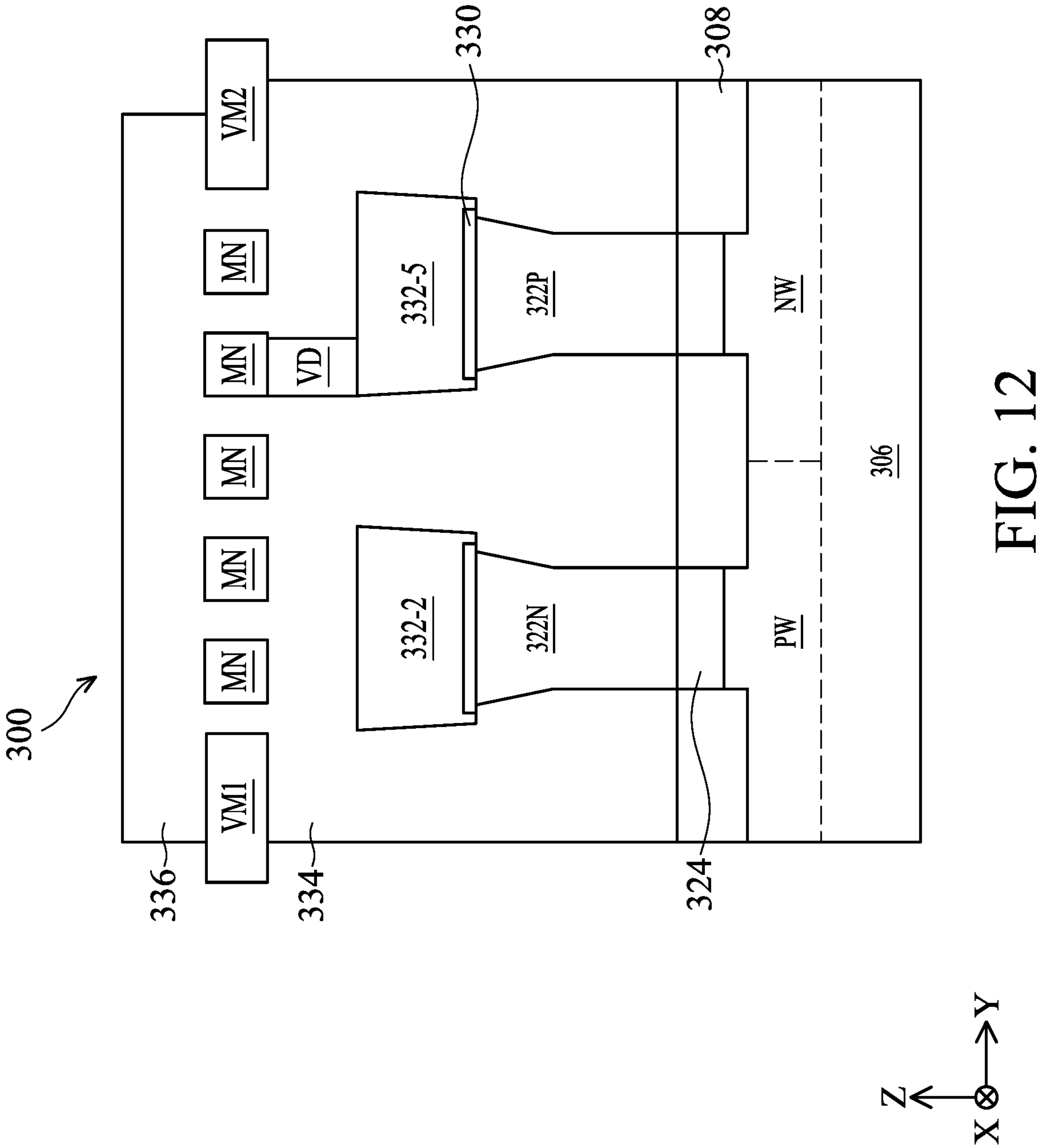
FIG. 12 illustrates a Y-Z cross-sectional view of the semiconductor device along the line E-E' of FIG. 6A, respectively, in accordance with some alternative embodiments of the present disclosure.

FIGS. 10A and 10B illustrate X-Z cross-sectional views of the semiconductor device 300 along the lines B-B' and C-C' of FIG. 6A, respectively, in accordance with some alternative embodiments of the present disclosure. FIGS. 11A and 11B illustrate X-Z cross-sectional views of the semiconductor device 300 along the lines B-B' and C-C' of FIG. 6A, respectively, in accordance with some alternative embodiments of the present disclosure. FIG. 12 illustrates a Y-Z cross-sectional view of the semiconductor device 300 along the line E-E' of FIG. 6A, respectively, in accordance with some alternative embodiments of the present disclosure. The semiconductor device 300 shown in FIGS. 10A and 10B is similar to that shown in FIGS. 6B and 6C discussed above, the semiconductor device 300 shown in FIGS. 11A and 11B is similar to that shown in FIGS. 8A and 8B discussed above, and the semiconductor device 300 shown in FIG. 12 is similar to that shown in FIG. 6E discussed above, except that the silicon layers 324 are undoped in the resultant device. This means no diffusion of the dopants in the source/drain features 322N/322P and in the wells of the substrate 306. In these embodiments, the silicon layers 324 are also referred to as undoped silicon layers 324.

Figure 13:
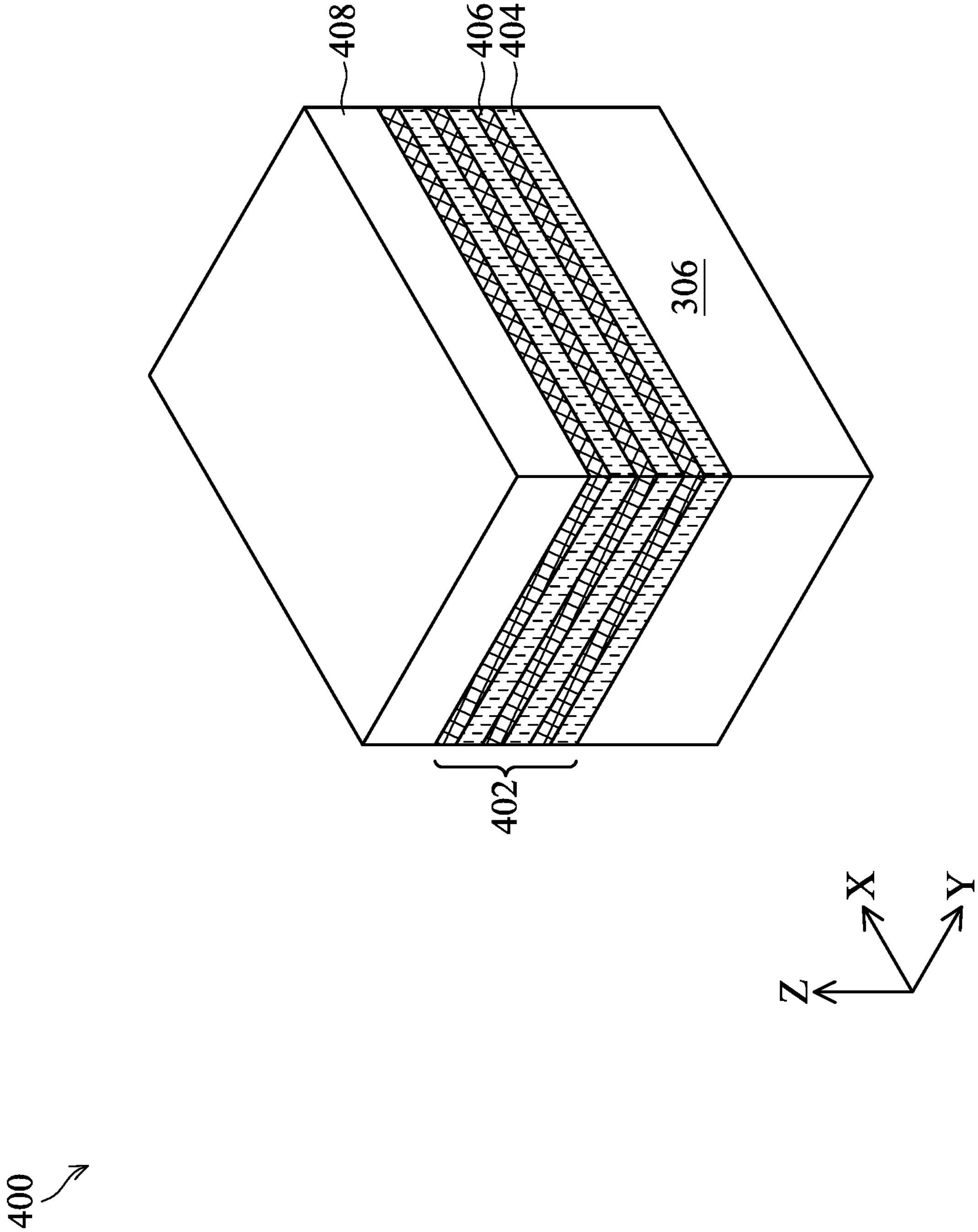
FIG. 13 is a perspective view of a workpiece at a fabrication stage for the semiconductor device, in accordance with some embodiments of the present disclosure.

FIG. 13 is a perspective view of a workpiece 400 at a fabrication stage for the semiconductor device 300, in accordance with some embodiments of the present disclosure. FIGS. 14A to 21A illustrate top views (or layouts) of the workpiece 400 at various fabrication stages for the semiconductor device 300, in accordance with some embodiments of the present disclosure. FIGS. 14B to 21B illustrate Y-Z cross-sectional views of the workpiece 400 at various fabrication stage along lines F-F' of FIGS. 14A to 21A, respectively, in accordance with some embodiments of the present disclosure. FIGS. 14C to 21C illustrate X-Z cross-sectional views of the workpiece 400 at various fabrication stage along lines G-G' of FIGS. 14A to 21A, respectively, in accordance with some embodiments of the present disclosure.

Referring to FIG. 6, a stack 402 is formed over the substrate 306. In some embodiments, the substrate 306 may include one or more well regions, such as N-type well regions (e.g., the N-type well NW discussed above) doped with an n-type dopant (i.e., phosphorus (P) or arsenic (As)) or p-type well regions (e.g., the P-type well PW discussed above) doped with a p-type dopant (i.e., boron (B)), for forming different types of devices. The doping the n-type wells and the p-type wells may be formed using ion implantation or thermal diffusion.

The stack 402 includes semiconductor layers 404 and 406, and the semiconductor layers 404 and 406 are alternatingly stacked in the Z-direction. The semiconductor layers 404 and the semiconductor layers 406 may have different semiconductor compositions. In some embodiments, semiconductor layers 404 are formed of silicon germanium (SiGe) and the semiconductor layers 406 are formed of silicon (Si). In these embodiments, the additional germanium content in the semiconductor layers 404 allow selective removal or recess of the semiconductor layers 404 without substantial damages to the semiconductor layers 406, so that the semiconductor layers 404 are also referred to as sacrificial layers. In some embodiments, the semiconductor layers 404 and 406 are epitaxially grown over (on) the substrate 306 using a deposition technique such as epitaxial growth, vapor-phase epitaxy (VPE), molecular beam epitaxy (MBE), although other deposition processes, such as chemical vapor deposition (CVD), low pressure CVD (LPCVD), atomic layer deposition (ALD), ultrahigh vacuum CVD (UHVCVD), reduced pressure CVD (RPCVD), a combination thereof, or the like, may also be utilized. The semiconductor layers 404 and the semiconductor layers 406 are deposited alternatingly, one-after-another, to form the stack 402.

It should be noted that three (3) layers of the semiconductor layers 404 and three (3) layers of the semiconductor layers 406 are alternately and vertically arranged (or stacked) as shown in FIG. 13, which are for illustrative purposes only and not intended to be limiting beyond what is specifically recited in the claims. The number of layers depends on the desired number of channels members for the semiconductor device. In some embodiments, there may be from 2 to 10 semiconductor layers 404 alternating with 2 to 10 semiconductor layers 406 in the stack 402.

For patterning purposes, the workpiece 400 may also include a hard mask layer 408 over the stack 402. The hard mask layer 408 may be a single layer or a multi-layer. In some embodiments, the hard mask layer 408 is a single layer and includes a silicon germanium layer. In some embodiments, the hard mask layer 408 is a multi-layer and includes a silicon nitride layer and a silicon oxide layer over the silicon nitride layer. In some other embodiments, the hard mask layer 408 is a multi-layer and includes a silicon germanium layer and a silicon layer over the silicon germanium layer.

Figure 14A:
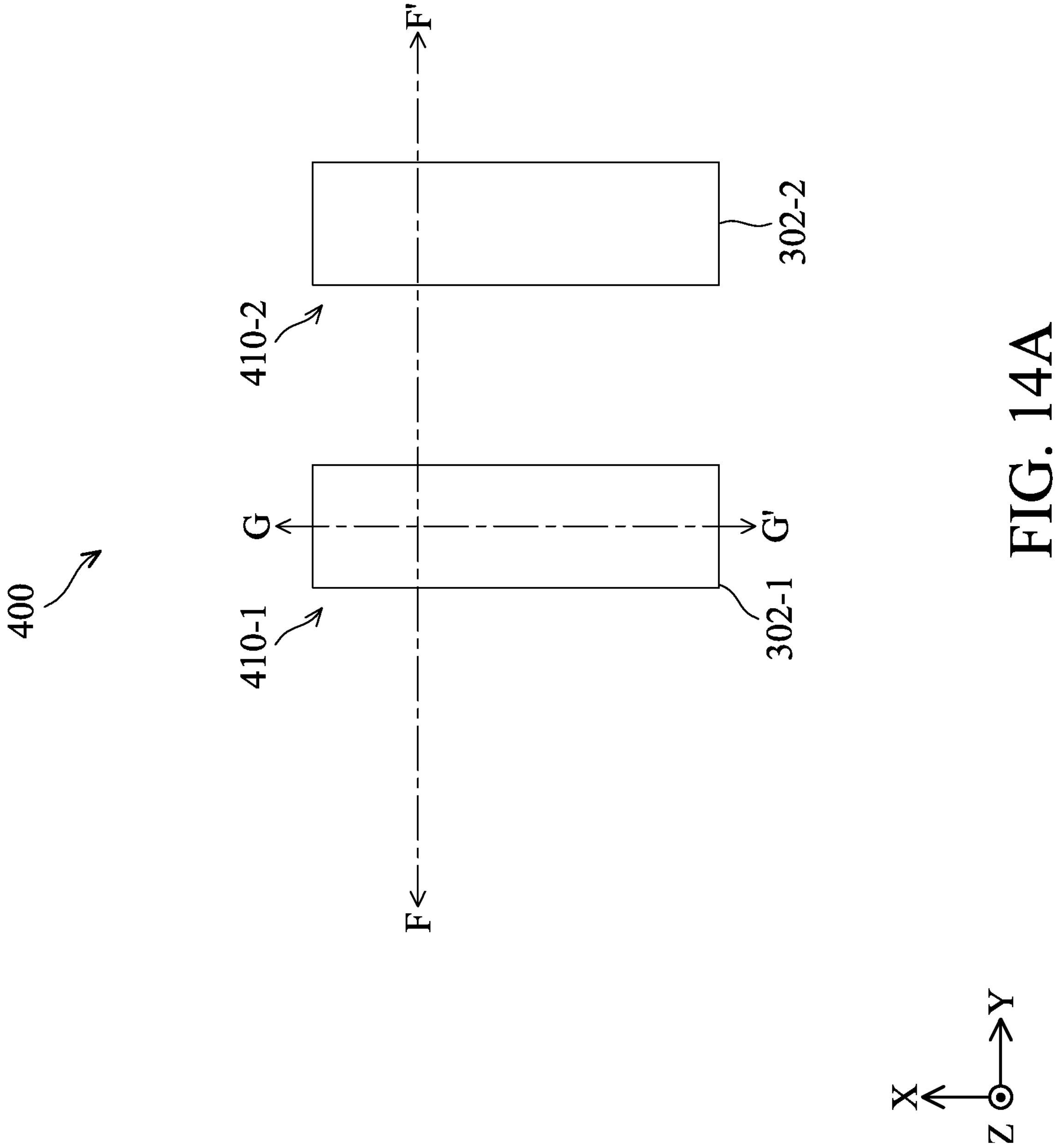
FIGS. 14A, 15A, 16A, 17A, 18A, 19A, 20A, and 21A illustrate top views (or layouts) of the workpiece at various fabrication stages for the semiconductor device, in accordance with some embodiments of the present disclosure.
Figure 14C:
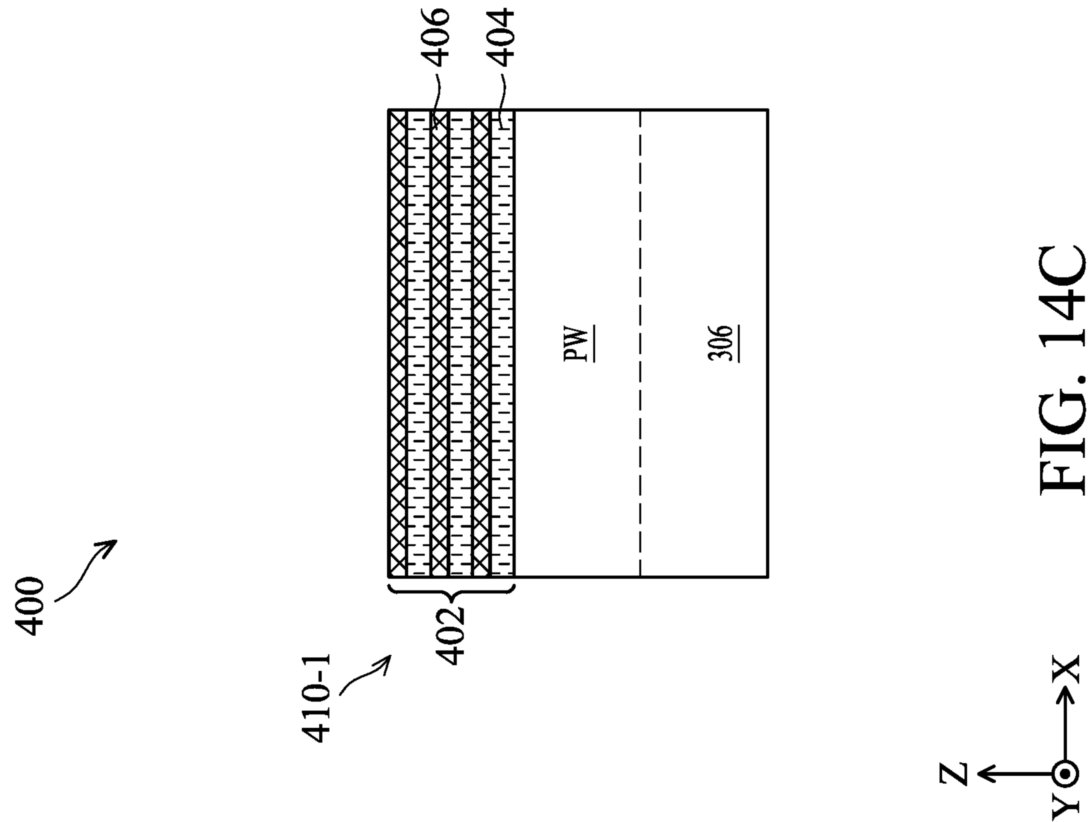
FIGS. 14C, 15C, 16C, 17C, 18C, 19C, 20C, and 21C illustrate X-Z cross-sectional views of the workpiece at various fabrication stage along lines G-G' of FIGS. 14A to 21A, respectively, in accordance with some embodiments of the present disclosure.
Figure 14B:
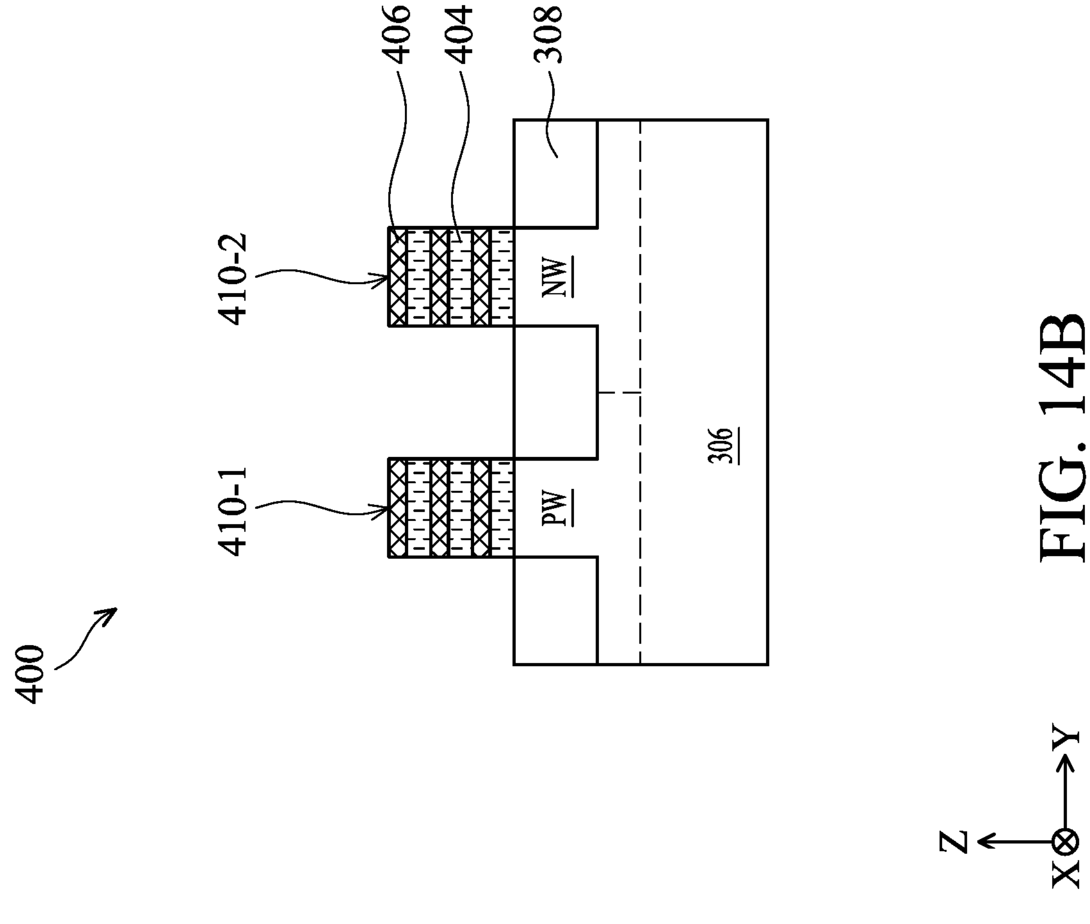
FIGS. 14B, 15B, 16B, 17B, 18B, 19B, 20B, and 21B illustrate Y-Z cross-sectional views of the workpiece at various fabrication stage along lines F-F' of FIGS. 14A to 21A, respectively, in accordance with some embodiments of the present disclosure.

Referring to FIGS. 14A to 14C, after the formation of the stack 402, the active areas 302-1 and 302-2 are defined on the workpiece 400 for patterning the stack 402 to form fins 410-1 and 410-2 (may be collectively referred to as the fins 410) over the substrate 306. In some embodiments, after the formation of the fins 410, the hard mask layer 408 is removed. As shown in FIGS. 14A to 14C, the fins 410-1 and 410-2 extend in the X-direction. Each of the fins 410-1 and 410-2 includes semiconductor layers 404 and 406 alternating stacked in the Z-direction.

Still referring to FIGS. 7A to 7G, after the definition of the active areas 302 and the formation of the fins 410, the isolation feature 308 discussed above is formed over the substrate 306. The isolation feature 308 is formed between the active areas 302. In some embodiments, a dielectric material for the isolation feature 308 is first deposited over the substrate 306. Specifically, the dielectric material is deposited and formed over the fins 410 and the substrate 306 to cover the fins 410 and the substrate 306. In some aspects, the dielectric material is formed to wrap around the fins 410. The deposited dielectric material is then thinned and planarized, for example by a chemical mechanical polishing (CMP) process. The planarized dielectric material is further recessed by a dry etching process, a wet etching process, and/or a combination thereof to form the isolation feature 308. As shown in FIG. 14B, fins 410 rise above the isolation features 308. In some embodiments, before the formation of the isolation feature 308, a liner layer may be conformally deposited over the substrate 306 using ALD or CVD.

Figure 15A:
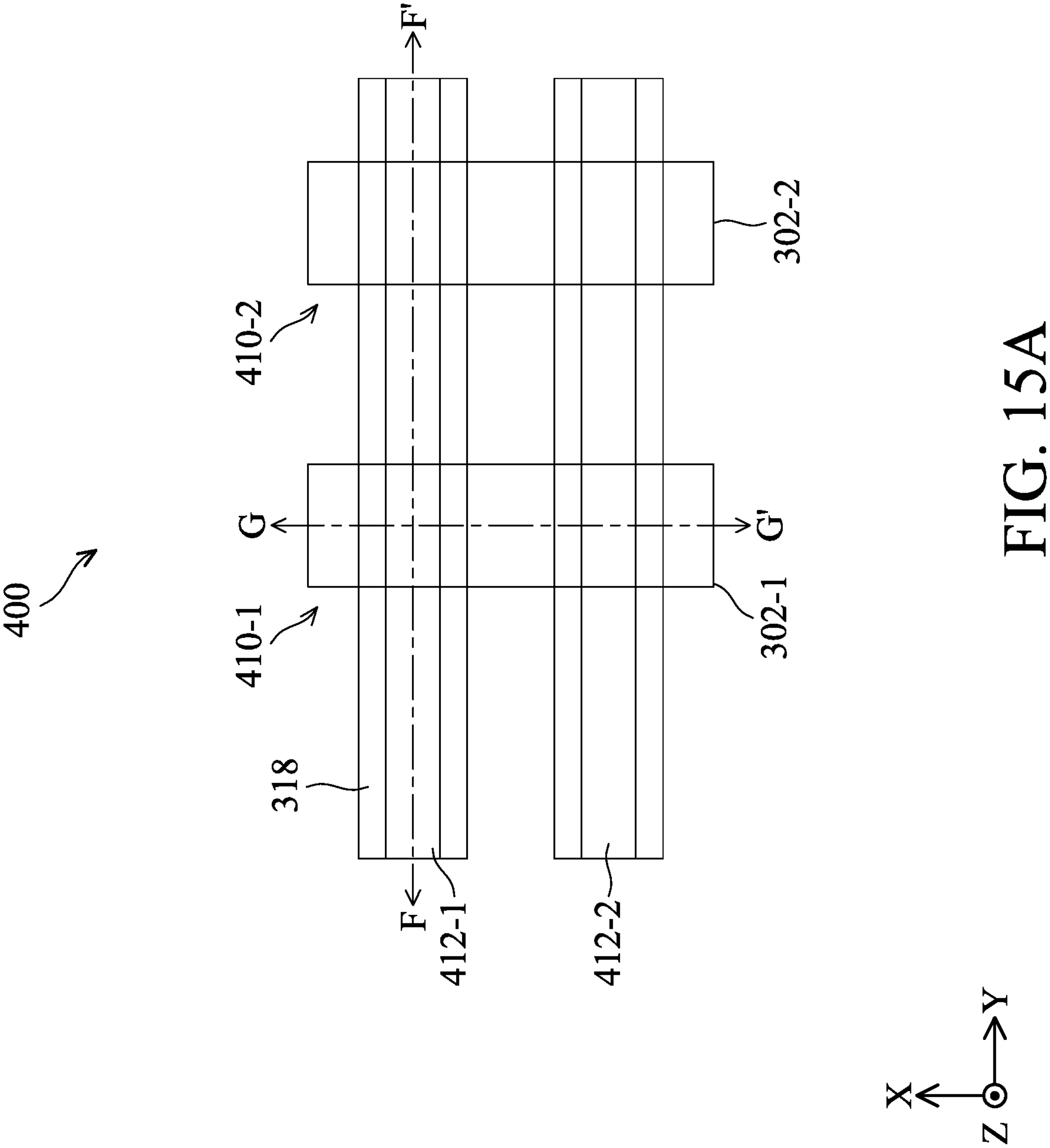
Figure 15C:
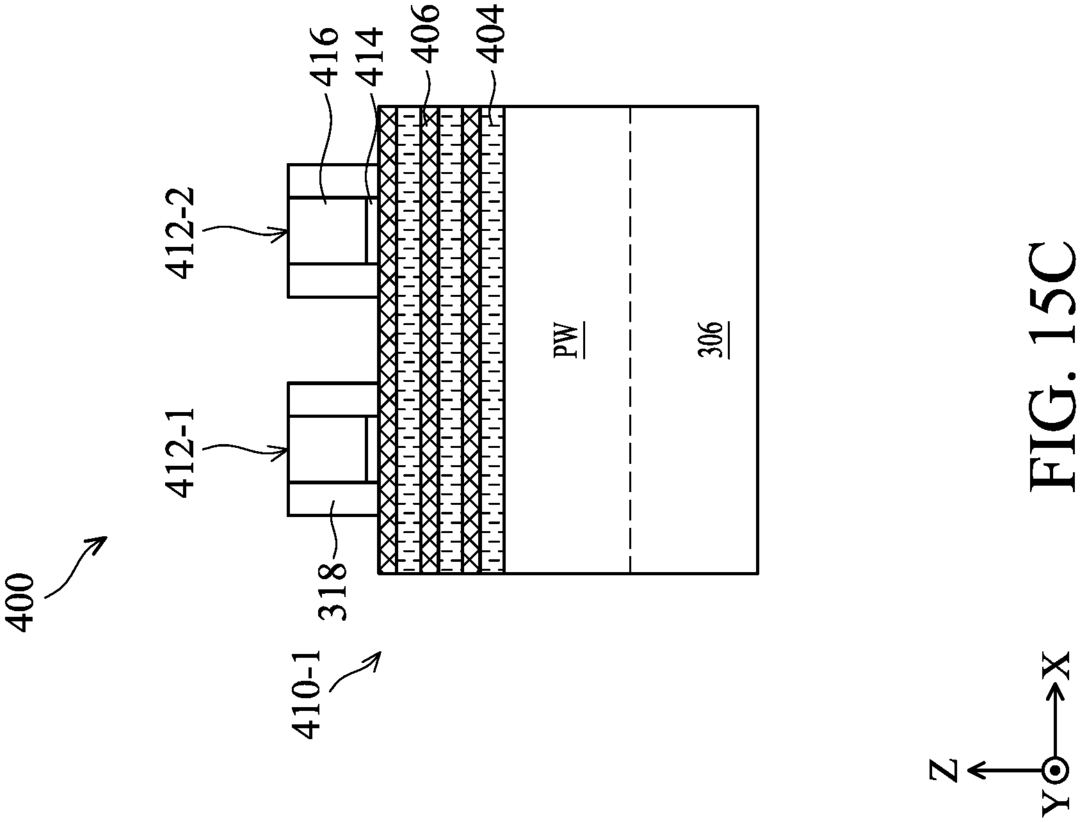
Figure 15B:
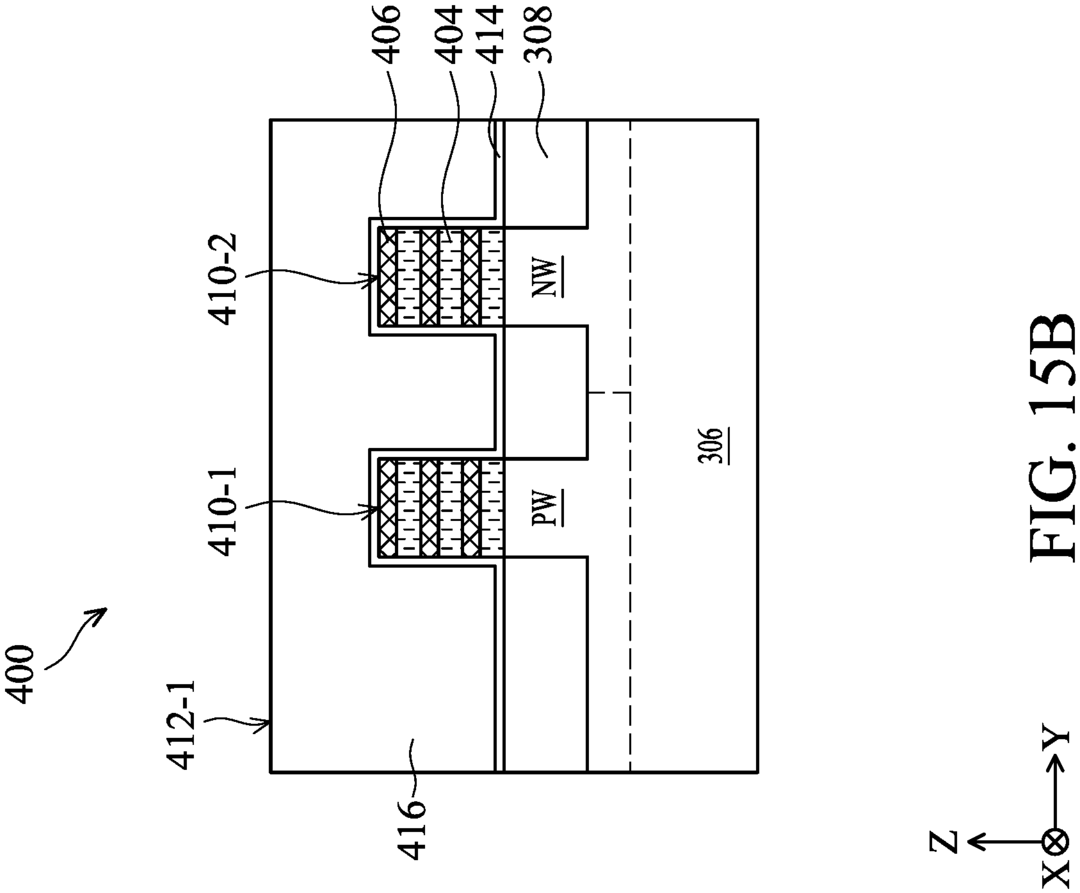
Figure 16A:
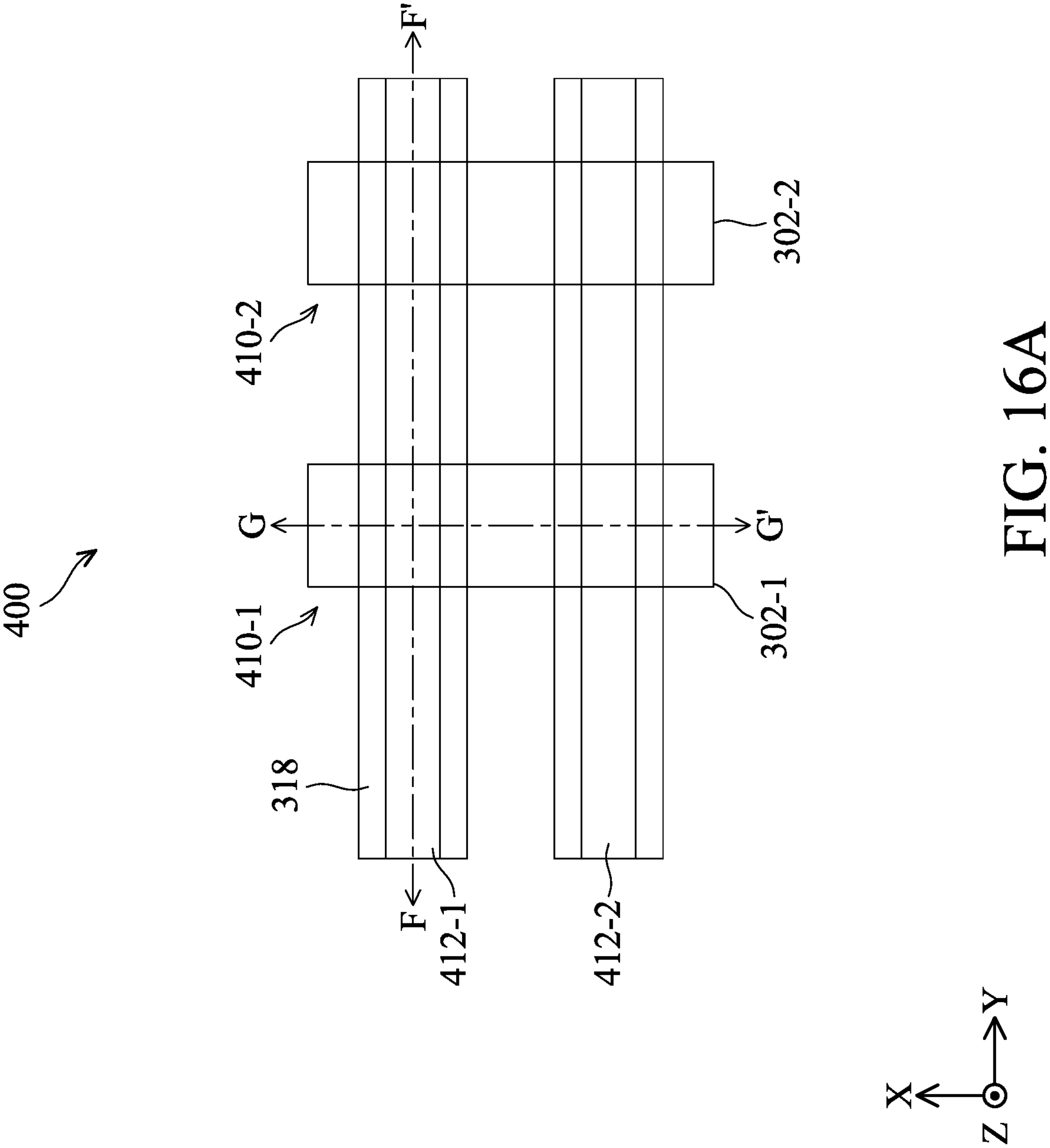
Figure 16C:
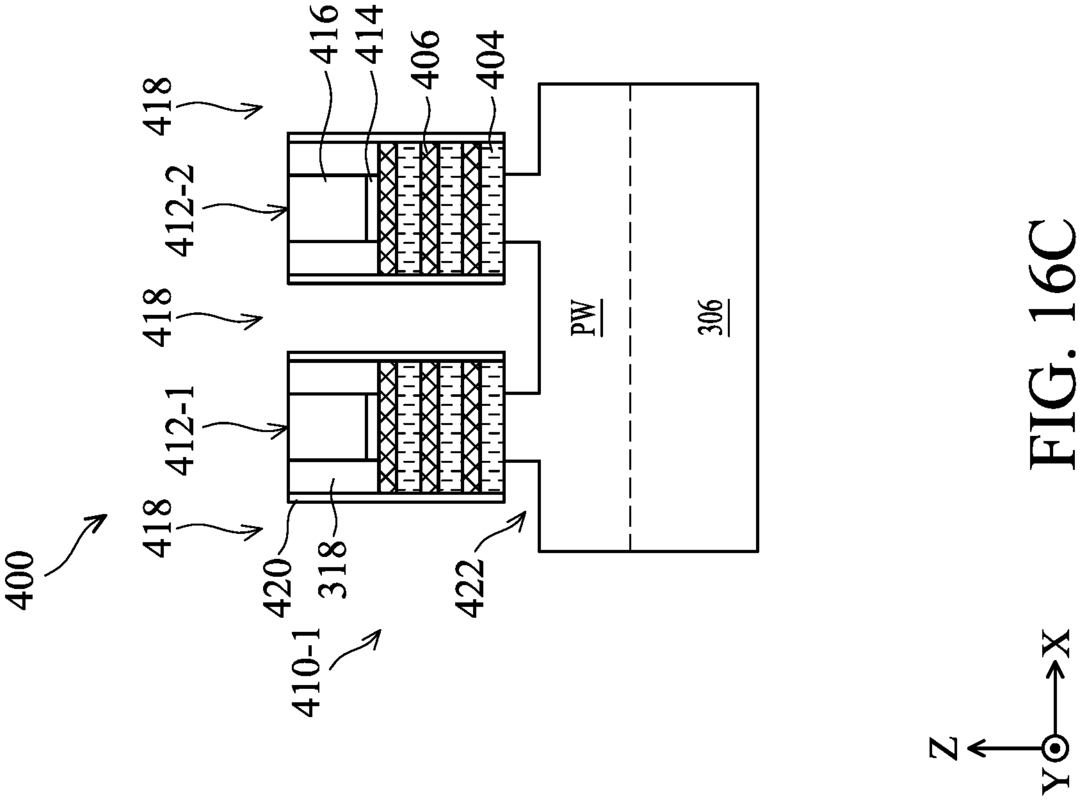
Figure 16B:
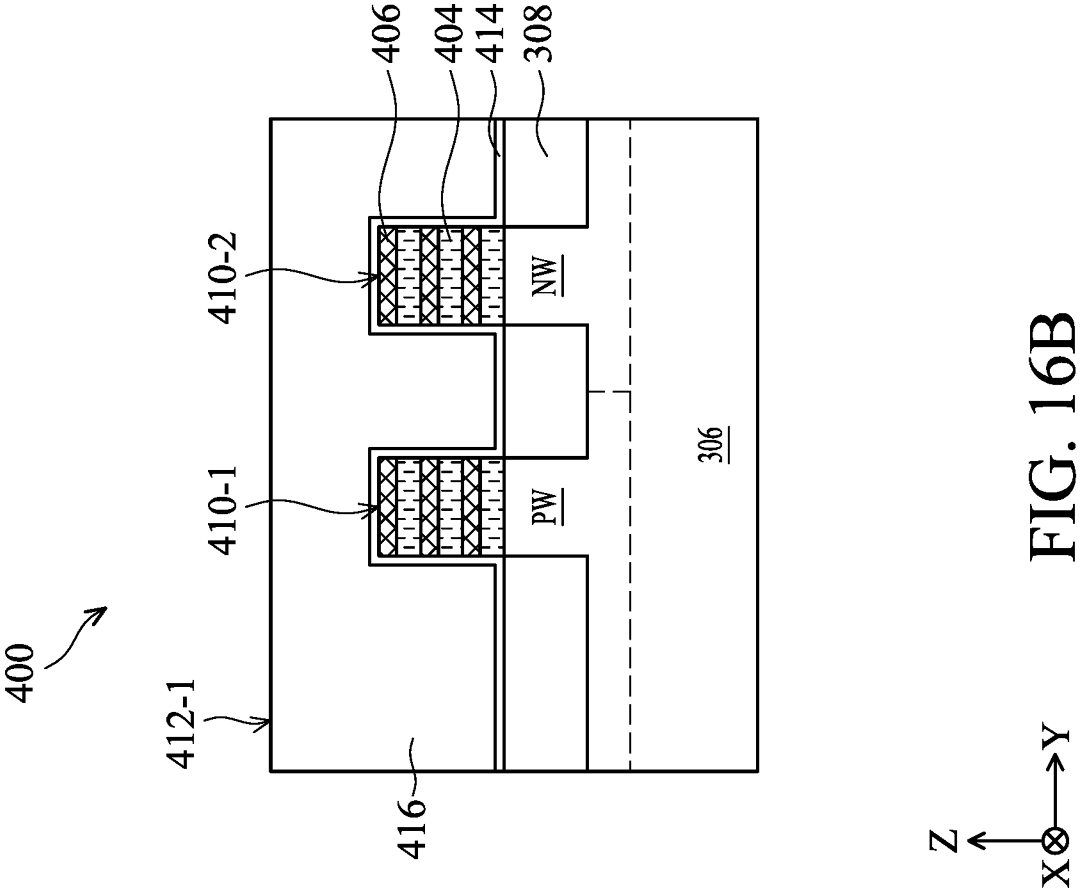

Referring to FIGS. 15A to 15C, dummy gate structures 412-1 and 412-2 (may be collectively referred to as the dummy gate structures 412) are formed over the fins 410. The dummy gate structures 412 extend in the Y-direction, as shown in FIGS. 15A to 15C. In some embodiments, to form the dummy gate structures 412, a dummy interfacial material for dummy interfacial layers 414 is first formed over fins 410. In some embodiments, the dummy interfacial layer 414 may include, for example, a dielectric material such as a nitride (e.g., silicon nitride, silicon oxynitride), a carbide (e.g., silicon carbide), an oxide (e.g., silicon oxide), or some other suitable material. Then, in some embodiments, a dummy gate material for dummy gate electrodes 416 is formed over the dummy interfacial material. The dummy gate material may include a conductive material selected from a group comprising of polysilicon, W, Al, Cu, AlCu, Ti, TiAlN, TaC, TaCN, TaSiN, Mn, Zr, TiN, Ta, TaN, Co, Ni, and/or a combination thereof. The dummy gate material and/or the dummy interfacial material may be formed by way of a thermal oxidation process and/or a deposition process (e.g., physical vapor deposition (PVD), CVD, PECVD, and ALD).

After the formation of the dummy interfacial material and the dummy gate material, one or more etching processes may be performed to pattern the dummy gate material for the dummy gate electrodes 416 and the dummy interfacial material for the dummy interfacial layers 414, thereby forming the dummy gate structures 412 each having the dummy interfacial layer 414 and the dummy gate electrode 416. The dummy interfacial layers 414 may also be referred to as dummy gate dielectrics. The dummy gate structures 412 may undergo a gate replacement process through subsequent processing to form metal gates, such as a high-k metal gate, as discussed in greater detail below.

Still referring to FIGS. 15A to 15C, after the formation of the dummy gate structures 412, the gate spacers 318 are formed on sidewalls of the dummy gate structures 412 and over the top surfaces of the fins 410. More specifically, the gate spacers 318 are formed on opposite sidewalls of the dummy gate structures 412. In some embodiments, the gate spacers 318 may be formed by conformally depositing a spacer layer (containing the dielectric material) over the fins 410 and dummy gate structures 412, followed by an anisotropic etching process to remove top portions of the spacer layer from the top surfaces of the fins 410 and dummy gate structures 412. After the etching process, portions of the spacer layer on the sidewall surfaces of the fins 410 and the dummy gate structures 412 substantially remain and become the gate spacers 318. In some embodiments, the anisotropic etching process is a dry (e.g., plasma) etching process. Additionally or alternatively, the formation of the gate spacers 318 may also involve chemical oxidation, thermal oxidation, ALD, CVD, and/or other suitable methods. The gate spacers 318 may also be interchangeably referred to as top spacers.

Referring to FIGS. 16A to 16G, the fins 410 are recessed to form source/drain trenches 418 in the fins 410 (or passing through the semiconductor layers 404 and 406). More specifically, the source/drain trenches 418 are formed on opposite sides of the dummy gate structures 412 and in the fins 410. The source/drain trenches 418 may be formed by performing one or more etching processes to remove portions of the semiconductor layers 404, the semiconductor layers 406 that do not vertically overlap or be covered by the dummy gate structures 412 and the gate spacers 318. In some embodiments, a single etchant may be used to remove the semiconductor layers 404 and the semiconductor layers 406, whereas in other embodiments, multiple etchants may be used to perform the etching process.

Still referring to FIGS. 16A to 16G, after the formation of the source/drain trenches 418, polymer layers 420 are formed on sidewalls of the fins 410 and the gate spacers 318 exposed in the source/drain trenches 418. More specifically, the polymer layers 420 are formed on sidewalls of the semiconductor layers 404, the semiconductor layers 406, and the gate spacers 318, exposed in the source/drain trenches 418 that protect the semiconductor layers 404, the semiconductor layers 406, and the gate spacers 318 from the sequent processes for forming the dielectric layers 326, as discussed above.

After the formation of the polymer layers 420, an etching process is performed to form gaps 422 under the fins 410 through the source/drain trenches 418. Since the polymer layers 420 on the sidewalls of the semiconductor layers 404, the semiconductor layers 406, and the gate spacers 318, the etching process is performed that etch the substrate 306 under the fins 410 through the source/drain trenches 418, with no etching of the semiconductor layers 404, the semiconductor layers 406, and the gate spacers 318, so that gaps 422 may be formed under the semiconductor layers 404, the semiconductor layers 406, and the gate spacers 318, between the semiconductor layers 404 and the substrate 306, which are below the gate spacers 318. In some embodiments, the etching process is isotropic etching process to laterally etch (e.g., along the X-direction) the substrate 306 under the fins 410 and the gate spacers 318.

Referring to FIGS. 17A to 17G, the dielectric layers 326 discussed above are formed in the gaps 422. Therefore, the dielectric layers 326 are under the fins 410. Furthermore, the dielectric layers 326 are under the semiconductor layers 404 and over the substrate 306. In other words, the dielectric layers 326 are vertically between and in contact with the semiconductor layers 404 and the substrate 306 in the Z-direction. In some embodiments, the sidewalls of the dielectric layers 326 facing to the source/drain trenches 418 are aligned with sidewalls of the semiconductor layers 404, the semiconductor layers 406, and the gate spacers 318.

In order to form the dielectric layers 326, a deposition process forms a dielectric material into the source/drain trenches 418 and the gaps 422, such as CVD, PVD, ALD, HDPCVD, MOCVD, RPCVD, PECVD, LPCVD, ALCVD, APCVD, other suitable methods, or a combination thereof.

Figure 17A:
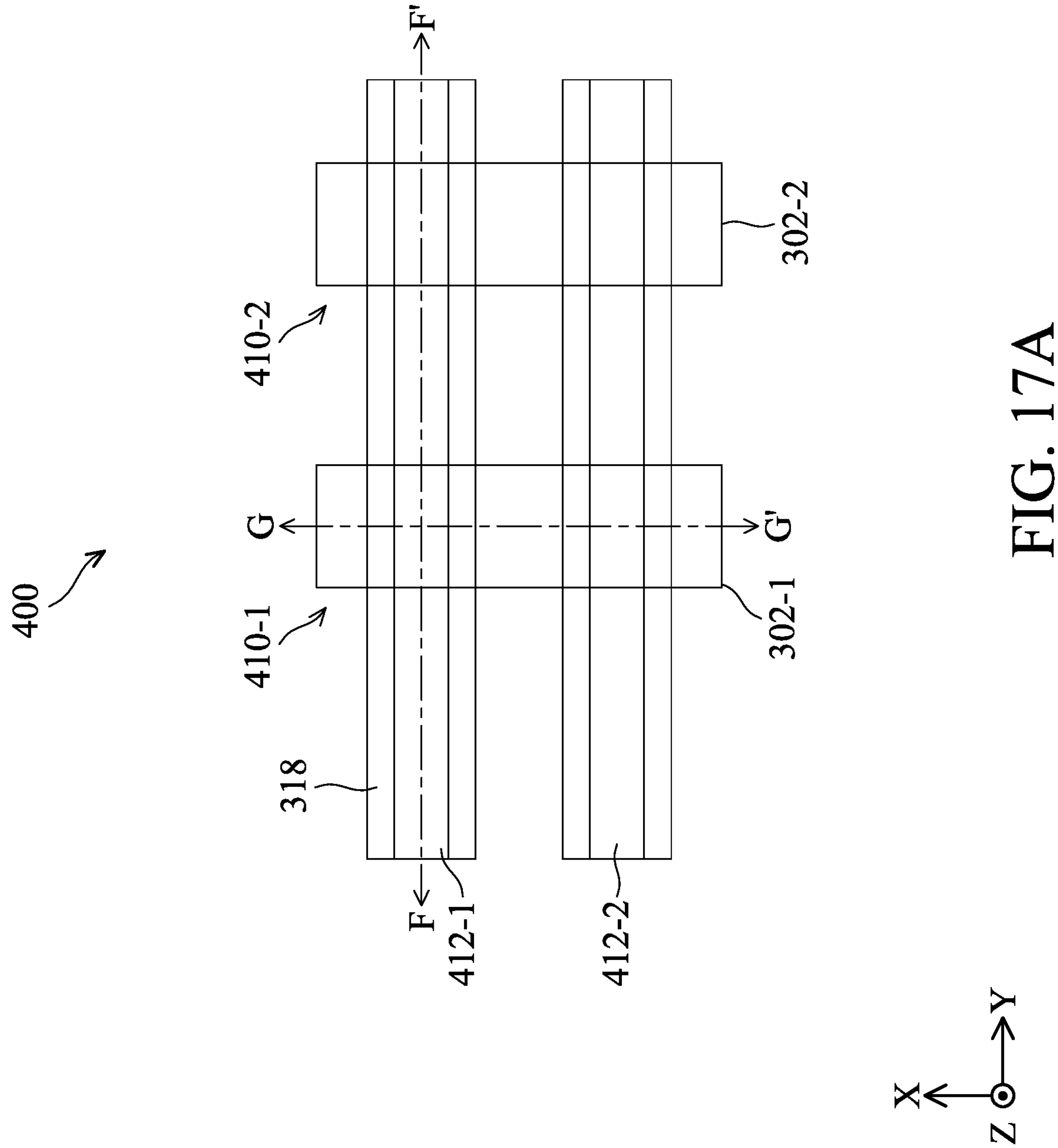
Figure 17C:
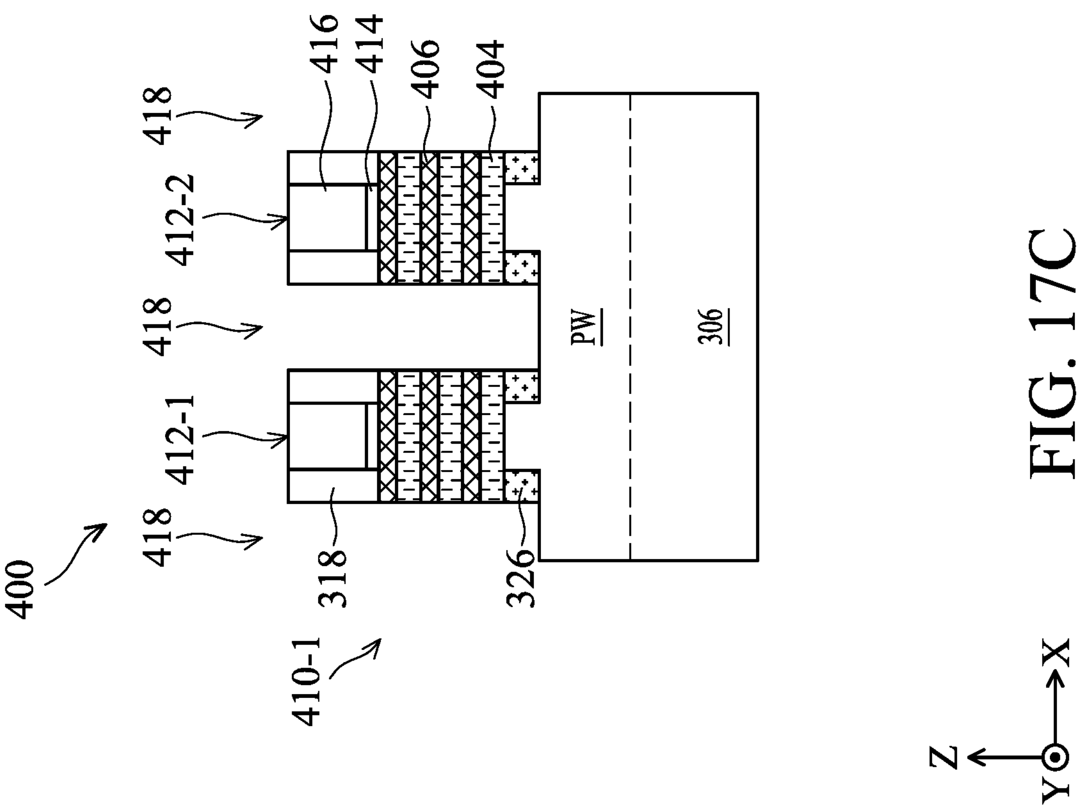
Figure 17B:
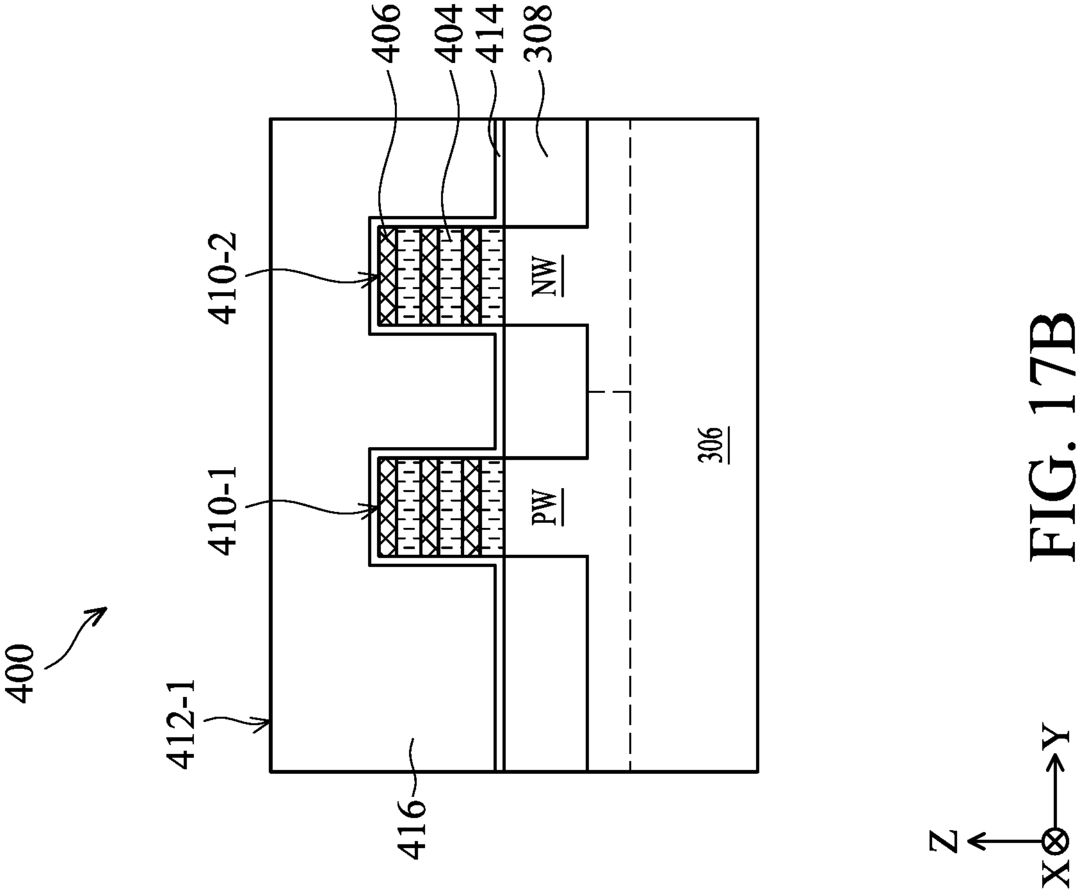

The dielectric material fills the source/drain trenches 418 and the gaps 422. The deposition process is configured to ensure that the dielectric material fills the gaps 422 between the semiconductor layer 404 and the substrate 306 under the gate spacers 318. An etching process is then performed that etches the dielectric material to form the dielectric layers 326 (as shown in FIG. 17C). After the formation of the dielectric layers 326, the polymer layers 420 are removed to expose the sidewalls of the semiconductor layers 404, the semiconductor layers 406, and the gate spacers 318 in the source/drain trenches 418.

Figure 18A:
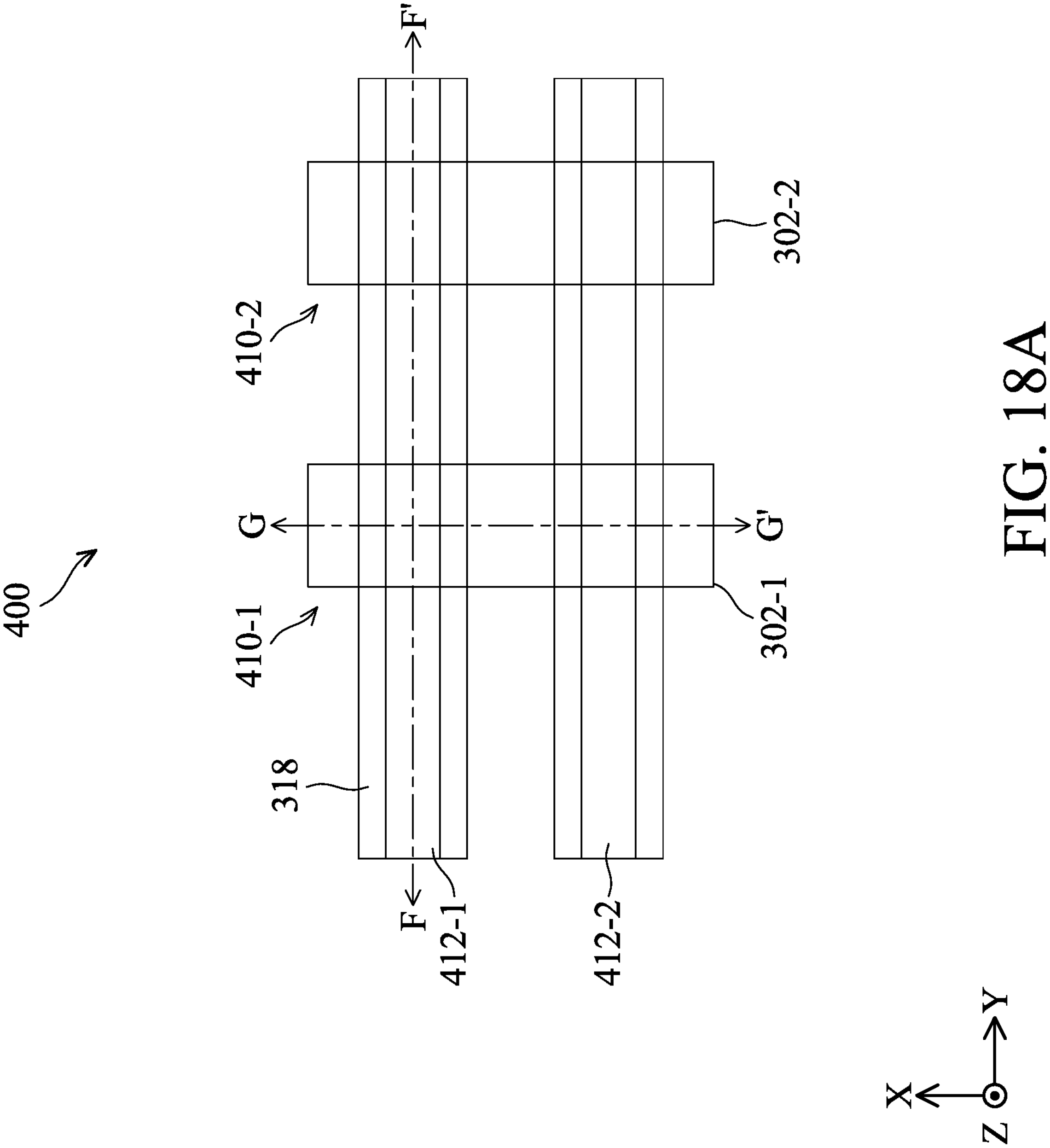
Figure 18C:
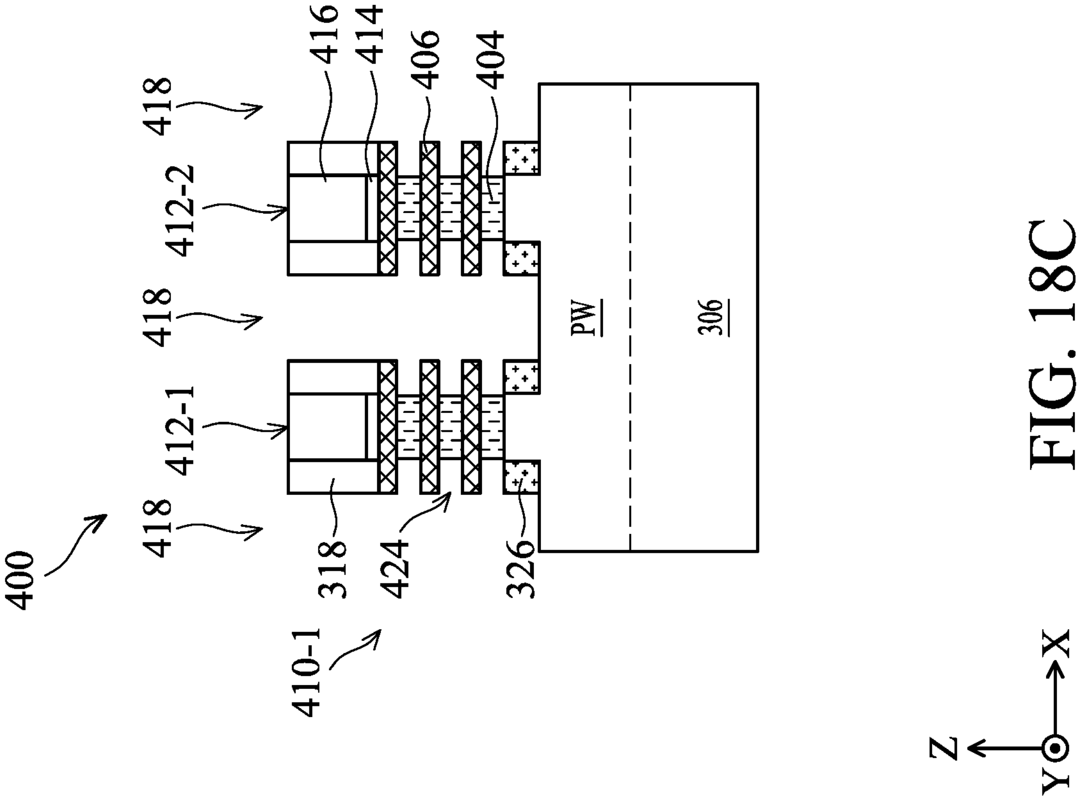
Figure 18B:
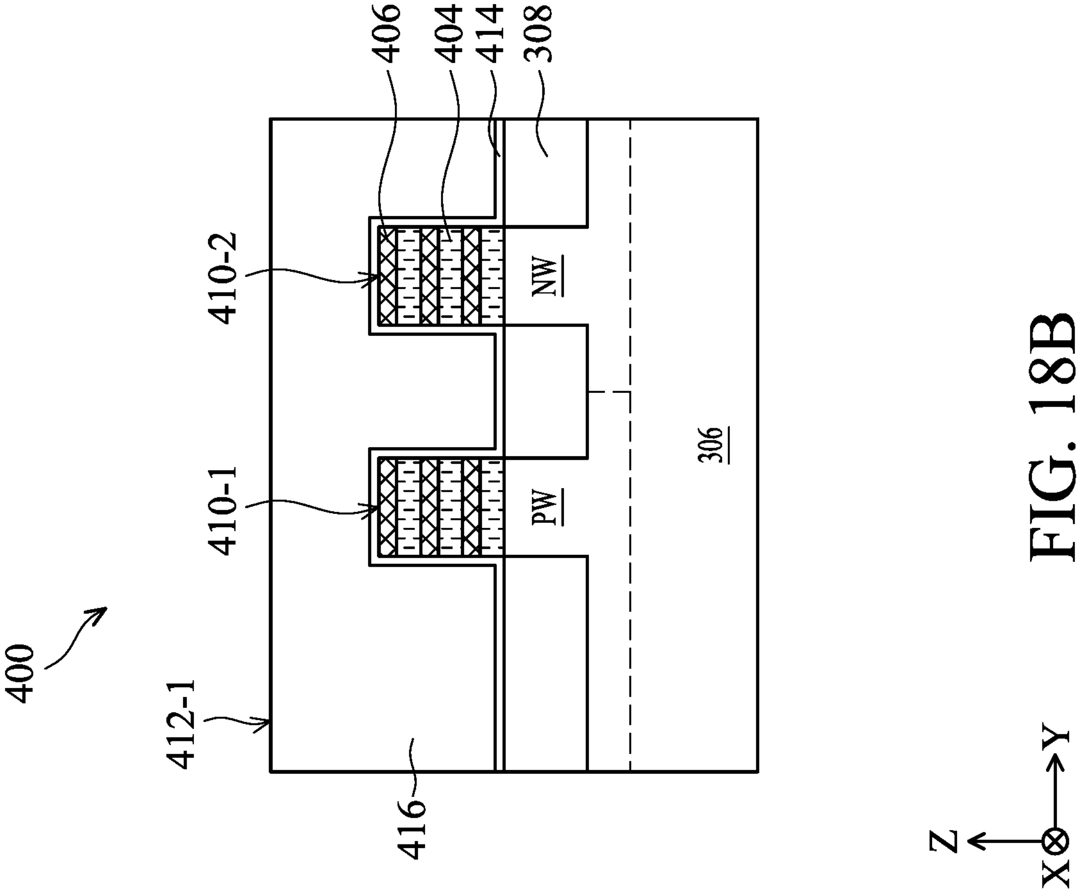

Referring to FIGS. 18A to 18C, after the removal of the polymer layers 420, side portions of the semiconductor layers 404 are removed via a selective etching process. Specifically, the selective etching process is performed that selectively etches the side portions of the semiconductor layers 404 below the gate spacers 318 through the source/drain trenches 418, with minimal (or no) etching of semiconductor layers 406, such that gaps 424 are formed between the semiconductor layers 406 as well as between the semiconductor layers 406 and the dielectric layers 326, below the gate spacers 318, and over the dielectric layers 326. The etching process is configured to laterally etch (e.g., along the X-direction) the semiconductor layers 404 below the gate spacers 318. The selective etching process is a dry etching process, a wet etching process, other suitable etching process, or a combination thereof.

Figure 19A:
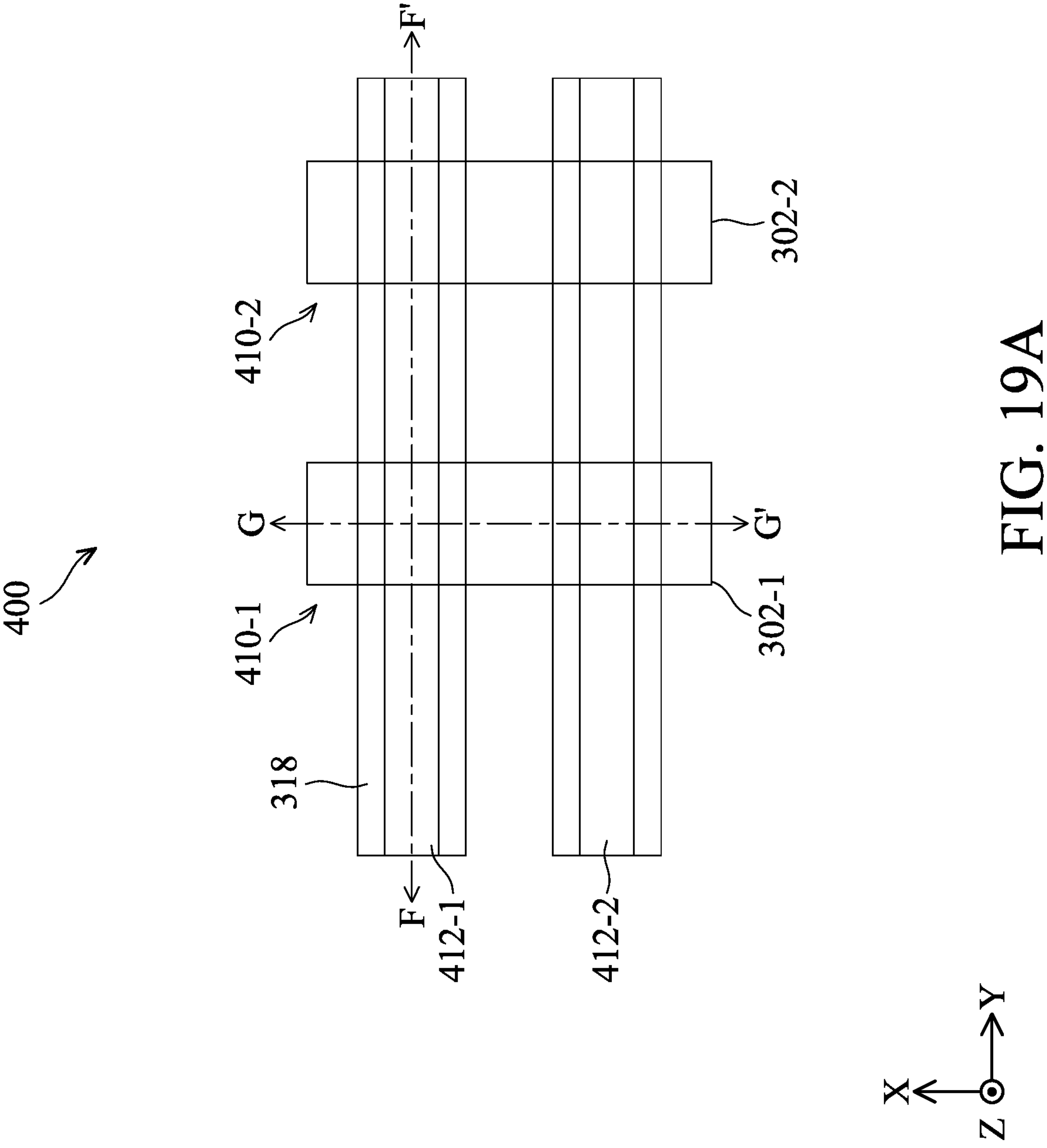
Figure 19C:
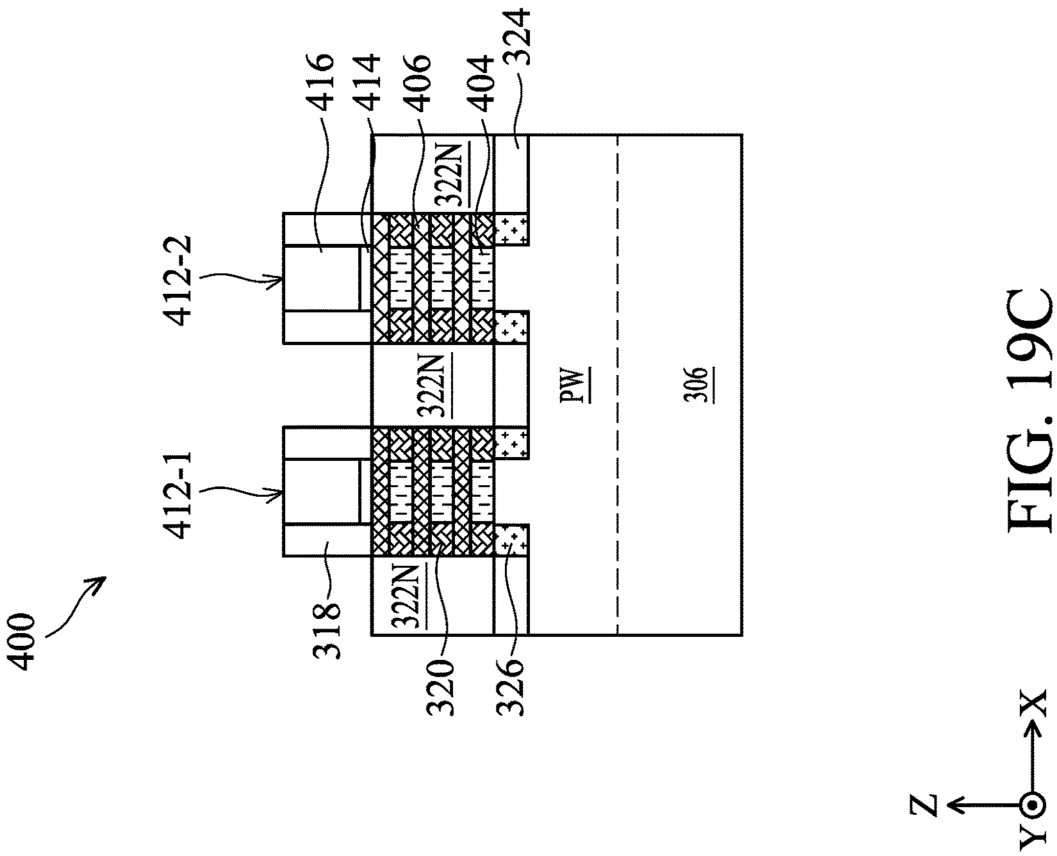
Figure 19B:
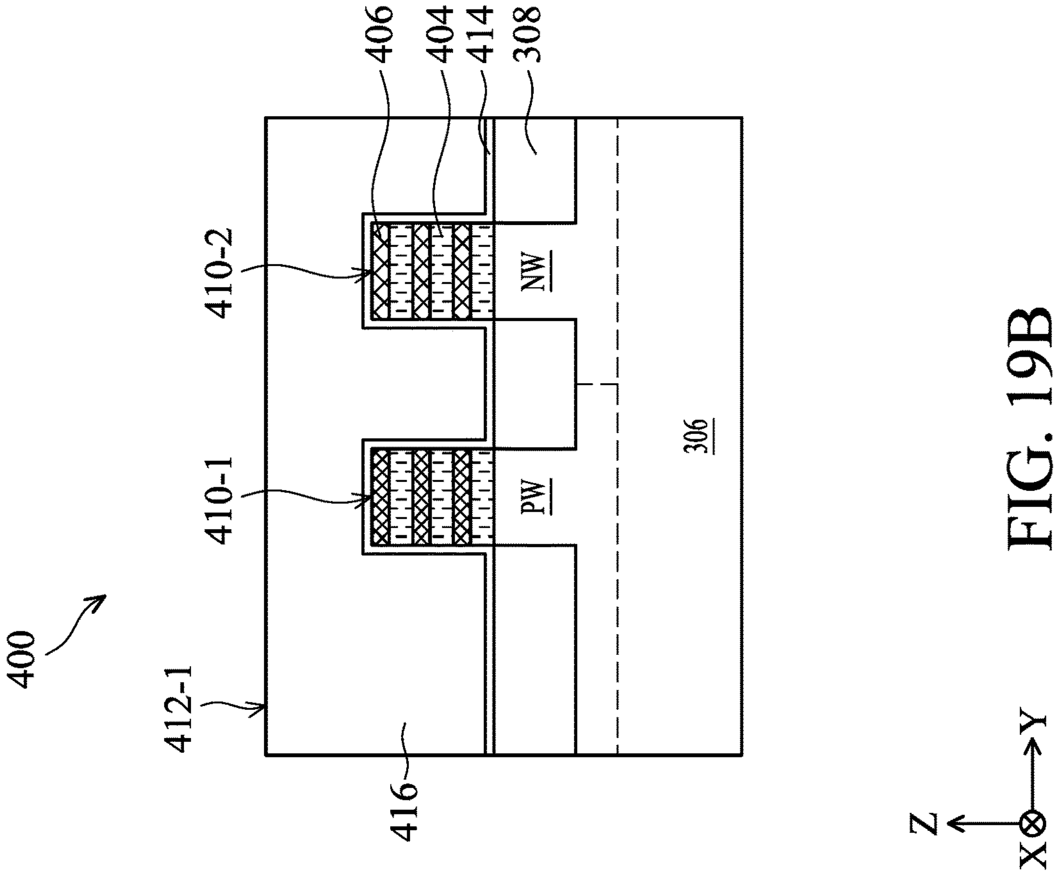

Referring to FIGS. 19A to 19C, the inner spacers 320 discussed above are formed to fill the gaps 424. The inner spacers 320 are under the gate spacers 318 and between the semiconductor layers 406 as well as between the semiconductor layers 406 and the substrate 306. In some embodiments, sidewalls of the inner spacers 320 are aligned to sidewalls of the gate spacers 318 and the semiconductor layers 406, as shown in FIG. 19C. In order to form the inner spacers 320, a deposition process forms a spacer layer into the source/drain trenches 418 and the gaps 424, such as CVD, PVD, ALD, HDPCVD, MOCVD, RPCVD, PECVD, LPCVD, ALCVD, APCVD, other suitable methods, or a combination thereof. The spacer layer partially (and, in some embodiments, completely) fills the source/drain trenches 418. The deposition process is configured to ensure that the spacer layer fills the gaps 424 between the semiconductor layers 406 as well as between the semiconductor layer 406 and the substrate 306 under the gate spacers 318. An etching process is then performed that selectively etches the spacer layer to form the inner spacers 320 (as shown in FIG. 19C) with minimal (to no) etching of the semiconductor layer 406, the substrate 306, the dummy gate structures 412, and the gate spacers 318.

Still referring to FIGS. 19A to 19C, the silicon layers 324 and the source/drain features 322N/322P over the silicon layers 324 discussed above are formed in the source/drain trenches 418. The source/drain features 322N/322P are also formed on opposite sides of the dummy gate structures 412 in the X-direction, as shown in FIG. 19C. Furthermore, the silicon layers 324 are also formed on opposite sides of the dummy gate structures 412 in the X-direction. One or more epitaxy processes may be employed to grow the source/drain features 322N/322P. Epitaxy processes can implement CVD deposition techniques (for example, vapor-phase epitaxy (VPE), UHVCVD, LPCVD, and/or PECVD), molecular beam epitaxy, other suitable SEG processes, or combinations thereof. One or more annealing processes may be performed to activate the dopants in the source/drain features 322N/322P. The annealing processes may include rapid thermal annealing (RTA) and/or laser annealing processes.

Figure 20A:
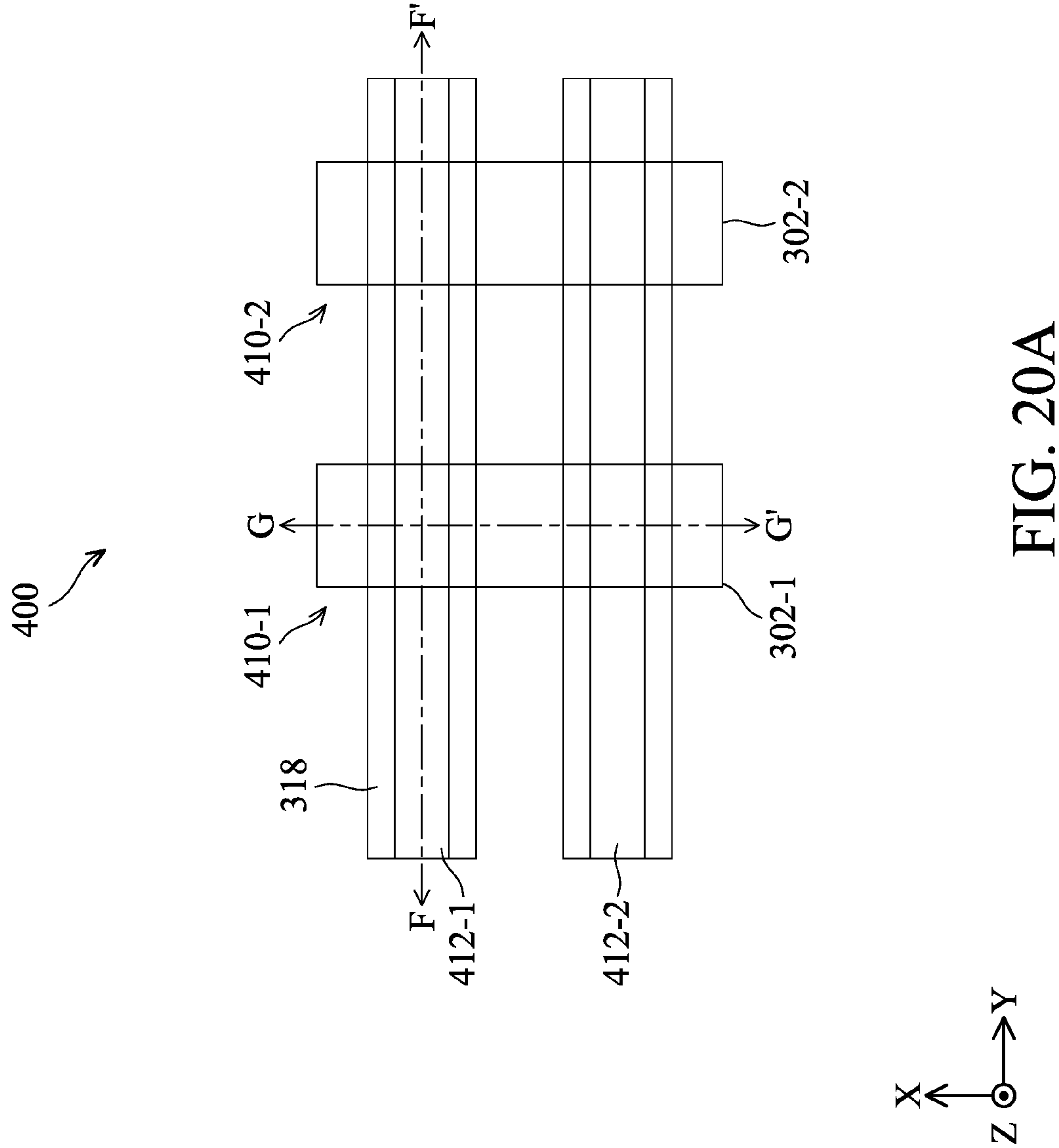
Figure 20C:
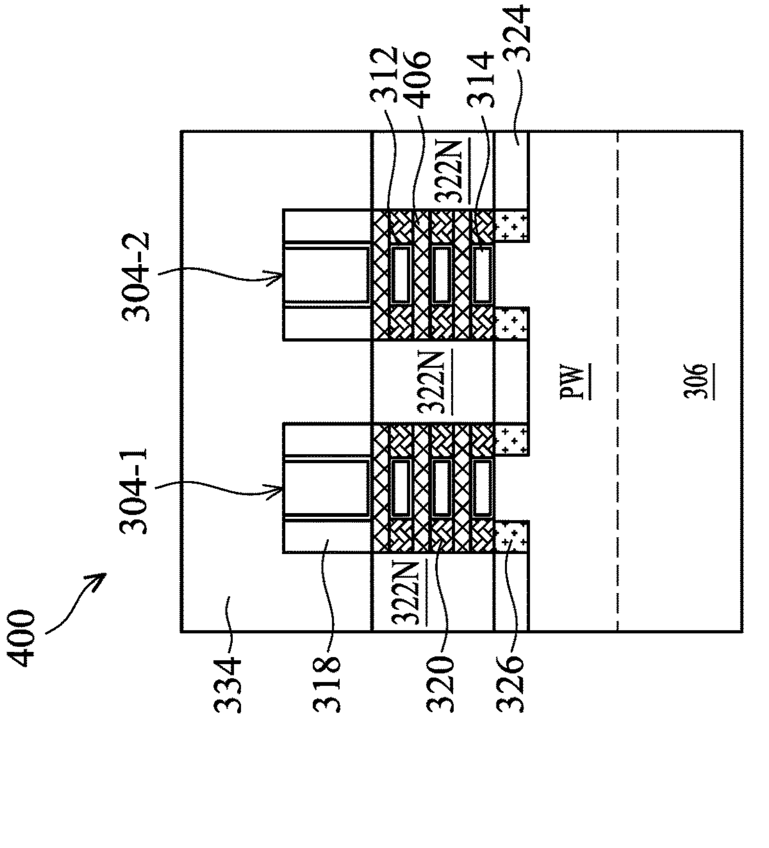
Figure 20B:
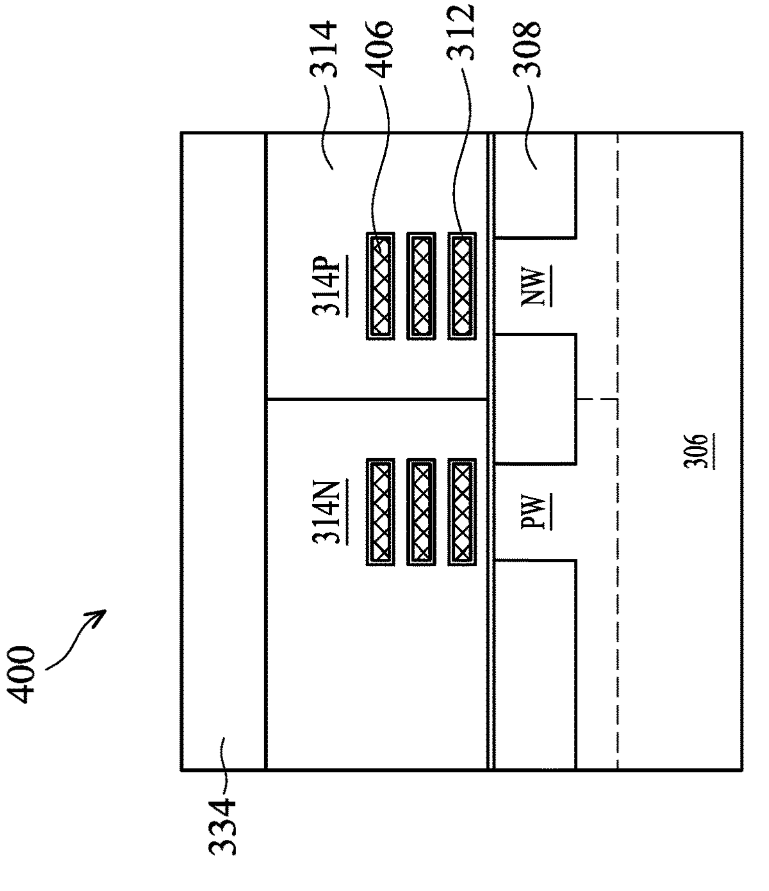

Referring to FIGS. 20A to 20C, after the formation of the source/drain features 322N/322P, the ILD layer 334 discussed above is formed to fill the space between the gate spacers 318. The ILD layer 334 may be formed by PECVD (plasma enhanced CVD), FCVD (flowable CVD), or other suitable methods. Subsequent to the formation of the ILD layer 334, a CMP process and/or other planarization process is performed on the ILD layer 334 until the top surfaces of the dummy gate structures 412 are exposed.

In some embodiments, before the formation of the ILD layer 334, a contact etch stop layer (CESL) may be conformally formed on the sidewalls of the gate spacers 318 and over the top surfaces of the source/drain features 322N/322P. The ILD layer 334 is then formed over and between the CESL to fill the space between the CESL. The CESL includes a material that is different than the ILD layer 334. The CESL may include $La_2O_3$, $Al_2O_3$, SiOCN, SiOC, SiCN, $SiO_2$, SiC, ZnO, ZrN, $Zr_2Al_3O_9$, $TiO_2$, $TaO_2$, $ZrO_2$, $HfO_2$, $Si_3N_4$, $Y_2O_3$, AlON, TaCN, ZrSi, or other suitable material(s); and may be formed by CVD, PVD, ALD, or other suitable methods.

Still referring to FIGS. 20A to 20C, the dummy gate structures 412 and the semiconductor layer 404 are replaced with the gate structures 304 discussed above. More specifically, the dummy gate structures 412 are selectively removed through any suitable lithography and etching processes. In some embodiments, the lithography process may include forming a photoresist layer (resist), exposing the resist to a pattern, performing a post-exposure bake process, and developing the resist to form a masking element, which exposes a region including the dummy gate structures 412. Then, the dummy gate structures 412 are selectively etched through the masking element. Etch selectivity may be achieved by selecting the appropriate etching chemicals, and the dummy gate structures 412 may be removed without substantially affecting the gate spacers 318, the inner spacers 320, and the substrate 306. The removal of the dummy gate structures 412 creates gate trenches exposing the top surfaces of the topmost semiconductor layers 406 underlies the dummy gate structures 412.

After the removal of the dummy gate structures 412, the semiconductor layers 404 in the fins 410 are selectively removed through the gate trenches, using a wet or dry etching process for example, so that the semiconductor layers 406 in the fins 410 are exposed in the gate trenches to form the nanostructures 310 discussed above. Such a process may also be referred to as a wire release process, a nanowire release process, a nanosheet release process, a nanowire formation process, a nanosheet formation process, or a wire formation process. In some embodiments, the removal of the semiconductor layers 404 causes the exposed semiconductor layers 406 (the nanostructures 310) to be spaced apart from each other in the vertical direction (e.g., in the Z-direction). The exposed semiconductor layers 406 extend longitudinally in the horizontal direction (e.g., in the X-direction), and each connects one source/drain feature 322N/322P to another source/drain feature 322N/322P.

Still referring to FIGS. 20A to 20C, the gate structures 304 discussed above are formed in the gate trenches to wrap around the semiconductor layers 406 (the nanostructures 310). The gate structures 304 each includes the gate dielectric layer 312 and the gate electrode layer 314 over the gate dielectric layer 312, as discussed above. In some embodiments, the gate dielectric layers 312 are formed to wrap around each of the semiconductor layers 406 (the nanostructures 310). Additionally, the gate dielectric layers 312 are also formed on sidewalls of the inner spacers 320 and the gate spacers 318.

The gate electrode layers 314 are then formed to fill the remaining spaces of the gate trenches, and over the gate dielectric layers 312 in such a way that each of the gate electrode layers 314 each wraps around the semiconductor layers 406 (the nanostructures 310), the gate dielectric layer 312, and the interfacial layers (if present). The gate electrode layers 314, the gate dielectric layers 312, and the interfacial layers (if present) may be collectively called as the gate structures 304 wrapping around the semiconductor layers 406 (the nanostructures 310), as discussed above. In some embodiments, after the formation of the gate structures 304, dielectric material is formed to enlarge the ILD layer 334 to cover the gate structures 304 and the gate spacers 318.

Figure 21A:
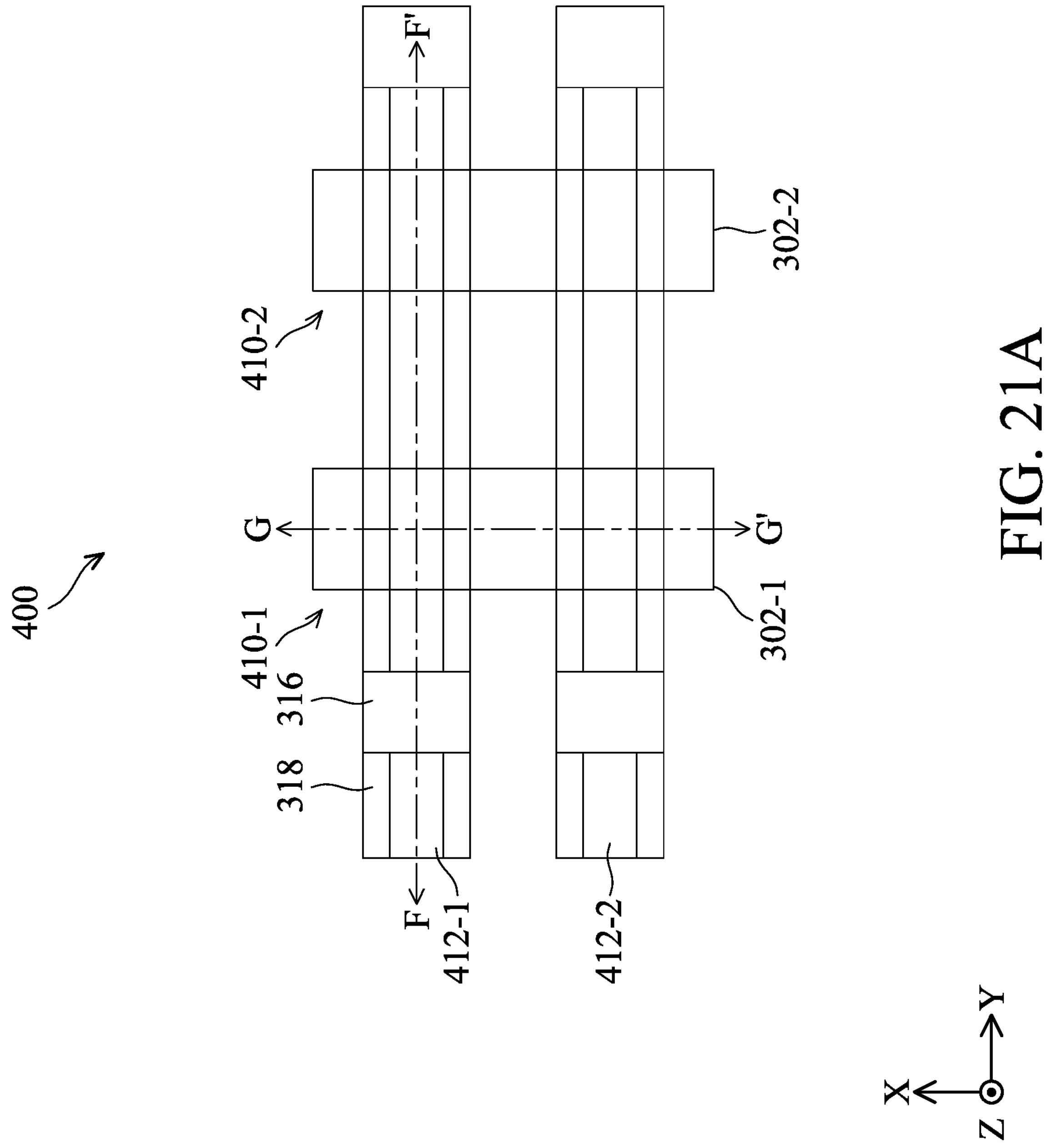
Figure 21C:
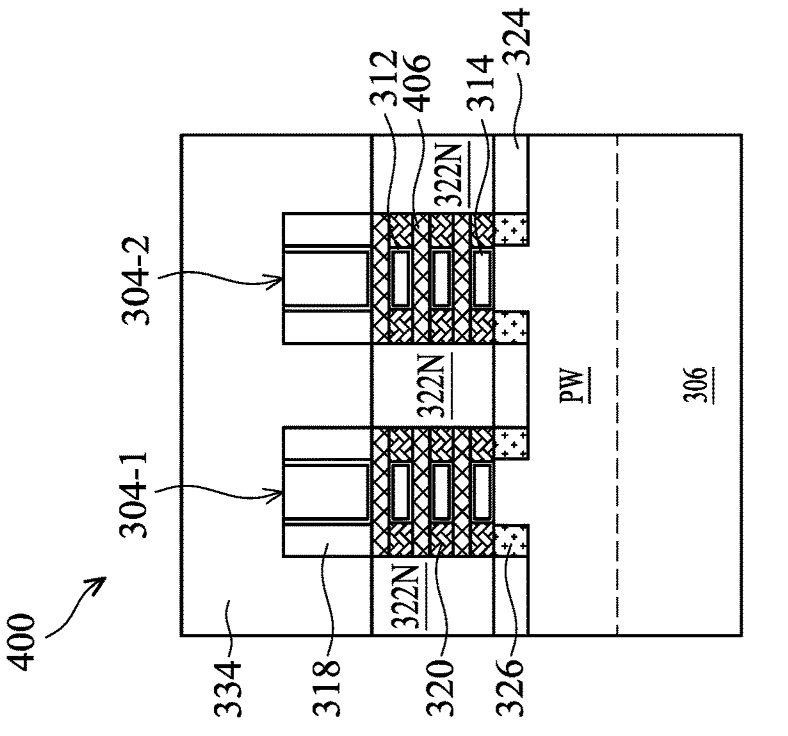
Figure 21B:
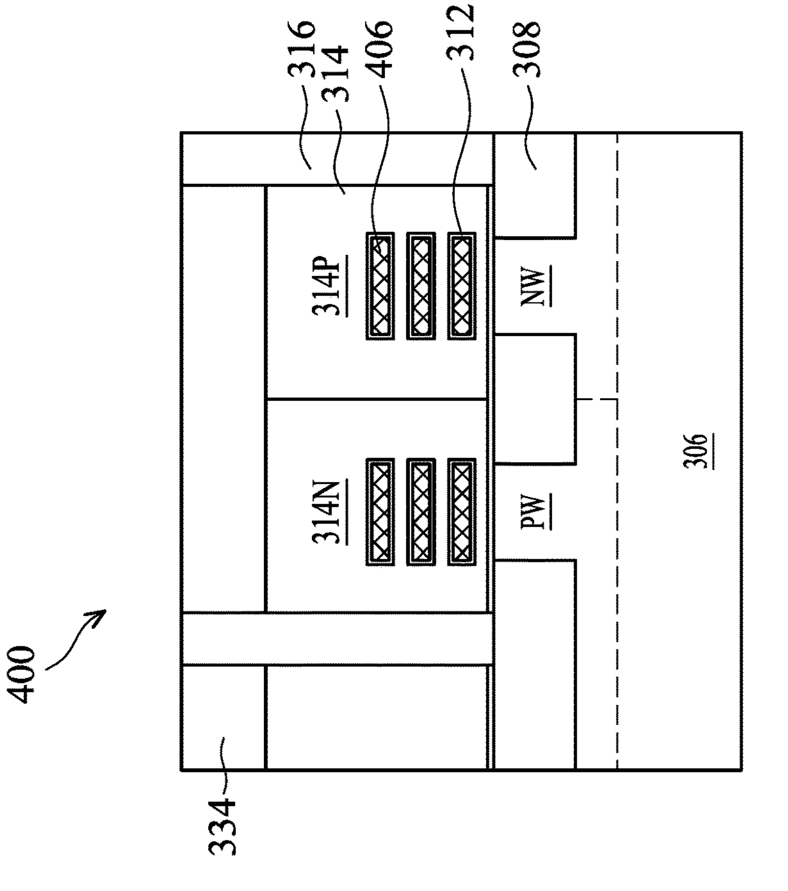

Referring to FIGS. 21A to 21C, the gate end dielectric structures 316 discussed above are formed. The gate end dielectric structures 316 are formed on opposite sides of the gate structures 304 in the Y-direction to separate the gate structures 304 from gate structures of other circuit cells or SRAM cells (not shown).

Figure 22A:
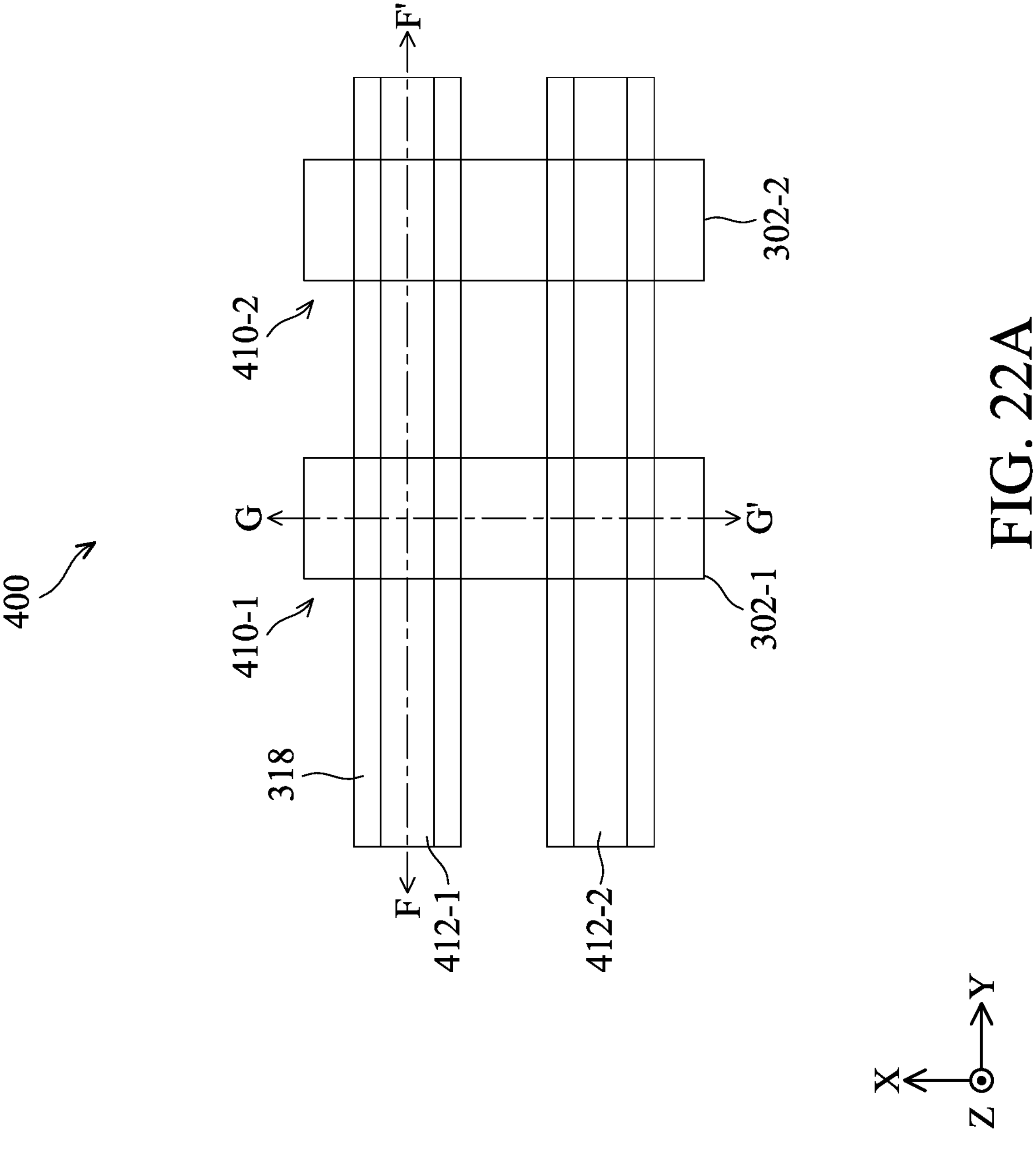
FIGS. 22A, 23A, and 24A illustrate top views (or layouts) of the workpiece at various fabrication stages for the array of the circuit cells, in accordance with some alternative embodiments of the present disclosure.
Figure 22C:
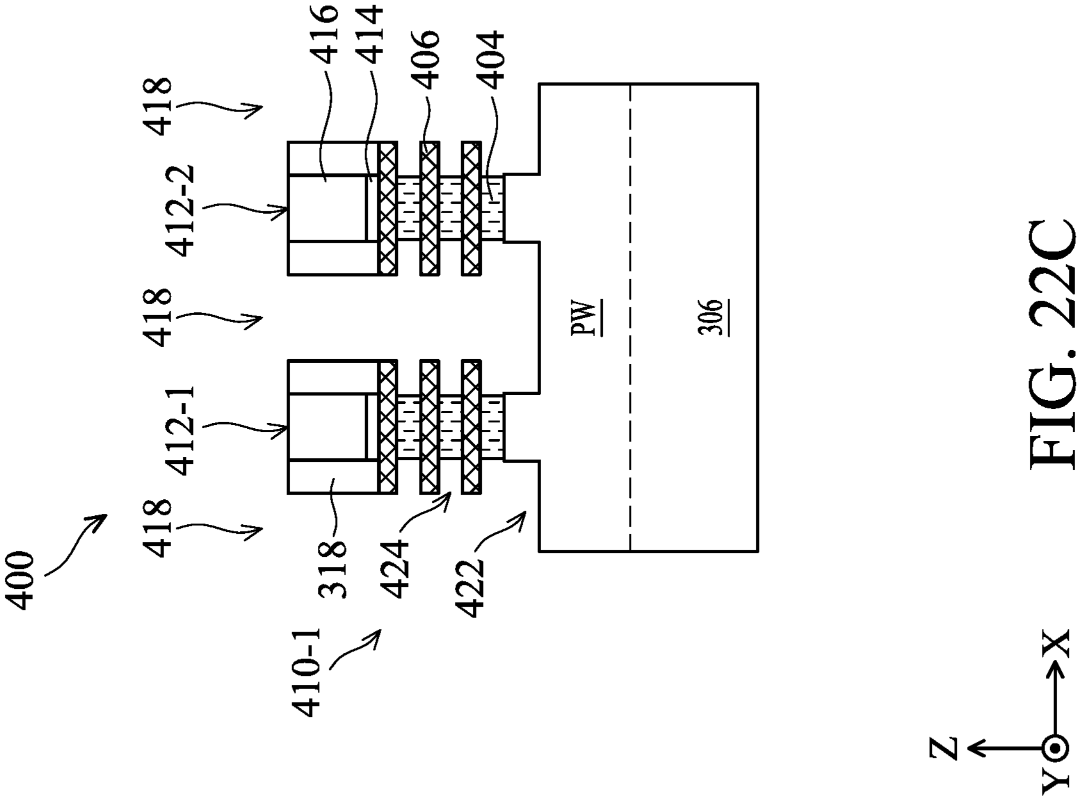
FIGS. 22C, 23C, and 24C illustrate X-Z cross-sectional views of the workpiece at various fabrication stage along lines G-G' of FIGS. 22A to 24A, respectively, in accordance with some alternative embodiments of the present disclosure.
Figure 22B:
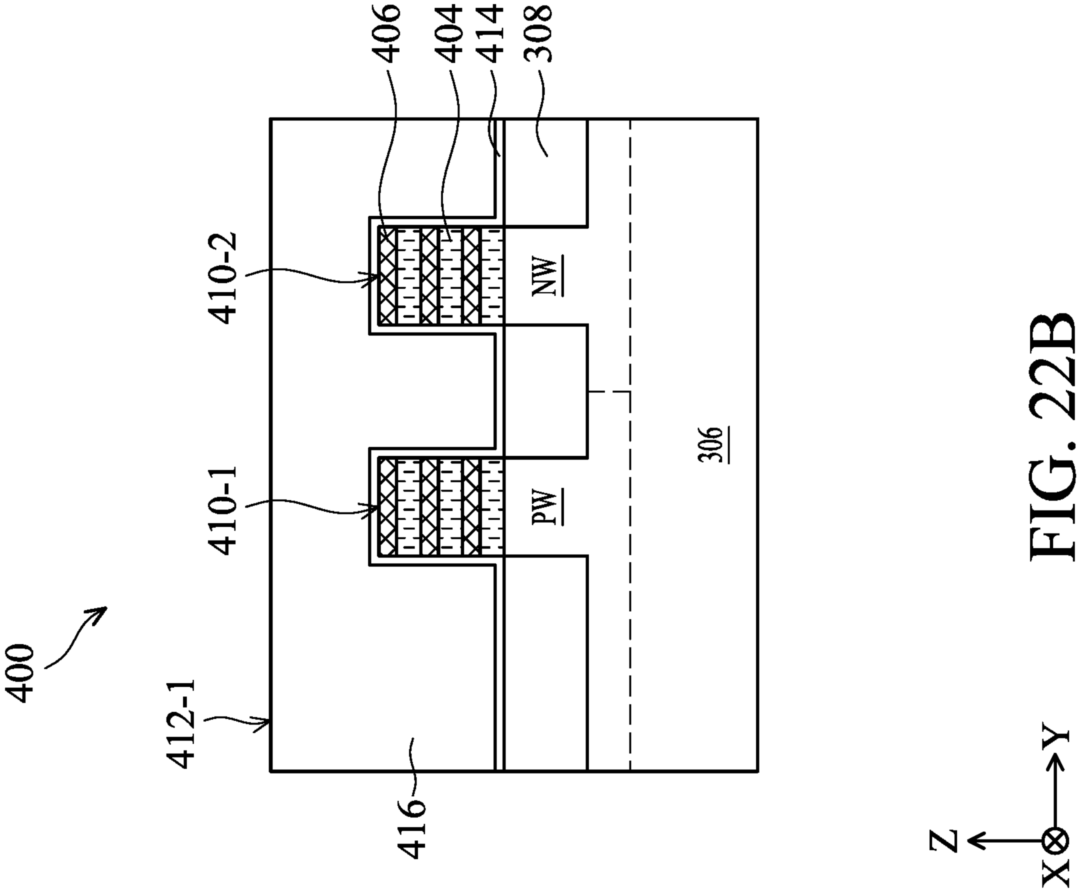
FIGS. 22B, 23B, and 24B illustrate Y-Z cross-sectional views of the workpiece at various fabrication stage along lines F-F' of FIGS. 22A to 24A, respectively, in accordance with some alternative embodiments of the present disclosure.
Figure 23A:
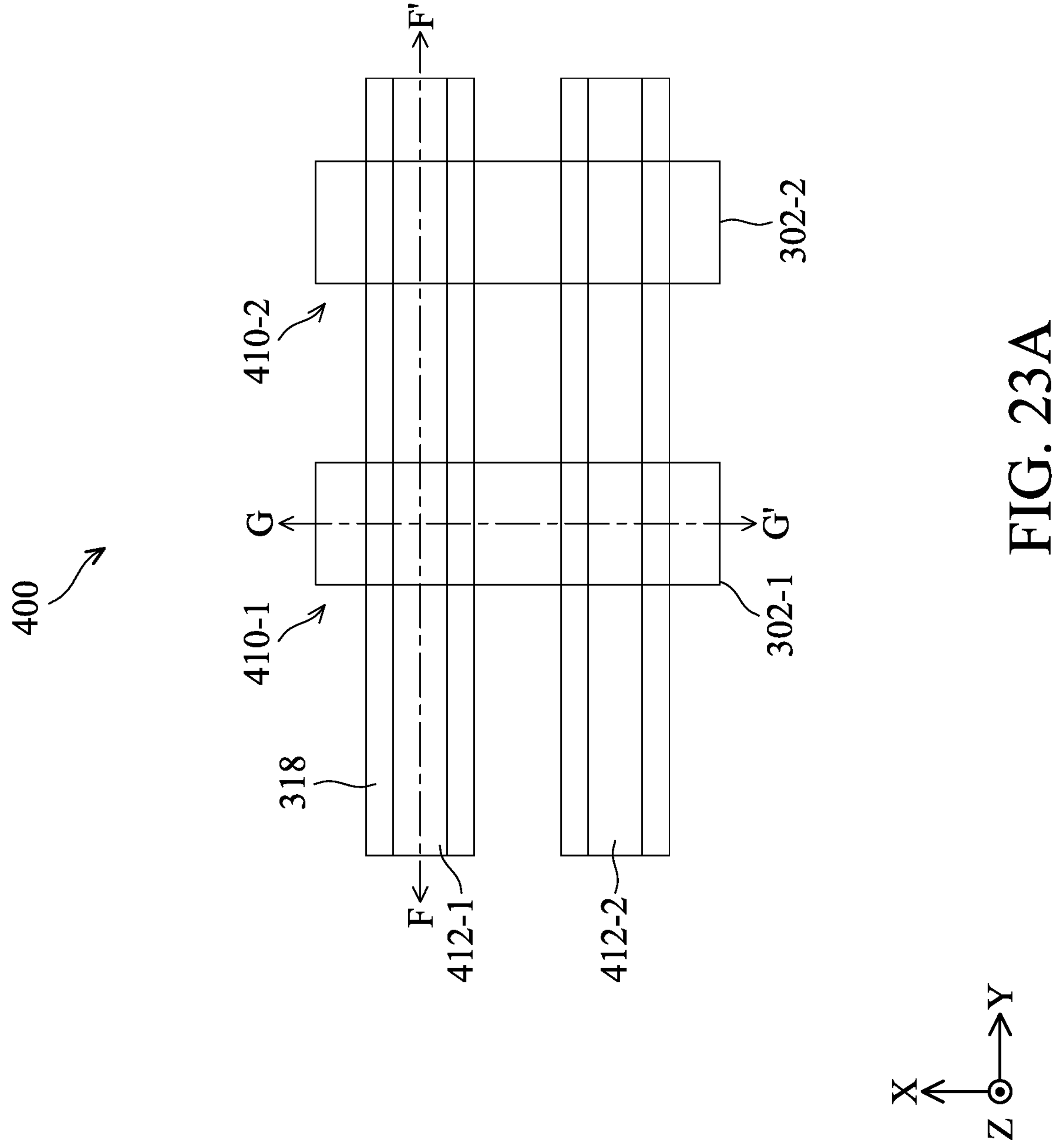
Figure 23C:
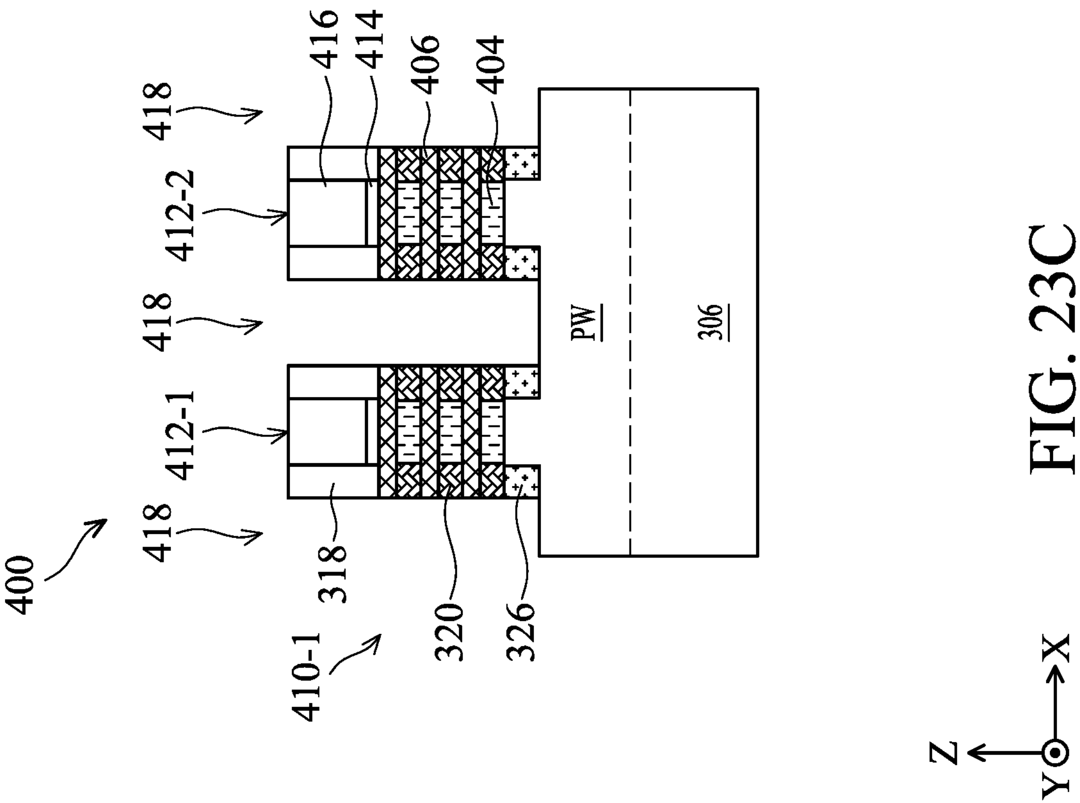
Figure 23B:
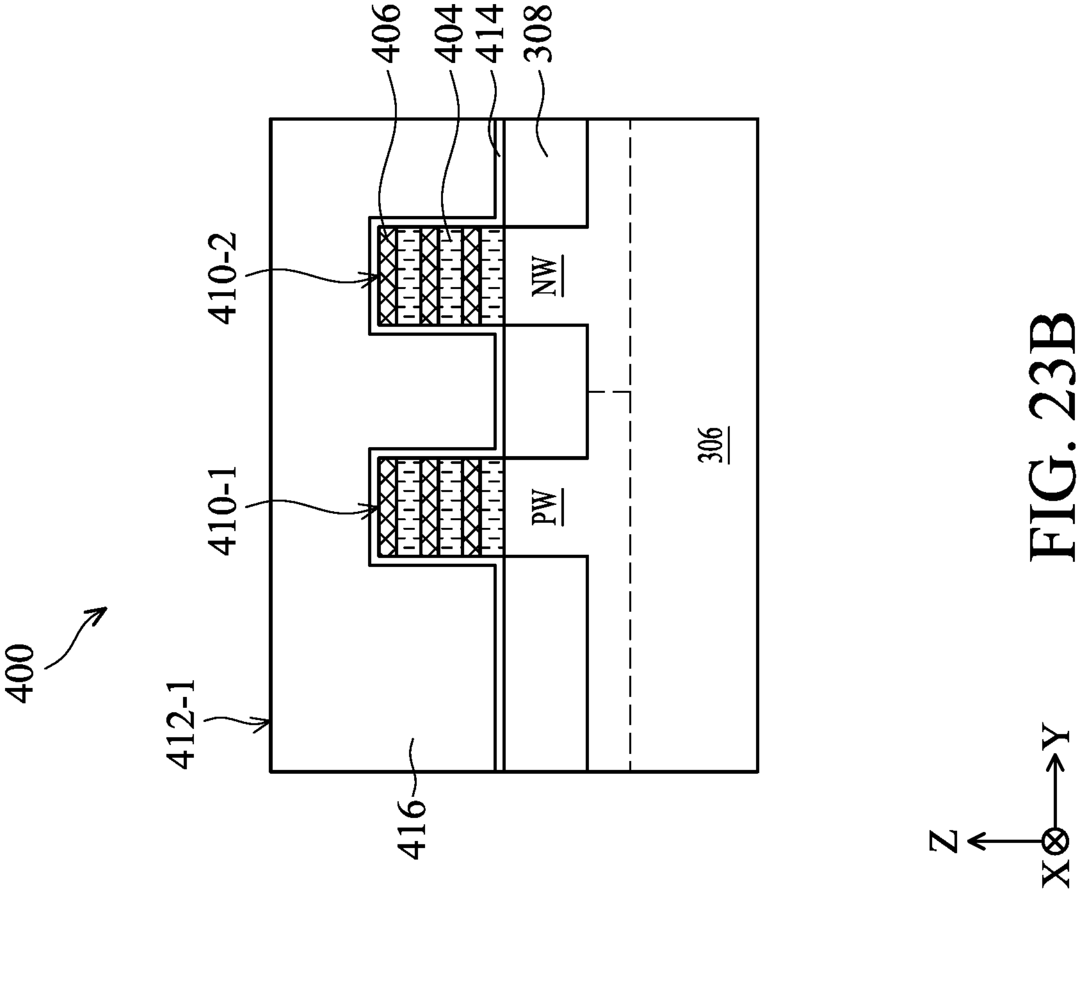
Figure 24A:
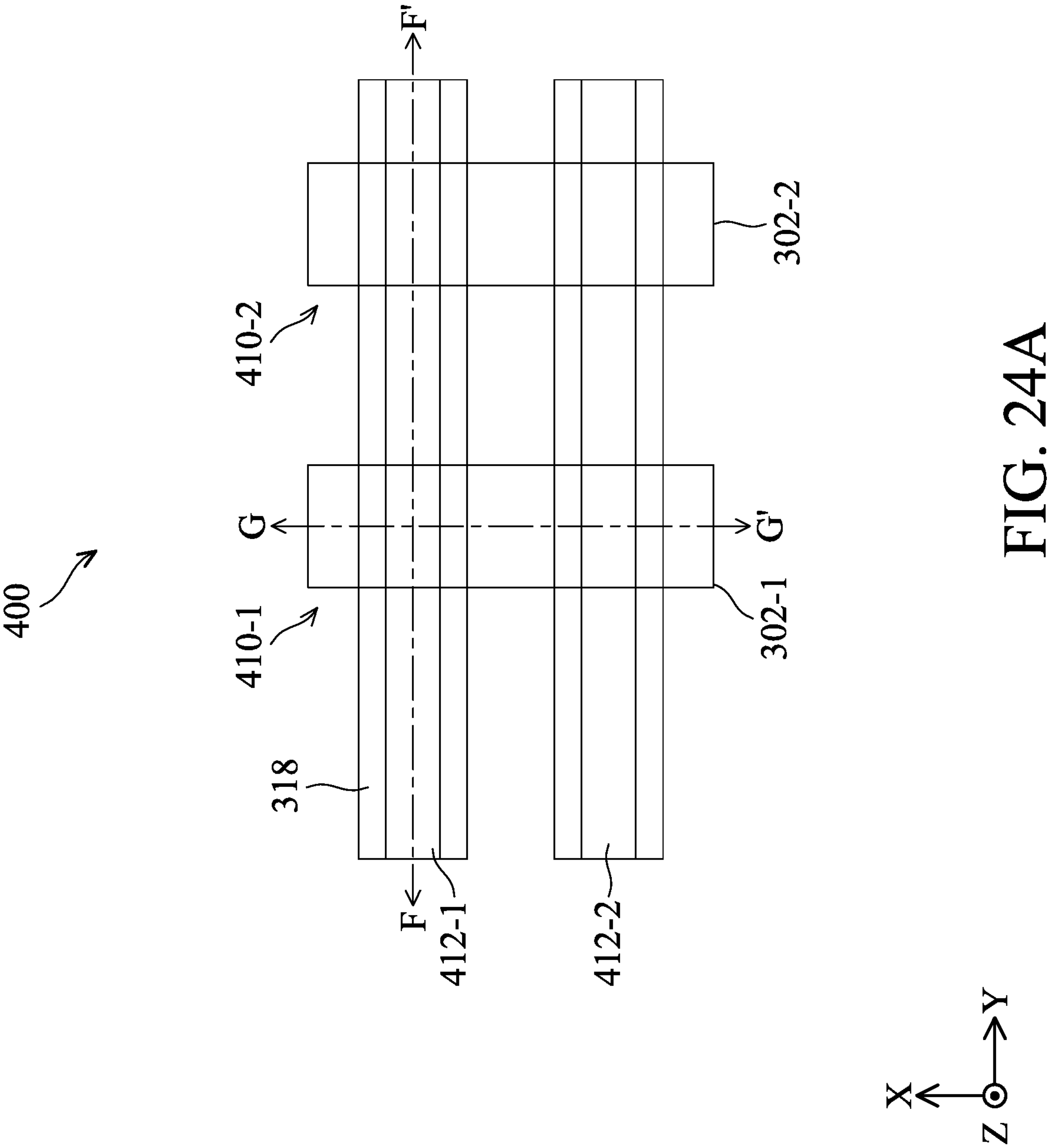
Figure 24C:
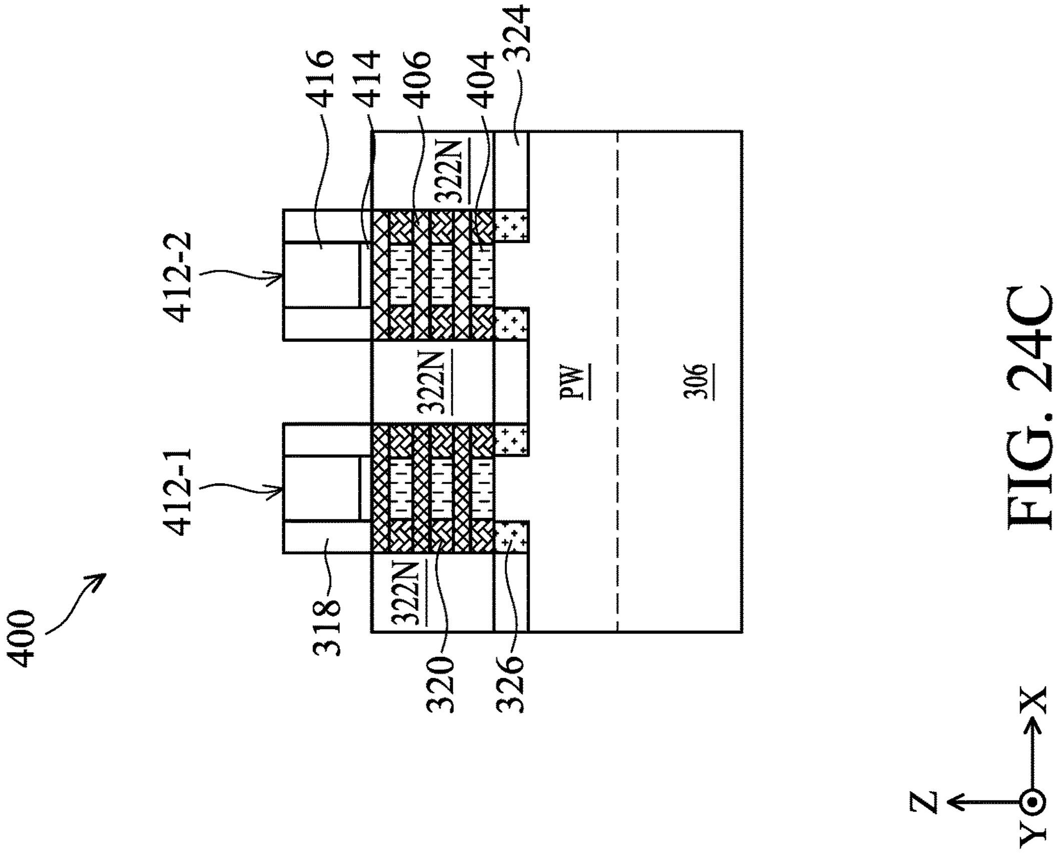
Figure 24B:
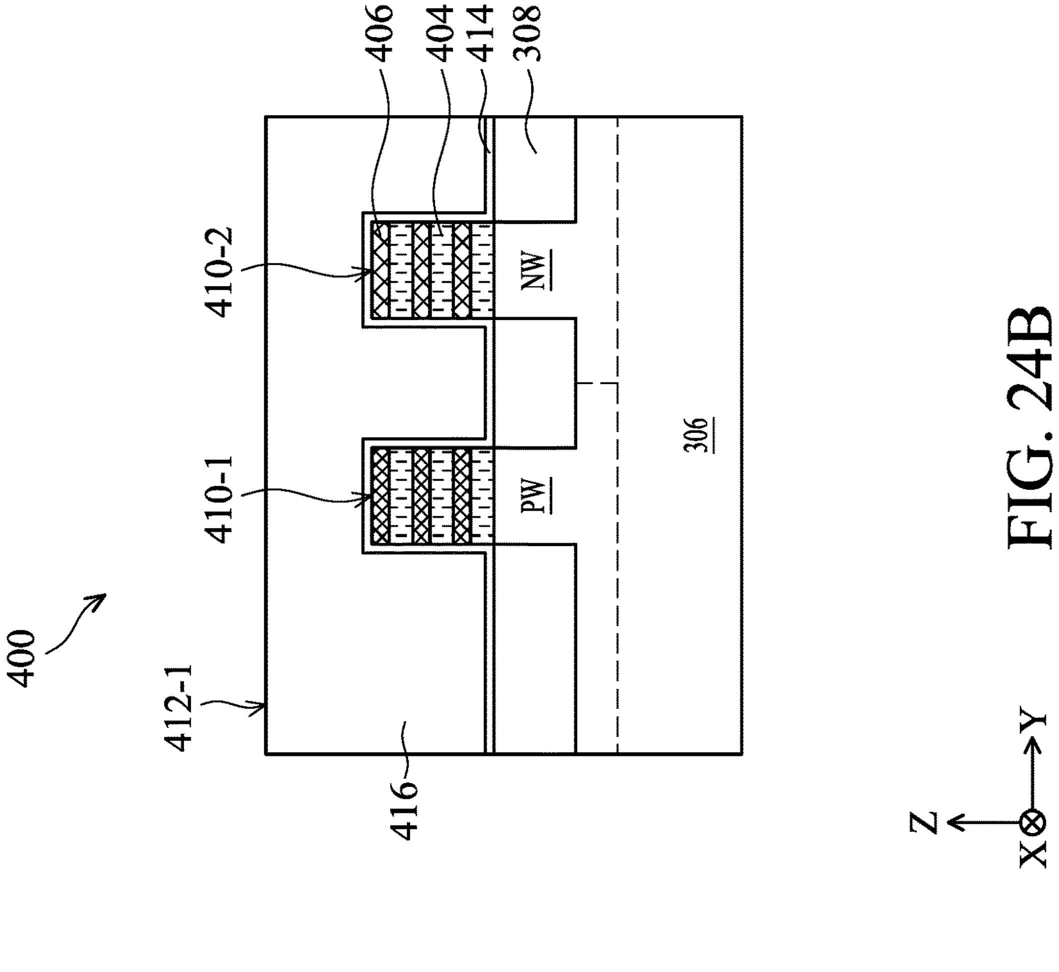

FIGS. 22A, 23A, and 24A illustrate top views (or layouts) of the workpiece 400 at various fabrication stages for the array of the circuit cells, in accordance with some alternative embodiments of the present disclosure. FIGS. 22B, 23B, and 24B illustrate Y-Z cross-sectional views of the workpiece 400 at various fabrication stage along lines F-F' of FIGS. 22A to 24A, respectively, in accordance with some alternative embodiments of the present disclosure. FIGS. 22C, 23C, and 24C illustrate X-Z cross-sectional views of the workpiece 400 at various fabrication stage along lines G-G' of FIGS. 22A to 24A, respectively, in accordance with some alternative embodiments of the present disclosure.

Referring back to FIGS. 17A to 17C and 18A to 18C, the dielectric layers 326 are formed in the gaps 422 after the formation of the gaps 422, and the gaps 424 are formed over the dielectric layers 326 after the formation of the dielectric layers 326. In some embodiments, the gaps 424 are formed over the gaps 422 after the formation of the gaps 422. As shown in FIGS. 22A to 22C, after the formation of the gaps 422 shown in FIG. 16C, the polymer layers 420 are removed and the gaps 424 are formed over the gaps 422. Similarly, the side portions of the semiconductor layers 404 are removed via a selective etching process to form the gaps 424 over the gaps 422. The selective etching process is performed that selectively etches the side portions of the semiconductor layers 404 below the gate spacers 318 through the source/drain trenches 418, with minimal (or no) etching of semiconductor layers 406 and the substrate 306, such that gaps 424 are formed between the semiconductor layers 406 as well as between the semiconductor layers 406 and the gaps 422, below the gate spacers 318, and over the gaps 422. The selective etching process is a dry etching process, a wet etching process, other suitable etching process, or a combination thereof.

Referring to FIGS. 23A to 23C, the inner spacers 320 and the dielectric layers 326 discussed above are formed in the gaps 424 and 422. The dielectric layers 326 are under the inner spacers 320 and the gate spacers 318, and between the inner spacers 320 and the substrate 306. The inner spacers 320 between the semiconductor layers 406 as well as between the semiconductor layers 406 and the dielectric layers 326. In some embodiments, the sidewalls of the inner spacers 320 and the dielectric layers 326 are aligned to the sidewalls of the gate spacers 318 and the semiconductor layers 406, as shown in FIG. 23C. In order to form the inner spacers 320 and the dielectric layers 326, a deposition process forms a material layer into the source/drain trenches 418 and the gaps 422 and 424, such as CVD, PVD, ALD, HDPCVD, MOCVD, RPCVD, PECVD, LPCVD, ALCVD, APCVD, other suitable methods, or a combination thereof. The material layer partially (and, in some embodiments, completely) fills the source/drain trenches 418. The deposition process is configured to ensure that the material layer fills the gaps 422 between the gaps 424 and the substrate 306 and the gaps 424 between the semiconductor layers 406 as well as between the semiconductor layer 406 and the gaps. An etching process is then performed that selectively etches the spacer layer to form the inner spacers 320 and the dielectric layers 326 (as shown in FIG. 23C) with minimal (to no) etching of the semiconductor layer 406, the substrate 306, the dummy gate structures 412, and the gate spacers 318. As such, the inner spacers 320 and the dielectric layers 326 discussed above are formed in the same process, such that the inner spacers 320 and the dielectric layers 326 are made of the same material.

Referring to FIGS. 24A to 24C, the silicon layers 324 and the source/drain features 322N/322P over the silicon layers 324 discussed above are formed in the source/drain trenches 418. The source/drain features 322N/322P are also formed on opposite sides of the dummy gate structures 412 in the X-direction, as shown in FIG. 24C. Furthermore, the silicon layers 324 are also formed on opposite sides of the dummy gate structures 412 in the X-direction. In some aspects, the source/drain features 322N/322P are formed on opposite sides of the inner spacers 320 and the dielectric layers 326 in the X-direction, and the silicon layers 324 are formed on opposite sides of the inner spacers 320 and the dielectric layers 326 in the X-direction.

The embodiments disclosed herein relate to semiconductor devices, and more particularly to semiconductor devices including dielectric layers under inner spacers and extended in to the substrate, such that the leakage current from one source/drain feature to another source/drain feature through the substrate is prevented. Furthermore, the present embodiments provide one or more of the following advantages. The semiconductor devices further includes silicon layers under the source/drain features for reducing the source/drain junction leakage.

Thus, one of the embodiments of the present disclosure describes a semiconductor device that includes a substrate, nanostructures, source/drain features, a gate structure, inner spacers, and dielectric layers. The nanostructures are over the substrate and spaced apart from each other in a Z-direction. The source/drain features are attached to the nanostructures in an X-direction. The gate structure wraps around the nanostructures and extends in a Y-direction. The inner spacers are between the nanostructures in the Z-direction. The dielectric layers are under the inner spacers. Bottom surfaces of the dielectric layers are lower than a bottommost surface of the gate structure.

In some embodiments, the semiconductor device further includes silicon layers under the source/drain features. The silicon layers are in contact with the dielectric layers in the X-direction.

In some embodiments, the silicon layers are undoped.

In some embodiments, bottom surfaces of the silicon layers are lower than the bottom surfaces of the dielectric layers.

In some embodiments, the dielectric layers and the inner spacers are made of the same material.

In some embodiments, the dielectric layers and the inner spacers are made of different materials.

In some embodiments, a distance between the dielectric layers in the X-direction is in a range from about 5 nm to about 20 nm.

In some embodiments, a thickness of the dielectric layers in the Z-direction is in a range from about 5 nm to about 50 nm.

In some embodiments, a width of the inner spacers in the X-direction and a width of the dielectric layers in the X-direction are substantially the same.

In some embodiments, a width of the dielectric layers in the X-direction is less than a width of the inner spacers in the X-direction.

In another of the embodiments, discussed is a semiconductor device including a substrate, nanostructures, source/drain features, a gate structure, inner spacers, and dielectric layers. The nanostructures are over the substrate and spaced apart from each other in a Z-direction. The source/drain features are on opposite sides of the nanostructures in an X-direction. The gate structure wraps around the nanostructures and extending in a Y-direction. The inner spacers are between the nanostructures in the Z-direction and between the gate structure and the source/drain features in the Y-direction. The dielectric layers are between and in contact with the inner spacers and the substrate in the Z-direction.

In some embodiments, the semiconductor device further includes silicon layers between the source/drain features and the substrate in the Z-direction. First portions of the silicon layers in contact with the source/drain features have the same dopants as the source/drain features.

In some embodiments, second portions of the silicon layers in contact with the substrate have different dopants than the source/drain features.

In some embodiments, a distance between the dielectric layers in the X-direction and a length of the gate structure in the X-direction are substantially the same.

In some embodiments, a distance between the dielectric layers in the X-direction is greater than a length of the gate structure in the X-direction.

In yet another of the embodiments, discussed is a method for manufacturing a semiconductor device including forming a fin over a substrate. The fin includes first semiconductor layers and second semiconductor layers alternating stacked in a Z-direction. The method further includes forming a dummy gate structure extending in a Y-direction and over the fin, forming source/drain trenches in the fin and on opposite sides of the dummy gate structures in an X-direction, forming dielectric layers under the fin through the source/drain trenches, forming inner spacers in the fin and over the dielectric layers through the source/drain trenches, forming source/drain features in the source/drain trenches, and replacing the dummy gate structure and the first semiconductor layers with a gate structure wrapping around the second semiconductor layers.

In some embodiments, the method further includes forming polymer layers on sidewalls of the fin exposing in the source/drain trenches, forming first gaps under the fin through the source/drain trenches, and forming the dielectric layers in the first gaps.

In some embodiments, the method further includes removing the polymer layers after the formation of the dielectric layers, forming second gaps between the second semiconductor layers in the Z-direction and over the dielectric layers, and forming second gaps between the second semiconductor layers in the Z-direction and over the dielectric layers In some embodiments, the method further includes removing the polymer layers before the formation of the dielectric layers in the first gaps, forming second gaps between the second semiconductor layers in the Z-direction and over the first gaps, and forming the inner spacers in the second gaps.

In some embodiments, the method further includes forming undoped silicon layers in the source/drain trenches and in contact with the dielectric layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a fin over a substrate, wherein the fin comprises first semiconductor layers and second semiconductor layers alternating stacked in a Z-direction;

forming a dummy gate structure extending in a Y-direction and over the fin;

forming source/drain trenches in the fin and on opposite sides of the dummy gate structures in an X-direction;

forming dielectric layers under the fin through the source/drain trenches;

forming inner spacers in the fin and over the dielectric layers through the source/drain trenches;

forming source/drain features in the source/drain trenches; and replacing the dummy gate structure and the first semiconductor layers with a gate structure wrapping around the second semiconductor layers.

2. The method of claim 1, further comprising:

forming polymer layers on sidewalls of the fin exposing in the source/drain trenches;

forming first gaps under the fin through the source/drain trenches; and forming the dielectric layers in the first gaps.

3. The method of claim 2, further comprising:

removing the polymer layers after the formation of the dielectric layers;

forming second gaps between the second semiconductor layers in the Z-direction and over the dielectric layers; and forming the inner spacers in the second gaps.

4. The method of claim 2, further comprising:

removing the polymer layers before the formation of the dielectric layers in the first gaps;

forming second gaps between the second semiconductor layers in the Z-direction and over the first gaps; and forming the inner spacers in the second gaps.

5. The method of claim 1, further comprising:

forming undoped silicon layers in the source/drain trenches and in contact with the dielectric layers.

6. A method for manufacturing a semiconductor structure, comprising:

forming fins over a substrate, wherein the fins comprise first semiconductor layers and second semiconductor layers alternating stacked;

forming a dummy gate structure extending in a first direction and over the fins;

forming gate spacers on sidewalls of the dummy gate structure in a second direction different from the first direction;

forming source/drain trenches on opposite sides of the dummy gate structures in the second direction;

forming first gaps under the gate spacers;

forming dielectric layers in the first gaps;

forming source/drain features in the source/drain trenches; and replacing the dummy gate structure with a gate structure over the second semiconductor layers.

7. The method of claim 6, further comprising:

forming silicon layers in the source/drain trenches, wherein the silicon layers interface the dielectric layers; and forming the source/drain features over the silicon layers.

8. The method of claim 7, wherein the silicon layers are undoped.

9. The method of claim 7, wherein bottom surfaces of the silicon layers are lower than the bottom surfaces of the dielectric layers.

10. The method of claim 6, further comprising:

forming second gaps over the first gaps; and forming inner spacers in the second gaps.

11. The method of claim 6, further comprising:

forming second gaps over the dielectric layers; and forming inner spacers in the second gaps.

12. The method of claim 11, wherein a width of the inner spacers in the second direction and a width of the dielectric layers in the second direction are substantially the same.

13. The method of claim 11, wherein a width of the dielectric layers in the second direction is less than a width of the inner spacers in the second direction.

14. The method of claim 6, wherein a distance between the dielectric layers in the second direction is in a range from about 5 nm to about 20 nm.

15. The method of claim 6, wherein a thickness of the dielectric layers is in a range from about 5 nm to about 50 nm.

16. A method for manufacturing a semiconductor structure, comprising:

forming a fin over a substrate, wherein the fin comprises first semiconductor layers and second semiconductor layers alternating stacked;

forming a dummy gate structure over the fin;

forming source/drain trenches in the fin to expose the substrate;

forming polymer layers on sidewalls of the fin exposed in the source/drain trenches;

etching the substrate through the source/drain trenches to form first gaps under the second semiconductor layers;

forming dielectric layers in the first gaps;

forming spacers between the second semiconductor layers and the dielectric layers;

forming source/drain features in the source/drain trenches; and replacing the dummy gate structure with a gate structure over the second semiconductor layers.

17. The method of claim 16, further comprising:

forming silicon layers over the substrate exposed in the source/drain trenches; and forming the source/drain features over the silicon layers, wherein first portions of the silicon layers interfacing the source/drain features have the same dopants as the source/drain features.

18. The method of claim 17, wherein second portions of the silicon layers interfacing the substrate have different dopants than the source/drain features.

19. The method of claim 16, wherein a distance between the dielectric layers and a length of the gate structure in a cross-sectional view are substantially the same.

20. The method of claim 16, wherein a distance between the dielectric layers in a cross-sectional view is greater than a length of the gate structure in the cross-sectional view.

* * * * *